(12) United States Patent
Moue et al.

(10) Patent No.: US 12,207,012 B2
(45) Date of Patent: Jan. 21, 2025

(54) IMAGING DEVICE AND ELECTRONIC APPARATUS

(71) Applicant: Sony Semiconductor Solutions Corporation, Kanagawa (JP)

(72) Inventors: Takashi Moue, Kanagawa (JP); Takuro Kosaka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 175 days.

(21) Appl. No.: 18/018,694

(22) PCT Filed: Jul. 14, 2021

(86) PCT No.: PCT/JP2021/026526
§ 371 (c)(1),
(2) Date: Jan. 30, 2023

(87) PCT Pub. No.: WO2022/030207
PCT Pub. Date: Feb. 10, 2022

(65) Prior Publication Data
US 2023/0353907 A1   Nov. 2, 2023

(30) Foreign Application Priority Data

Aug. 6, 2020   (JP) .................................. 2020-134114
May 10, 2021   (JP) .................................. 2021-079973

(51) Int. Cl.
*H04N 25/78* (2023.01)
*H03M 1/08* (2006.01)
*H04N 25/60* (2023.01)

(52) U.S. Cl.
CPC .............. *H04N 25/78* (2023.01); *H03M 1/08* (2013.01); *H04N 25/60* (2023.01)

(58) Field of Classification Search
CPC ........ H04N 25/78; H04N 25/60; H04N 25/79; H03M 1/08; H03M 1/123; H03M 1/56
See application file for complete search history.

(56) References Cited

U.S. PATENT DOCUMENTS

| 2012/0026370 | A1* | 2/2012 | Oike | H04N 25/78 348/E5.091 |
| 2015/0229832 | A1* | 8/2015 | Itano | H04N 25/445 348/295 |
| 2018/0103222 | A1* | 4/2018 | Yan | H04N 25/709 |

FOREIGN PATENT DOCUMENTS

| JP | 2015231096 A | 12/2015 |
| WO | 2014156028 A1 | 10/2014 |

OTHER PUBLICATIONS

International Search Report (PCT/ISA/210), International Application No. PCT/JP2021/026526, dated Sep. 14, 2021.

* cited by examiner

*Primary Examiner* — Gevell V Selby
(74) *Attorney, Agent, or Firm* — Michael Best & Friedrich LLP

(57) ABSTRACT

Provided are an imaging device capable of suppressing an error in inversion timing of a comparison result when an analog pixel signal is compared with a predetermined reference signal, and an electronic apparatus including the imaging device. An imaging device of the present disclosure includes: a load current source; a comparator that has an input transistor connected between the load current source and a signal line transmitting a signal read from a pixel; a first capacitor that inputs a predetermined reference signal to a gate electrode of the input transistor; and a second capacitor connected between the gate electrode of the input transistor and a reference potential node. Furthermore, an elec- (Continued)

tronic apparatus of the present disclosure includes the imaging device having the above-described configuration.

23 Claims, 43 Drawing Sheets

WAVEFORM OF RAMP WAVE
OF REFERENCE SIGNAL $V_{RAMP}$ $V_{VSL}$

IMAGING DEVICE AND ELECTRONIC APPARATUS

TECHNICAL FIELD

The present disclosure relates to an imaging device and an electronic apparatus.

BACKGROUND ART

An analog-to-digital conversion section that digitizes an analog pixel signal read from a pixel is mounted on an imaging device. The analog-to-digital conversion section is a so-called column-parallel analog-to-digital conversion section including a plurality of analog-to-digital converters arranged to correspond to pixel columns.

As the analog-to-digital converter constituting the column-parallel analog-to-digital conversion section, for example, a so-called single-slope analog-to-digital converter that digitizes an analog pixel signal by comparing an analog pixel signal read from a pixel with a predetermined reference signal is known.

The single-slope analog-to-digital converter includes, for example, a comparator that compares the analog pixel signal with the predetermined reference signal, and a counter that performs counting on the basis of a comparison result of the comparator. As an imaging device having the single-slope analog-to-digital converter, for example, there is proposed an imaging device in which a P-channel metal-oxide-semiconductor (MOS) transistor in which an analog pixel signal is input to a source electrode and a predetermined reference signal is input to a gate electrode and an inverter are arranged in a comparator (see, for example, Patent Document 1).

CITATION LIST

Patent Document

Patent Document 1: US 2018/0103222 A1

SUMMARY OF THE INVENTION

Problems to be Solved by the Invention

In the imaging device described in Patent Document 1, the comparator of the analog-to-digital converter is configured to share a load current source of a pixel (pixel circuit) as a current source, and this sharing of the current source achieves reduction in power consumption as compared with a case of a configuration in which a current source is also provided in a comparator separately from a pixel circuit.

However, in the above-described connection configuration with respect to the P-channel MOS transistor in the imaging device described in Patent Document 1, a drain voltage of the P-channel MOS transistor varies depending on a level of the pixel signal when the analog pixel signal matches the predetermined reference signal. Therefore, a timing at which the comparison result of the comparator is inverted may deviate from an ideal timing at which the pixel signal matches the reference signal. This error in inversion timing causes a problem that an error or nonlinearity occurs in a digital signal obtained by analog-to-digital conversion of the pixel signal so that image quality of image data deteriorates.

An object of the present disclosure is to provide an imaging device capable of suppressing an error in inversion timing of a comparison result when an analog pixel signal is compared with a predetermined reference signal, and an electronic apparatus including the imaging device.

Solutions to Problems

An imaging device of the present disclosure for achieving the above-described object includes:
a load current source;
a comparator that has an input transistor connected between the load current source and a signal line transmitting a signal read from a pixel;
a first capacitor that inputs a predetermined reference signal to a gate electrode of the input transistor; and
a second capacitor connected between the gate electrode of the input transistor and a reference potential node.

Furthermore, an electronic apparatus of the present disclosure for achieving the above-described object includes the imaging device having the above-described configuration.

MODE FOR CARRYING OUT THE INVENTION

Figure 1:
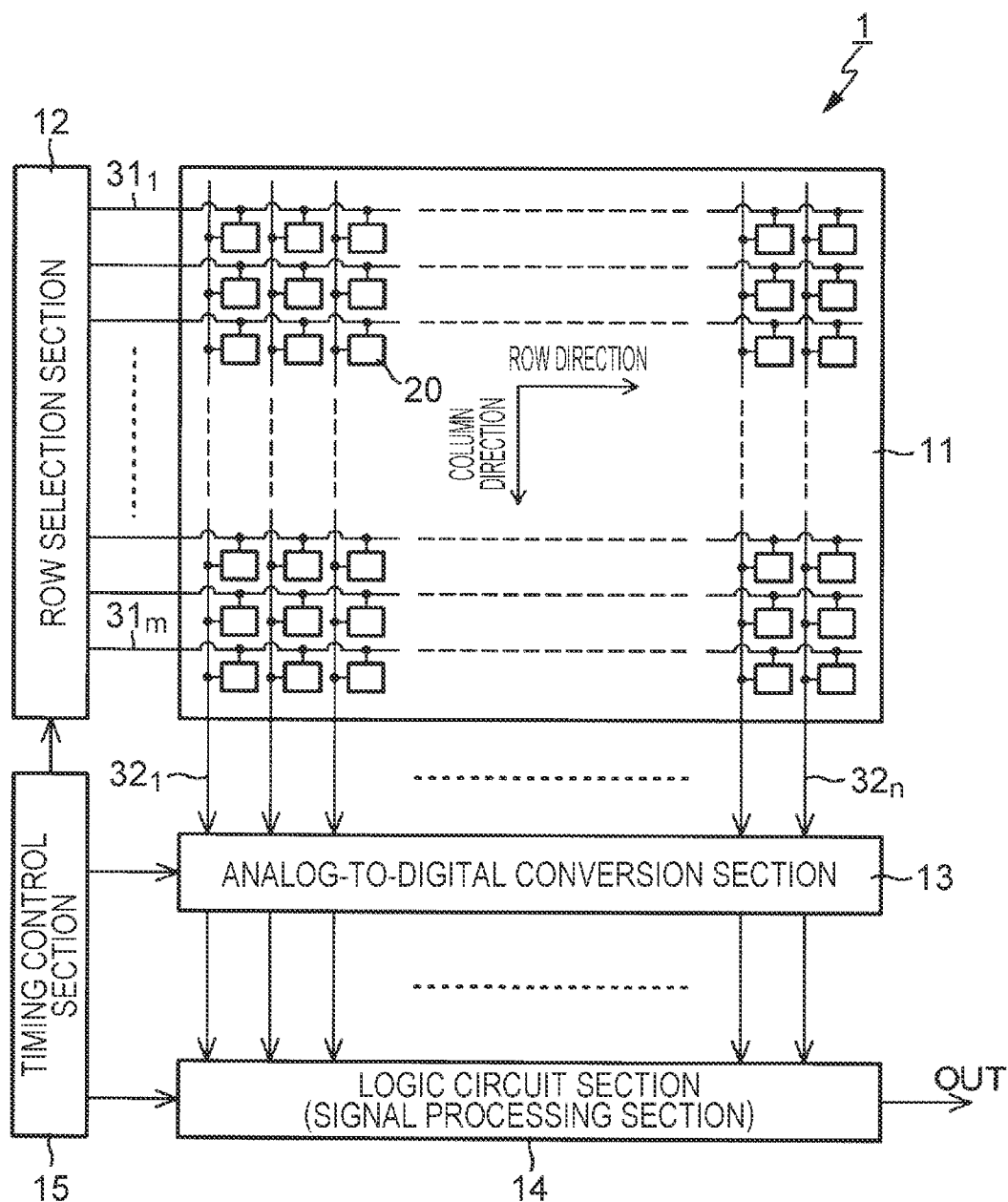
FIG. 1 is a block diagram schematically depicting an outline of a system configuration of a CMOS image sensor which is an example of an imaging device to which the technology according to the present disclosure is applied.

Hereinafter, modes for carrying out the technology according to the present disclosure (hereinafter, described as "embodiments") will be described in detail with reference to the drawings. The technology according to the present disclosure is not limited to the embodiments. In the following description, the same reference signs will be used for the same elements or elements having the same function, and the redundant description thereof will be omitted. Note that a description will be given in the following order.

1. General Description of Imaging Device and Electronic Apparatus of Present Disclosure
2. Imaging Device to which Technology According to Present Disclosure Is Applied
  2-1. Configuration Example of CMOS Image Sensor
  2-2. Circuit Configuration Example of Pixel
  2-3. Semiconductor Chip Structure
  2-3-1. Flat Semiconductor Chip Structure
  2-3-2. Stacked Semiconductor Chip Structure
  2-4. Configuration Example of Analog-To-Digital Conversion Section
  2-5. Regarding Comparator of Analog-To-Digital Converter
  2-6. Comparator According to Reference Example
  2-6-1. Circuit Configuration Example of Comparator According to Reference Example
  2-6-2. Circuit Operation Example of Comparator According to Reference Example
  2-6-3. Regarding Buffer Noise
3. Embodiment of Present Disclosure
  3-1. Example 1 (Example in which Variable Capacitance Elements Are Used as First Capacitor and Second Capacitor)
  3-2. Example 2 (Example in which First Capacitor and Second Capacitor Are Configured Using Combination of Multiple Capacitance Elements and Multiple Switch Elements)
  3-2-1. Specific Example 1 of Capacitance Attenuation Ratio (Example of capacitance attenuation ratio of 4/4 (No Attenuation))
  3-2-2. Specific Example 2 of Capacitance Attenuation Ratio (Example of Capacitance Attenuation Ratio of 3/4)
  3-2-3. Specific Example 3 of Capacitance Attenuation Ratio (Example of Capacitance Attenuation Ratio of 2/4)
  3-2-4. Specific Example 4 of Capacitance Attenuation Ratio (Example of Capacitance Attenuation Ratio of 1/4)
  3-3. Example 3 (Modified Example of Example 2: Example of Controlling Analog Gain)
  3-4. Example 4 (Example in which No Switch Element Is Provided on Reference Potential Node Side)
  3-5. Example 5 (Example of Including Three Capacitance Elements and Three Switch Elements)

3-6. Example 6 (Modified Example of Example 5: Example in which Connection Relationship Among Capacitance Elements and Switch Elements Is Different)
3-7. Example 7 (Example in which Circuit Configuration of Comparator Is Different)
3-8. Example 8 (Example of Application to CMOS Image Sensor Having Function of Suppressing Power Supply Noise of Pixel Power Supply)
3-8-1. Operation Example 1 (Example of Case where Capacitance Attenuation Ratio Is 4/4)
3-8-2. Operation Example 2 (Example of Case where Capacitance Attenuation Ratio Is 3/4)
3-8-3. Operation Example 3 (Example of Case where Capacitance Attenuation Ratio Is 2/4)
3-8-4. Operation Example 4 (Example of Case where Capacitance Attenuation Ratio Is 1/4)
3-9. Example 9 (Circuit Configuration Example of Power Supply Noise Correction Circuit)
3-9-1. Gain Control Example 1 (Control Example when Additional Gain Is One Time)
3-9-2. Gain Control Example 2 (Control Example when Additional Gain Is 4/3 Times)
3-9-3. Gain Control Example 3 (Control Example when Additional Gain Is Two Times)
3-9-4. Gain Control Example 4 (Control Example when Additional Gain Is Four Times)
3-10. Example 10 (Modified Example of Example 8: Example of Application to MOS Image Sensor Using Reference Voltage in Pixel)
3-11. Example 11 (example of Setting DAC Setting Signal Switch Setting Signal at Time of Switching Slope of Ramp Wave and Input Capacitance)
3-12. Example 12 (Processing Procedure of Setting DAC Setting Signal and Switch Setting Signal)
4. Modified Examples
5. Examples of Application
6. Application Examples of Technology According to Present Disclosure
6-1. Electronic Apparatus of Present Disclosure (Example of Imaging Device)
6-2. Example of Application to Mobile Body
7. Configuration that Can Be Adopted by Present Disclosure General Description of Imaging Device and Electronic Apparatus of Present Disclosure In an imaging device and an electronic apparatus of the present disclosure, a first capacitor and a second capacitor can be configured to attenuate a predetermined reference signal input to a gate electrode of an input transistor by capacitive voltage division. Furthermore, each of the first capacitor and the second capacitor can be configured to include a variable capacitance element having a variable capacitance value. Furthermore, each of the first capacitor and the second capacitor can be configured to have the capacitance value variable depending on an analog gain of an analog-to-digital converter including the comparator.

In the imaging device and the electronic apparatus of the present disclosure having the above-described preferable configurations, each of the first capacitor and the second capacitor can include a plurality of capacitance elements each having a first end connected to the gate electrode of the input transistor and a plurality of switch elements each of which is connected between second ends of the plurality of capacitance elements. Furthermore, it is possible to adopt a configuration in which the switch element is also provided between a reference potential node and the second end of the capacitance element on the reference potential node side among the plurality of capacitance elements.

Furthermore, in the imaging device and the electronic apparatus of the present disclosure having the above-described preferable configurations, the predetermined reference signal can be configured to be a voltage of a sloped waveform that linearly changes with a predetermined slope. Then, the comparator can be configured to compare a voltage of a signal line with the voltage of the sloped waveform.

Furthermore, in the imaging device and the electronic apparatus of the present disclosure having the above-described preferable configurations, an amplitude of the voltage of the sloped waveform is attenuated by capacitive voltage division using the first capacitor and the second capacitor. At this time, a reference signal generating section that generates the voltage of the sloped waveform can be configured to set the amplitude of the voltage of the sloped waveform to be large in advance such that an amplitude after being attenuated by the capacitive voltage division becomes a desired amplitude.

Furthermore, the imaging device and the electronic apparatus of the present disclosure having the above-described preferable configurations can include an analog gain control section that controls the analog gain of the analog-to-digital converter by adjusting the amplitude of the voltage of the sloped waveform. Then, the analog gain control section can be configured to control the amplitude of the voltage of the sloped waveform and the capacitance values of the first capacitor and the second capacitor.

Furthermore, in the imaging device and the electronic apparatus of the present disclosure having the above-described preferable configurations, a load current source can include an input-side load current source and an output-side load current source, and the input transistor can be configured to be connected between the signal line and the input-side load current source. Then, the comparator can include an output transistor that is connected between the signal line and the output-side load current source and uses an output of the input transistor as a gate input.

Furthermore, the imaging device and the electronic apparatus of the present disclosure having the above-described preferable configurations can include a noise correction circuit that superimposes a correction voltage corresponding to noise of a pixel power supply on the reference signal generated by the reference signal generating section. At this time, the noise correction circuit can be configured to switch a gain for generating the correction voltage according to switching of the capacitance value of each of the first capacitor and the second capacitor.

Furthermore, the imaging device and the electronic apparatus of the present disclosure having the above-described preferable configurations can include a control section that sets a reference signal setting signal for generating the reference signal by the reference signal generating section and a switch setting signal for switching of the plurality of switch elements when the analog gain of the analog-to-digital converter is controlled. Moreover, it is possible to adopt a configuration in which a logic circuit section that generates illuminance data on the basis of data after analog-to-digital conversion by the analog-to-digital converter is provided. Then, the control section can be configured to set the reference signal setting signal and the switch setting signal on the basis of the illuminance data generated by the logic circuit section.

Imaging Device to which Technology According to Present Disclosure is Applied

As the imaging device to which the technology according to the present disclosure is applied, a complementary metal oxide semiconductor (CMOS) image sensor, which is a type of X-Y address imaging device, will be described as an example. The CMOS image sensor is an image sensor manufactured by applying or partially using a CMOS process.

[Configuration Example of CMOS Image Sensor]

FIG. 1 is a block diagram schematically depicting an outline of a system configuration of the CMOS image sensor which is an example of the imaging device to which the technology according to the present disclosure is applied.

A CMOS image sensor 1 according to the present application example includes a pixel array section 11 and a peripheral circuit section of the pixel array section 11. The pixel array section 11 has a configuration in which pixels (pixel circuits) 20 including light receiving elements are two-dimensionally arranged in a row direction and a column direction, that is, in a matrix. Here, the row direction refers to an array direction of the pixels 20 in a pixel row, and the column direction refers to an array direction of the pixels 20 in a pixel column. The pixel 20 performs photoelectric conversion to generate and accumulate a photocharge corresponding to the amount of received light.

The peripheral circuit section of the pixel array section 11 includes, for example, a row selection section 12, an analog-to-digital conversion section 13, a logic circuit section 14 as a signal processing section, a timing control section 15, and the like.

In the pixel array section 11, pixel control lines 31 ($31_1$ to $31_m$) are wired along the row direction for each pixel row with respect to the matrix-shaped pixel array. Furthermore, signal lines 32 ($32_1$ to $32_n$) are wired along the column direction for each pixel column. The pixel control line 31 transmits a drive signal for performing driving at the time of reading a signal from the pixel 20. The pixel control line 31 is illustrated as one wiring in FIG. 1, but is not limited to one. The pixel control line 31 has one end connected to an output end corresponding to each row of the row selection section 12.

Hereinafter, the respective constituent elements of the peripheral circuit section of the pixel array section 11, that is, the row selection section 12, the analog-to-digital conversion section 13, the logic circuit section 14, and the timing control section 15 will be described.

The row selection section 12 includes a shift register, an address decoder, and the like, and controls scanning of pixel rows and addresses of pixel rows in selection of each of the pixels 20 of the pixel array section 11. The row selection section 12 generally includes two scanning systems of a reading scanning system and a sweeping scanning system although a specific configuration thereof is not illustrated.

The reading scanning system sequentially selects and scans the pixels 20 of the pixel array section 11 row by row in order to read a pixel signal from the pixel 20. The pixel signal read from the pixel 20 is an analog signal. The sweeping scanning system performs sweeping scanning on a reading row on which reading scanning is to be performed by the reading scanning system prior to the reading scanning by a time corresponding to a shutter speed.

The sweeping scanning performed by the sweeping scanning system sweeps out unnecessary charges from photoelectric conversion elements of the pixels 20 in the reading row, whereby the photoelectric conversion elements are reset. Then, a so-called electronic shutter operation is performed by sweeping out (resetting) the unnecessary charges by the sweeping scanning system. Here, the electronic shutter operation refers to an operation of sweeping out photocharges of photoelectric conversion elements and newly starting exposure (starting accumulation of photocharges).

The analog-to-digital conversion section 13 includes a set of a plurality of analog-to-digital converters (ADC) provided to correspond to the pixel columns (for example, for each pixel column) of the pixel array section 11. The analog-to-digital conversion section 13 is a column-parallel analog-to-digital conversion section that converts an analog pixel signal output through each of the signal lines $32_1$ to $32_n$ into a digital signal for each pixel column.

As the analog-to-digital converter in the analog-to-digital conversion section 13, it is possible to use, for example, a single-slope analog-to-digital converter, which is an example of a reference signal comparison analog-to-digital converter.

The logic circuit section 14, which is the signal processing section, reads the pixel signal digitized by the analog-to-digital conversion section 13 and performs predetermined signal processing. Specifically, as the predetermined signal processing, the logic circuit section 14 performs, for example, correction of a vertical line defect and a point defect or clamping of a signal, and further, digital signal processing such as parallel-to-serial conversion, compression, encoding, addition, averaging, or intermittent operation. The logic circuit section 14 outputs generated image data to a subsequent device as an output signal OUT of the CMOS image sensor 1.

The timing control section 15 generates various timing signals, clock signals, control signals, and the like on the basis of a synchronization signal provided from the outside. Then, the timing control section 15 controls driving of the row selection section 12, the analog-to-digital conversion section 13, the logic circuit section 14, and the like on the basis of the generated signals.

[Circuit Configuration Example of Pixel]

Figure 2:
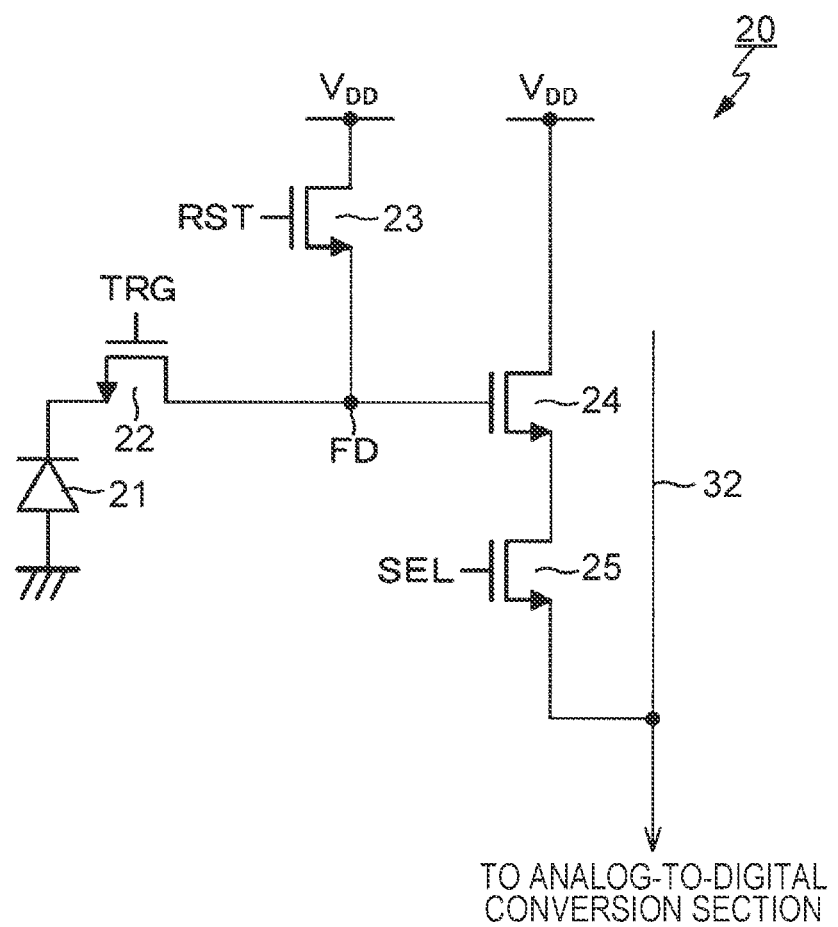
FIG. 2 is a circuit diagram depicting an exemplary circuit configuration of a pixel.

FIG. 2 is a circuit diagram depicting an exemplary circuit configuration of the pixel 20. The pixel 20 includes, for example, a photodiode 21 as the photoelectric conversion element. The pixel 20 includes a transfer transistor 22, a reset transistor 23, an amplification transistor 24, and a selection transistor 25 in addition to the photodiode 21.

As the four transistors of the transfer transistor 22, the reset transistor 23, the amplification transistor 24, and the selection transistor 25, for example, N-channel MOS field-effect transistors are used. However, a combination of conductivity types of the four transistors 22 to 25 exemplified here is merely an example, and the combination is not limited thereto.

For the pixel 20, as the above-described pixel control lines 31 ($31_1$ to $31_m$), a plurality of pixel control lines is wired in common to the respective pixels 20 in the same pixel row. The plurality of pixel control lines is connected to an output end corresponding to each pixel row of the row selection section 12 in units of pixel rows. The row selection section 12 appropriately outputs a transfer signal TRG, a reset signal RST, and a selection signal SEL to the plurality of pixel control lines.

The photodiode 21 has an anode electrode connected to a low-potential-side power supply (for example, ground), photoelectrically converts received light into photocharges (here, photoelectrons) of a charge amount corresponding to the amount of the light, and accumulates the photocharges.

The photodiode 21 has a cathode electrode electrically connected to a gate electrode of the amplification transistor 24 via the transfer transistor 22. Here, a region where the gate electrode of the amplification transistor 24 is electrically connected is a floating diffusion (floating diffusion region/impurity diffusion region) FD. The floating diffusion FD is a charge-voltage conversion section that converts a charge into a voltage.

The transfer signal TRG activated at a high level (for example, $V_{DD}$ level) is supplied from the row selection section 12 to a gate electrode of the transfer transistor 22. The transfer transistor 22 is brought into a conductive state in response to the transfer signal TRG, thereby transferring the photocharges, photoelectrically converted by the photodiode 21 and accumulated in the photodiode 21, to the floating diffusion FD.

The reset transistor 23 is connected between a node of a high-potential-side power supply voltage $V_{DD}$ and the floating diffusion FD. The reset signal RST that is activated at a high level is provided from the row selection section 12 to a gate electrode of the reset transistor 23. The reset transistor 23 is brought into a conductive state in response to the reset signal RST, and resets the floating diffusion FD by sweeping out charges of the floating diffusion FD to the node of the voltage $V_{DD}$.

The amplification transistor 24 has the gate electrode connected to the floating diffusion FD and a drain electrode connected to the node of the high-potential-side power supply voltage $V_{DD}$. The amplification transistor 24 serves as an input section of a source-follower that reads a signal obtained by photoelectric conversion in the photodiode 21. That is, the amplification transistor 24 has a source electrode connected to the signal line 32 via the selection transistor 25.

The selection transistor 25 has a drain electrode connected to the source electrode of the amplification transistor 24 and a source electrode connected to the signal line 32. The selection signal SEL that is activated at a high level is provided from the row selection section 12 to a gate electrode of the selection transistor 25. The selection transistor 25 is brought into a conductive state in response to the selection signal SEL, thereby transmitting the signal output from the amplification transistor 24 to the signal line 32 with the pixel 20 in a selected state.

Note that the pixel 20 adopting a 4-Tr configuration including four transistors, that is, the transfer transistor 22, the reset transistor 23, the amplification transistor 24, and the selection transistor 25 has been exemplified in the above-described circuit example, but the present invention is not limited thereto. For example, a 3-Tr configuration in which the selection transistor 25 is omitted and the amplification transistor 24 also functions as the selection transistor 25 can also be adopted, and a 5-Tr or more configuration in which the number of transistors is increased can also be adopted as necessary.

[Semiconductor Chip Structure]

As a semiconductor chip structure of the CMOS image sensor 1 having the above-described configuration, a flat semiconductor chip structure and a stacked semiconductor chip structure can be exemplified. Furthermore, regarding a pixel structure, assuming that a substrate surface on a side on which a wiring layer is formed is defined as a front surface (front), it is possible to adopt a back surface irradiation pixel structure which captures light irradiated from a back surface side on the opposite side, or a front surface irradiation pixel structure which captures light irradiated from the front surface side.

Hereinafter, an outline of the flat semiconductor chip structure and the stacked semiconductor chip structure will be described.

(Flat Semiconductor Chip Structure)

Figure 3A:
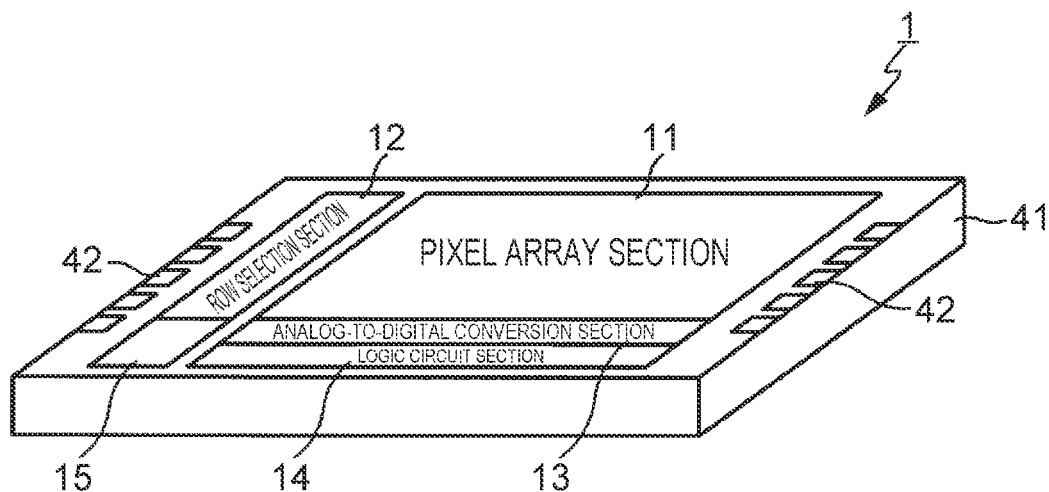
FIG. 3A is a perspective view schematically depicting a flat chip structure.

FIG. 3A is a perspective view schematically depicting the flat chip structure of the CMOS image sensor 1. As depicted in FIG. 3A, the flat semiconductor chip structure has a structure in which the respective constituent elements of the peripheral circuit section of the pixel array section 11 are formed on the same semiconductor substrate 41 as the pixel array section 11 in which the pixels 20 are arranged in a matrix. Specifically, the row selection section 12, the analog-to-digital conversion section 13, the logic circuit section 14, the timing control section 15, and the like are formed on the same semiconductor substrate 41 as the pixel array section 11. Pads 42 for external connection and power supply are provided, for example, at both left and right ends of the semiconductor chip 41 of the first layer.

(Stacked Semiconductor Chip Structure)

Figure 3B:
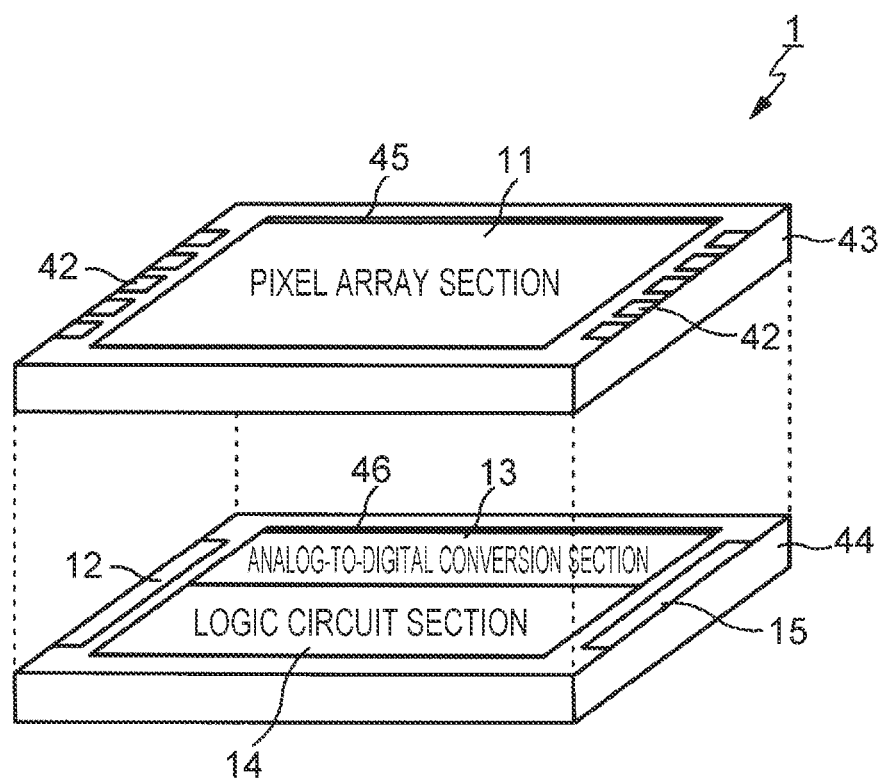
FIG. 3B is an exploded perspective view schematically depicting a stacked semiconductor chip structure.

FIG. 3B is an exploded perspective view schematically depicting the stacked semiconductor chip structure of the CMOS image sensor 1. As depicted in FIG. 3B, the stacked semiconductor chip structure, that is, the stacked structure has a structure in which at least two semiconductor chips of a semiconductor chip 43 of the first layer and a semiconductor chip 44 of the second layer are stacked.

In this stacked semiconductor chip structure, the semiconductor chip 43 of the first layer is a pixel chip in which the pixel array section 11 in which the pixels 20 including photoelectric conversion elements (for example, the photodiodes 21) are two-dimensionally arranged in a matrix is formed. The pads 42 for external connection and power supply are provided, for example, at both left and right ends of the semiconductor chip 43 of the first layer.

The semiconductor chip 44 of the second layer is a circuit chip in which the peripheral circuit section of the pixel array section 11, that is, the row selection section 12, the analog-to-digital conversion section 13, the logic circuit section 14, the timing control section 15, and the like are formed. Note that the arrangement of the row selection section 12, the analog-to-digital conversion section 13, the logic circuit section 14, and the timing control section 15 is an example, and is not limited to this arrangement example.

The pixel array section 11 on the semiconductor chip 43 of the first layer and the peripheral circuit section on the semiconductor chip 44 of the second layer are electrically connected via junction portions 72 and 73 including a metal-metal junction including a Cu—Cu junction, a through silicon via (TSV), a micro-bump, and the like.

According to the stacked semiconductor chip structure described above, a process suitable for manufacturing the pixel array section 11 can be applied to the semiconductor chip 43 of the first layer, and a process suitable for manufacturing the circuit part can be applied to the semiconductor chip 44 of the second layer. Therefore, the processes can be optimized in manufacturing the CMOS image sensor 1. Therefore, the processes can be optimized in manufacturing the CMOS image sensor 1. In particular, an advanced process can be applied to manufacture the circuit part.

Configuration Example of Analog-To-Digital Conversion Section

Next, an exemplary configuration of the analog-to-digital conversion section 13 will be described. Here, a single-slope analog-to-digital converter is used as each analog-to-digital converter of the analog-to-digital conversion section 13.

Figure 4:
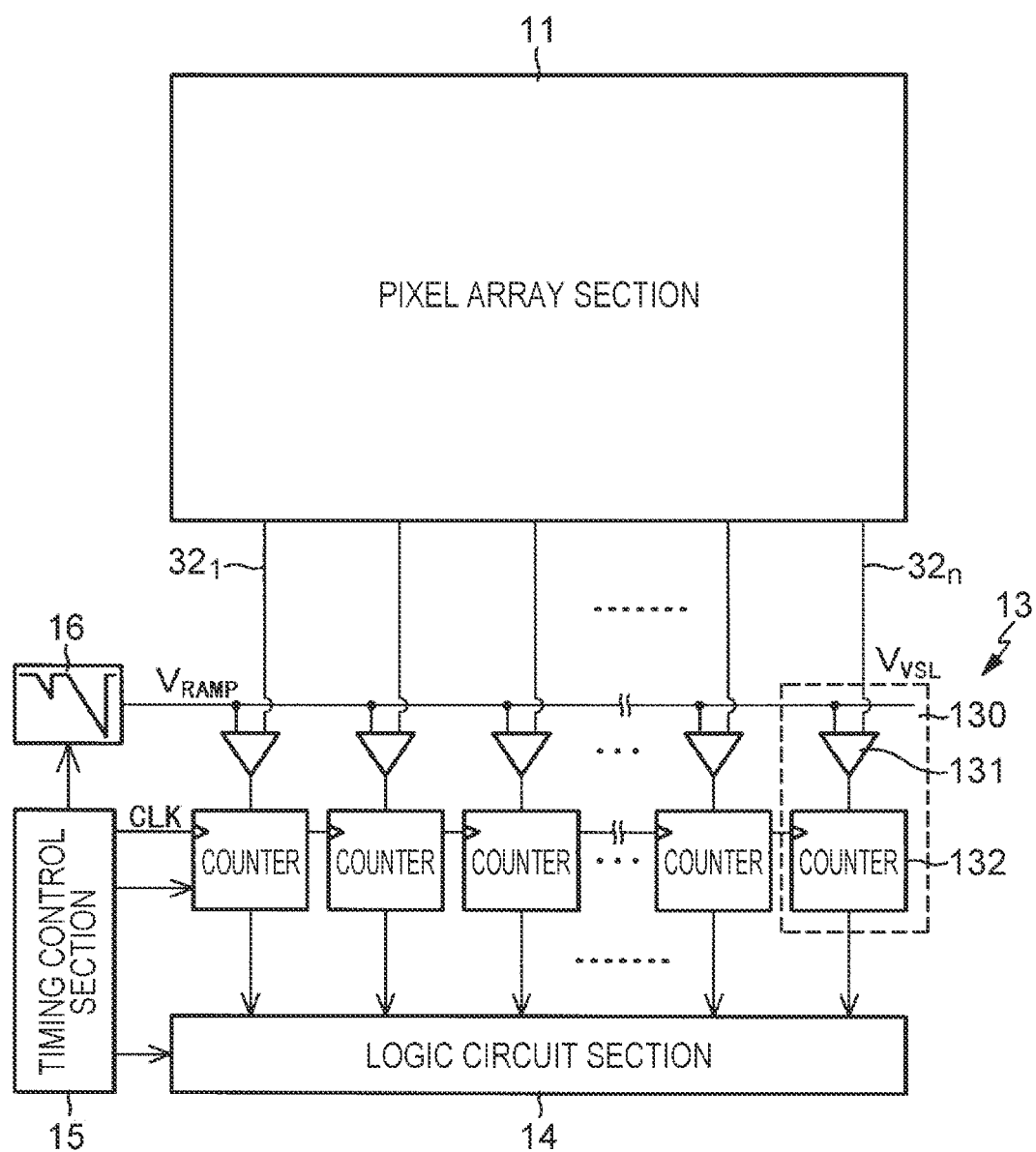
FIG. 4 is a block diagram schematically depicting an exemplary configuration of an analog-to-digital conversion section.

FIG. 4 illustrates the exemplary configuration of the analog-to-digital conversion section 13. In the CMOS image sensor 1, the analog-to-digital conversion section 13 includes a set of a plurality of single-slope analog-to-digital converters provided to respectively correspond to pixel columns of the pixel array section 11. Here, a single-slope analog-to-digital converter 130 of the n-th column will be described as an example.

The analog-to-digital converter 130 has a circuit configuration including a comparator 131 and a counter 132. Then, in the single-slope analog-to-digital converter 130, a reference signal generated by a reference signal generating section 16 is used. The reference signal generating section 16 includes, for example, a digital-to-analog converter (DAC), generates a reference signal $V_{RAMP}$ of a sloped waveform (so-called ramp wave) whose level (voltage) monotonously decreases with the passage of time, and provides the reference signal $V_{RAMP}$ to the comparator 131 provided for each pixel column as a standard signal.

The comparator 131 uses an analog pixel signal $V_{VSL}$ read from the pixel 20 as a comparison input and the reference signal $V_{RAMP}$ of the ramp wave generated by the reference signal generating section 16 as a reference input to compares both the signals. Then, for example, an output of the comparator 131 is in a first state (high level) when the reference signal $V_{RAMP}$ is more than the pixel signal $V_{VSL}$, and an output is in a second state (for example, low level) when the reference signal $V_{RAMP}$ is equal to or less than the pixel signal $V_{VSL}$. Therefore, the comparator 131 outputs, as a comparison result, a pulse signal having a pulse width according to a signal level of the pixel signal $V_{VSL}$, specifically, corresponding to the magnitude of the signal level.

A clock signal CLK is supplied from the timing control section 15 to the counter 132 at the same timing as a supply start timing of the reference signal $V_{RAMP}$ to the comparator 131. Then, the counter 132 performs a counting operation in synchronization with the clock signal CLK to measure a period of a pulse width of an output pulse of the comparator 131, that is, a period from the start of a comparison operation to the end of the comparison operation. A count result (count value) of the counter 132 is supplied to the logic circuit section 14 as a digital value obtained by digitizing the analog pixel signal $V_{VSL}$.

According to the analog-to-digital conversion section 13 including the set of single-slope analog-to-digital converters 130 described above, it is possible to obtain a digital value from time information until a magnitude relationship between the reference signal $V_{RAMP}$ of the ramp wave generated by the reference signal generating section 16 and the analog pixel signal $V_{VSL}$ read from the pixel 20 through the signal line 32 changes.

Note that the configuration in which the analog-to-digital converters 130 are arranged in a one-to-one correspondence with the pixel columns of the pixel array section 11 has been exemplified as the analog-to-digital conversion section 13 in the example described above, but it is also possible to adopt a configuration in which the analog-to-digital converters 130 are arranged in units of a plurality of pixel columns.

Regarding Comparator of Analog-To-Digital Converter

In the above-described single-slope analog-to-digital converter 130, a comparator having a differential amplifier configuration is generally used as the comparator 131. However, in the case of the comparator having the differential amplifier configuration, it is necessary to secure an input range according to a signal amount of the pixel 20, and thus, it is necessary to set the power supply voltage $V_{DD}$ to be relatively high. Therefore, there is a problem that power consumption of the analog-to-digital converter 130 and power consumption of the CMOS image sensor 1 become relatively high.

On the other hand, there is a related art having a configuration in which a P-channel metal-oxide-semiconductor (MOS) transistor in which an analog pixel signal is input to a source electrode and a predetermined reference signal is input to a gate electrode is provided, and a load current source of a pixel (pixel circuit) is shared as a current source of a comparator (see, for example, Patent Document 1). According to the related art, the power consumption can be reduced as compared with a case of a configuration in which a current source is also provided in a comparator separately from a pixel circuit.

In the above-described connection configuration of the related art, however, when the analog pixel signal matches the predetermined reference signal, a drain voltage of the P-channel MOS transistor varies depending on a level of the pixel signal, and thus, a timing at which the comparison result of the comparator is inverted may deviate from an ideal timing at which the pixel signal matches the reference signal. This error in inversion timing causes a problem that an error or nonlinearity occurs in a digital signal obtained by analog-to-digital conversion of the pixel signal so that image quality of image data deteriorates.

Comparator According to Reference Example

A comparator for solving the above-described problem of the related art will be described hereinafter as a comparator according to a reference example.
(Circuit Configuration Example of Comparator According to Reference Example)

Figure 5:
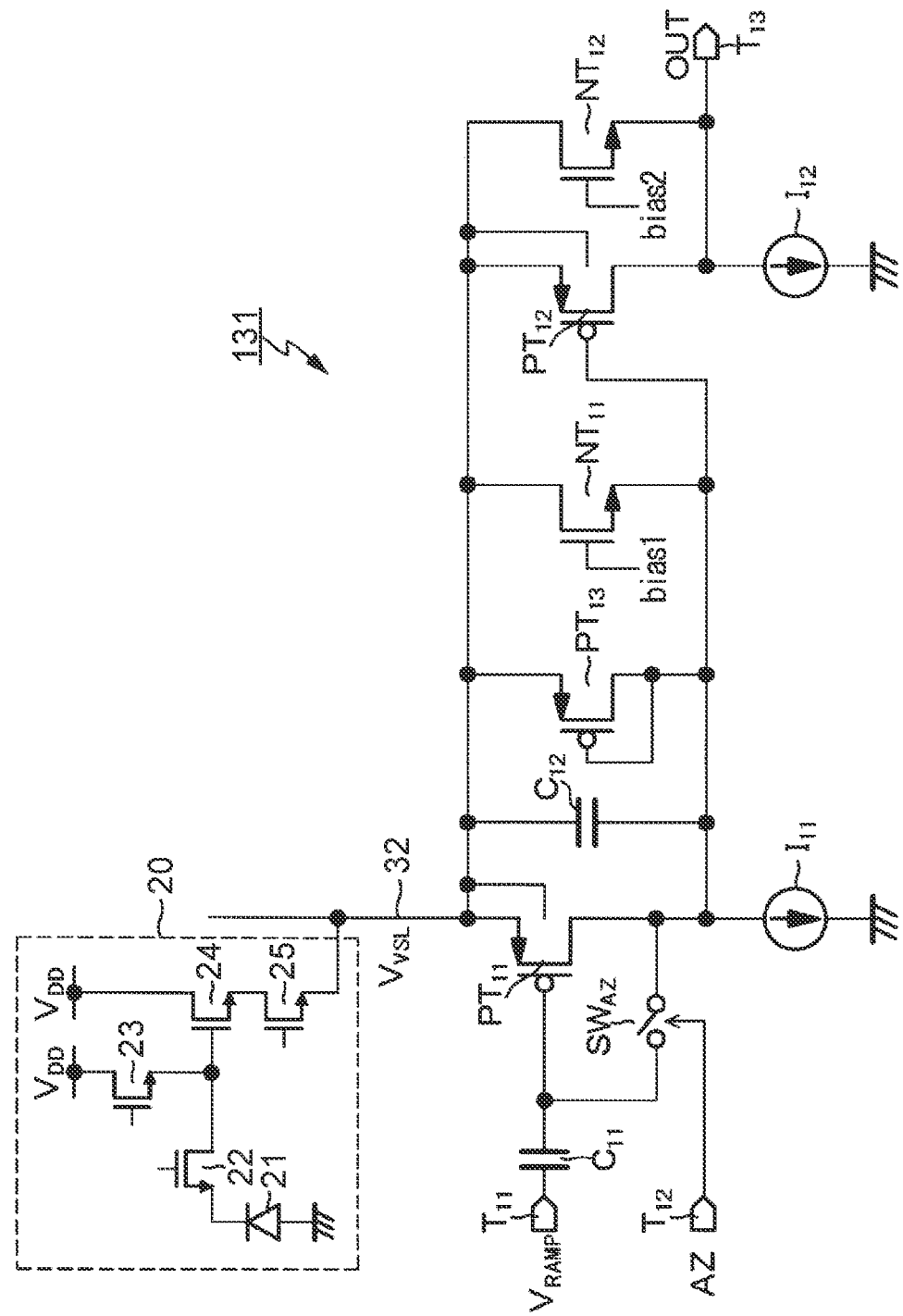
FIG. 5 is a circuit diagram depicting a circuit configuration example of a comparator according to a reference example.

FIG. 5 illustrates a circuit configuration example of the comparator according to the reference example. Here, a circuit configuration corresponding to one pixel column is illustrated in order to simplify the drawing.

As depicted in FIG. 5, the comparator 131 according to the reference example includes a capacitance element $C_{11}$, an auto-zero switch $SW_{AZ}$, an input transistor $PT_{11}$, an input-side load current source $I_{11}$, a capacitance element $C_{12}$, an input-side clamp transistor $PT_{13}$, an input-side clamp transistor $NT_{11}$, an output transistor $PT_{12}$, an output-side load current source $I_{12}$, and an output-side clamp transistor $NT_{12}$.

The input transistor $PT_{11}$ includes a P-channel MOS transistor and is connected between the signal line 32 and the input-side load current source $I_{11}$. Specifically, the input transistor $PT_{11}$ has a source electrode connected to the signal line 32 and a drain electrode connected to a first end of the input-side load current source $I_{11}$. Therefore, the analog pixel signal Vest is input to the source electrode of the input transistor $PT_{11}$ through the signal line 32. A back gate and the source electrode of the input transistor $PT_{11}$ are desirably short-circuited in order to suppress a back gate effect.

The input-side load current source $I_{11}$ has a second end connected to a low-potential-side power supply, for example, ground GND. The input-side load current source $I_{11}$ supplies a constant current to a series connection circuit of the input transistor $PT^{11}$ and the signal line 32.

The capacitance element $C_{11}$ is connected between the input terminal $T_{11}$ of the reference signal $V_{RAMP}$ Of the ramp wave and a gate electrode of the input transistor $PT_{11}$, serves as an input capacitance with respect to the reference signal $V_{RAMP}$, and absorbs an offset. Therefore, the analog pixel signal Vest is input to the source electrode of the input transistor $PT_{11}$ through the signal line 32, and the reference signal $V_{RAMP}$ of the ramp wave is input to the gate electrode via the capacitance element $C_{11}$.

The input transistor $PT_{11}$ amplifies a difference between the reference signal $V_{RAMP}$ of the ramp wave input to the gate electrode and the analog pixel signal $V_{VSL}$ input to the source electrode, that is, a gate-source voltage $V_{gs}$ of the input transistor $PT_{11}$, and outputs the amplified difference as a drain voltage $V_d$ from the drain electrode.

The auto-zero switch $SW_{AZ}$ is connected between the gate electrode and the drain electrode of the input transistor $PT_{11}$ and is controlled to be turned on (closed) or off (open) by a drive signal AZ input from the timing control section 15 depicted in FIG. 1 via the input terminal $T_{12}$. The auto-zero switch $SW_{AZ}$ is set to the on state to perform auto-zero (an initialization operation) for causing a short circuit between the gate electrode and the drain electrode of the input transistor $PT_{11}$. The auto-zero switch $SW_{AZ}$ can be configured using a P-channel or N-channel MOS transistor.

The capacitance element $C_{12}$ is connected in parallel to the input transistor $PT_{11}$. Specifically, a first end of the capacitance element $C_{12}$ is connected to the source electrode of the input transistor $PT_{11}$, and a second end of the capacitance element $C_{12}$ is connected to the drain electrode of the input transistor $PT_{11}$. The capacitance element $C_{12}$ is a band-limiting capacitance.

The input-side clamp transistor $PT_{13}$ includes, for example, a P-channel MOS transistor and is connected between the source electrode and the drain electrode of the input transistor $PT_{11}$. The input-side clamp transistor $PT_{13}$ has a diode-connected configuration in which a gate electrode and a source electrode are connected in common and functions to suppress a decrease in the drain voltage of the input transistor $PT_{11}$ when the input transistor $PT_{11}$ is in a non-conductive state.

The input-side clamp transistor $NT_{11}$ includes, for example, an N-channel MOS transistor, and has a drain electrode connected to the source electrode of the input transistor $PT_{11}$ and a source electrode connected to the drain electrode of the input transistor $PT_{11}$. The input-side clamp transistor $NT_{11}$ has a gate electrode to which a predetermined bias voltage bias1 is applied.

The predetermined bias voltage bias1 is applied to the gate electrode of the input-side clamp transistor $NT_{11}$. Therefore, a lower limit of the drain voltage $V_d$ of the input transistor $PT_{11}$ can be limited regardless of a voltage of the signal line 32, and the stop of supply of a drain current can be directly prevented.

The output transistor $PT_{12}$ includes, for example, a P-channel MOS transistor and is connected between the signal line 32 and the output-side load current source $I_{12}$. Specifically, the output transistor $PT_{12}$ has a source electrode connected to the signal line 32 and a drain electrode connected to a first end of the output-side load current source 112. Therefore, the analog pixel signal $V_{VSL}$ is input to the source electrode of the output transistor $PT_{12}$ through the signal line 32. A back gate and the source electrode of the output transistor $PT_{12}$ are desirably short-circuited in order to suppress the back gate effect.

The output-side load current source 112 has a second end connected to the low-potential-side power supply, for example, the ground GND. The output-side load current source $I_{12}$ supplies a constant current to a series connection circuit of the output transistor $PT_{12}$ and the signal line 32.

The output transistor $PT_{12}$ has a gate electrode connected to the drain electrode of the input transistor $PT_{11}$. Therefore, the drain voltage of the input transistor $PT_{11}$ is input to the gate electrode of the output transistor $PT_{12}$.

The output transistor $PT_{12}$ outputs a signal OUT indicating whether or not a voltage difference between the analog pixel signal $V_{VSL}$ input to the source electrode through the signal line 32 and the drain voltage $V_d$ of the input transistor $PT_{11}$ input to the gate electrode exceeds a predetermined threshold voltage from a drain electrode as a comparison result between the analog pixel signal $V_{VSL}$ and the reference signal $V_{RAMP}$ of the ramp wave through an output terminal $T_{13}$.

The output-side clamp transistor $NT_{12}$ includes, for example, an N-channel MOS transistor, and has a drain electrode connected to the source electrode of the output transistor $PT_{12}$ and a source electrode connected to the drain electrode of the output transistor $PT_{12}$. A predetermined bias voltage bias2 is applied to a gate electrode of the output-side clamp transistor $NT_{12}$. The output-side clamp transistor $NT_{12}$ including the N-channel MOS transistor can limit a lower limit of a drain voltage of the output transistor $PT_{12}$.

As described above, the comparator 131 according to the reference example has the circuit configuration in which the load current source $I_{11}$ and the load current source $I_{12}$ that supply the current to the signal line 32 are shared as a current source of the comparator 131.

According to the comparator 131 having this circuit configuration, it is possible to reduce the power consumption of the analog-to-digital converter 130, and further, the power consumption of the CMOS image sensor 1. That is, the comparator 131 according to the reference example is an ultra-low power consumption comparator.

Moreover, the input transistor $PT_{11}$ supplies a drain-source voltage between the gate and the source of the output transistor $PT_{12}$ in the comparator 131 according to the reference example, and thus, the comparison result can be inverted at a timing when a change in the analog pixel signal $V_{VSL}$ matches a change in the reference signal $V_{RAMP}$ of the ramp wave. Therefore, the nonlinearity caused by the error in the inversion timing can be reduced, and the image quality of the image data can be improved.

(Circuit Operation Example of Comparator)

Figure 6:
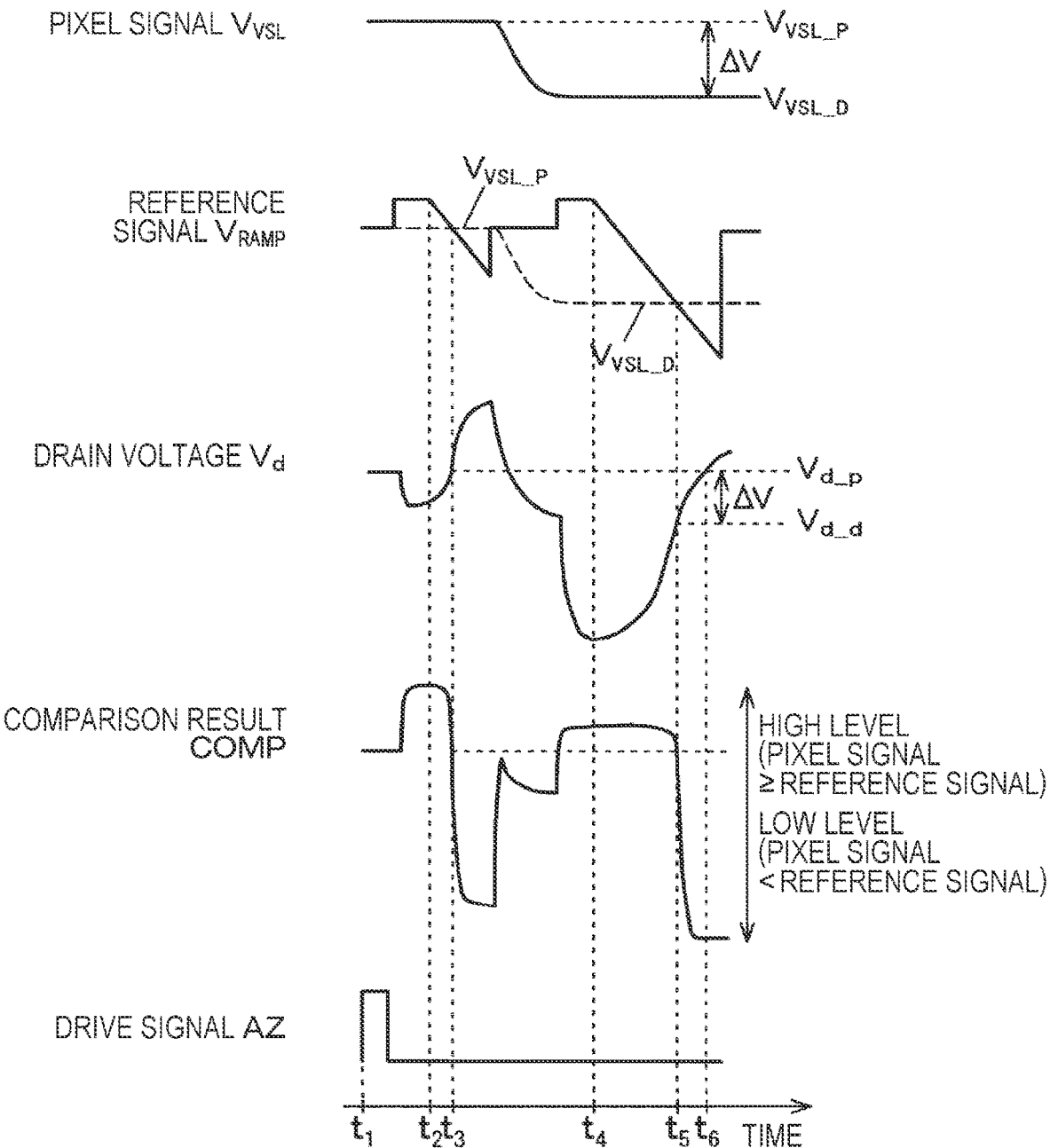
FIG. 6 is a timing chart for describing a circuit operation example of the comparator according to the reference example.

Next, an exemplary circuit operation of the comparator 131 having the above-described basic circuit configuration will be described. FIG. 6 is a timing chart for describing the exemplary circuit operation of the comparator 131 according to the reference example. The timing chart of FIG. 6 illustrates a timing relationship among waveforms of the analog pixel signal $V_{VSL}$, the reference signal $V_{RAMP}$ of the ramp wave, the drain voltage $V_d$ of the input transistor $PT_{11}$, a comparison result COMP of the comparator 131, and the drive signal AZ of the auto-zero switch $SW_{AZ}$.

At a time $t_1$ immediately before the start of analog-to-digital conversion (AD conversion), the drive signal AZ of the auto-zero switch $SW_{AZ}$ is brought into an active state (high-level state) over a predetermined auto-zero period. Therefore, the auto-zero switch $SW_{AZ}$ is set to the on (closed) state in response to the drive signal AZ, causes the short circuit between the gate electrode and the drain electrode of the input transistor $PT_{11}$, and performs the initialization operation of the comparator 131, that is, an auto-zero operation.

After the auto-zero operation, the reference signal generating section 16 starts to output the reference signal $V_{RAMP}$ at a time $t_2$. The reference signal $V_{RAMP}$ is a ramp wave signal whose level (voltage) monotonously decreases with the passage of time.

Meanwhile, in the CMOS image sensor 1, noise removal processing by correlated double sampling (CDS) is generally performed in order to remove noise at the time of a reset operation of the pixel 20. Therefore, for example, a reset level (P-phase) $V_{VSL\_P}$ and a signal level (D-phase) $V_{VSL\_D}$ are read from the pixel 20 as the pixel signal.

The reset level $V_{VSL\_P}$ corresponds to a potential of the floating diffusion FD when the floating diffusion FD of the pixel 20 has been reset. The signal level $V_{VSL\_D}$ corresponds to a potential obtained by photoelectric conversion in the photodiode 21, that is, a potential of the floating diffusion FD when the charge accumulated in the photodiode 21 is transferred to the floating diffusion FD.

It is assumed that the reference signal $V_{RAMP}$ whose voltage gradually decreases with the passage of time intersects the reset level $V_{VSL\_P}$ at a time $t_3$. Here, assuming that the drain voltage $V_d$ of the input transistor $PT_{11}$ at the time $t_3$ is defined as $V_{d\_p}$, a voltage lower than the drain voltage $V_{d\_p}$ is set as a low level, and a voltage equal to or higher than the drain voltage $V_{d\_p}$ is set as a high level, the drain voltage $V_d$ of the input transistor $PT_{11}$ is inverted from the low level to the high level around the time $t_3$.

Thereafter, the reference signal $V_{RAMP}$ is initialized, and the reference signal $V_{RAMP}$ starts to gradually decrease from a time $t_4$. Meanwhile, in the pixel 20, the charge is transferred from the photodiode 21 to the floating diffusion FD, and the signal level $V_{VSL\_D}$ is output as the pixel signal. The signal level $V_{VSL\_D}$ is set to a level lower than the reset level $V_{VSL\_P}$ by $\Delta V$.

Then, it is assumed that the reference signal $V_{RAMP}$ whose voltage gradually decreases with the passage of time intersects the signal level $V_{VSL\_D}$ at a time $t_5$. Here, it is assumed that the drain voltage $V_d$ of the input transistor $PT_{11}$ at the time $t_5$ is defined as $V_{d\_d}$. The drain voltage $V_{d\_d}$ has a value lower than the drain voltage $V_{d\_p}$ by $\Delta V$. That is, the drain voltage $V_{d\_d}$ at the time $t_5$ becomes a lower value as the signal level $V_{VSL\_D}$, which is the pixel signal at that time, is lower.

The drain voltage $V_{d\_d}$ of the input transistor $PT_{11}$ drops by $\Delta V$ from the drain voltage $V_{d\_p}$ at the time of conversion of the reset level $V_{VSL\_P}$. In the related art, it is determined that the drain voltage $V_d$ is inverted at a time to after the time $t_5$. Therefore, if the drain voltage $V_{d\_p}$ is used to generate the comparison result COMP of the comparator 131, a timing (around the time $t_6$) at which the comparison result COMP is inverted deviates from an ideal timing (around the time $t_5$) at which the reference signal $V_{RAMP}$ intersects the signal level $V_{VSL\_D}$. Therefore, a linearity error and an offset occur in the analog-to-digital converter 130, and there is a possibility that the image quality of the image data deteriorates due to this error.

On the other hand, in the comparator 131 according to the reference example, the output transistor $PT_{12}$ is provided at the subsequent stage of the input transistor $PT_{11}$, and the source electrode and the drain electrode of the input transistor $PT_{11}$ are connected to the source electrode and the gate electrode of the output transistor $PT_{12}$. With this connection, a drain-source voltage $V_{ds}$ of the input transistor $PT_{11}$ is input to the output transistor $PT_{12}$ as the gate-source voltage thereof.

As illustrated in the timing chart of FIG. 6, at the time $t_3$ and time $t_5$ at which the reference signal $V_{RAMP}$ intersects the pixel signal $V_{VSL}$, a voltage drop amount $\Delta V$ of the pixel signal $V_{VSL}$ is the same as a voltage drop amount of the drain voltage $V_d$ of the input transistor $PT_{11}$. Therefore, the drain-source voltage Vas has the same value at these timings. The value of the drain-source voltage Vas at the time (that is, the time $t_3$ and time $t_5$) is the same as that at the auto-zero time. Since the drain-source voltage Vas of the input transistor $PT_{11}$ is the gate-source voltage of the output transistor $PT_{12}$, the drain voltage of the output transistor $PT_{12}$ is inverted around the time $t_3$ and around the time $t_5$.

Since the inversion timing of the comparison result COMP of the comparator 131 corresponds to the ideal timing at which the reference signal $V_{RAMP}$ intersects the signal level $V_{VSL\_D}$, the error in the inversion timing is suppressed. Therefore, the image quality of the image data can be improved by reducing the linearity error and the offset as compared with the case where the drain voltage $V_{d\_p}$ of the input transistor $PT_{11}$ is used to generate the comparison result COMP.

Next, the reason why the voltage drop amount $\Delta V$ of the drain voltage $V_d$ of the input transistor $PT_{11}$ is the same as the voltage drop amount of the pixel signal $V_{VSL}$ input to the source electrode of the input transistor $PT_{11}$ at the time $t_3$ and time $t_5$ will be described.

Figure 7:
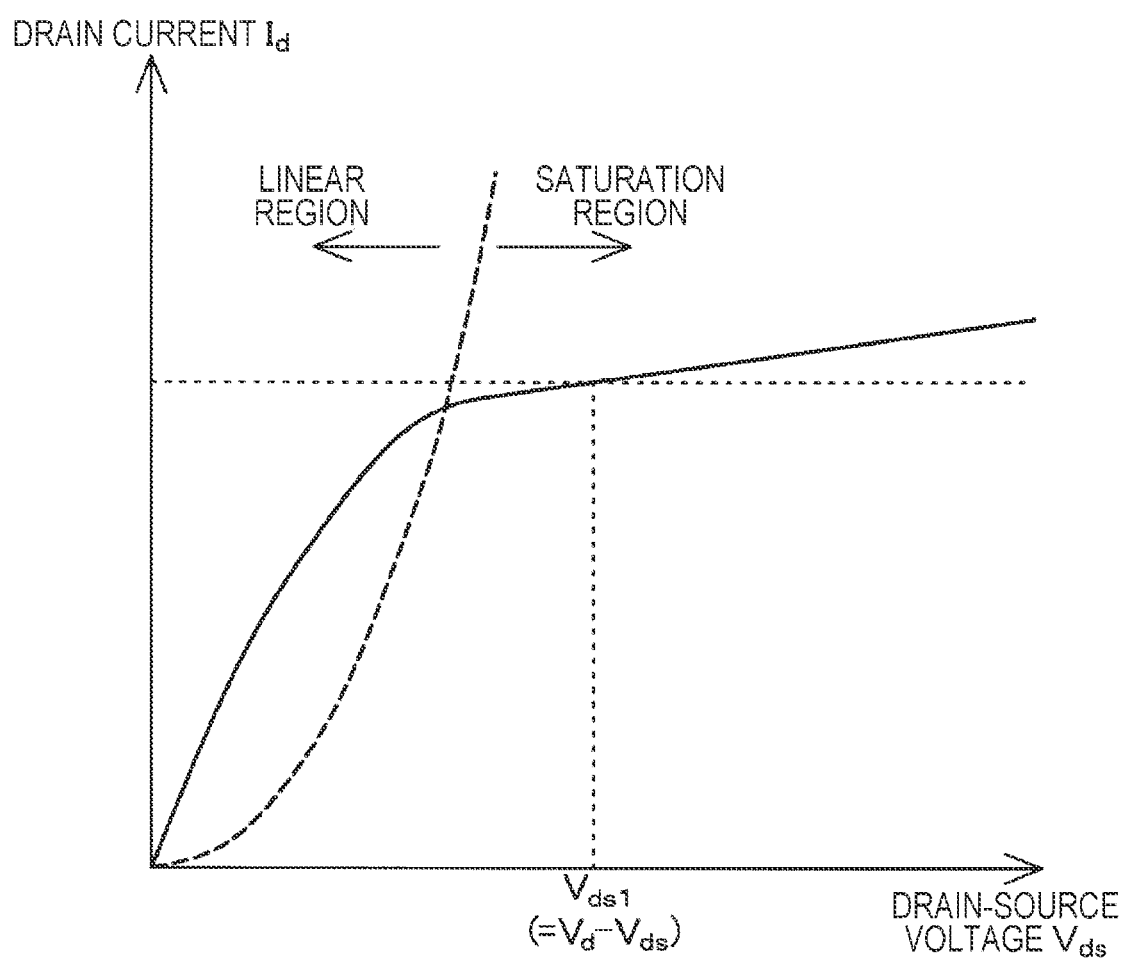
FIG. 7 is a characteristic diagram depicting exemplary characteristics of a P-channel MOS transistor.

FIG. 7 is a characteristic diagram depicting exemplary characteristics of the P-channel MOS transistor used as the input transistor $PT_{11}$ in the comparator 131 according to the reference example. In the characteristic diagram of FIG. 8, the vertical axis represents a drain current, and the horizontal axis represents a drain-source voltage. Furthermore, the broken line indicates a boundary between a linear region and a saturation region.

In general, an operating point of the P-channel MOS transistor is determined so as to operate in the saturation region at the auto-zero time. A drain current Ia in the saturation region of the P-channel MOS transistor is expressed by the following Formula (1).

$$I_d = (1/2) \cdot \mu C_{OX}(W/L) \cdot (V_{GS}-V_{th})^2(1+\lambda V_{ds}) \qquad (1)$$

Here, $\mu$ is electron mobility, $C_{OX}$ is a capacitance per unit area of the MOS capacitor, W is a gate width, L is a gate length, $V_{th}$ is a threshold voltage, and $\lambda$ is a predetermined coefficient.

Since the input transistor $PT_{11}$ is the P-channel MOS transistor, Formula (1) is established in the saturation region. At this time, the drain current $I_d$ of the input transistor $PT_{11}$ is a constant value $I_{d1}$ supplied by the input-side load current source $I_{11}$. Furthermore, the electron mobility $\mu$, the unit capacitance $C_{OX}$, the gate width W, the gate length L, the threshold voltage $V_{th}$, and the coefficient A are constant values.

Furthermore, when the reference signal $V_{RAMP}$ input to the gate electrode of the input transistor $PT_{11}$ is said to intersect the pixel signal $V_{VSL}$ input to the source electrode, the gate-source voltage $V_{gs}$ has a constant value determined at the auto-zero time.

Therefore, when the reference signal $V_{RAMP}$ input to the gate electrode of the input transistor $PT_{11}$ intersects the pixel signal $V_{VSL}$ input to the source electrode, the drain-source voltage $V_{ds}$ also has a constant value according to Formula (1). Assuming that such a constant drain-source voltage is defined as $V_{ds1}$, the following Formulas (2) and (3) are established at the time $t_3$ and time $t_5$.

$$V_{ds1} = V_{VSL\_P} - V_{d\_p} \qquad (2)$$

$$V_{ds1} = V_{VSL\_D} - V_{d\_d} \qquad (3)$$

When the drain-source voltage $V_{ds1}$ is deleted from Formulas (2) and (3), the following Formula (4) is obtained.

$$V_{VSL\_P} - V_{VSL\_D} = V_{d\_p} - V_{d\_d} \qquad (4)$$

Note that, in a case where the operating point is determined such that the P-channel MOS transistor operates in the linear region at the auto-zero time, Formula (1) has a different form, but Formula (4) is similarly established.

From Formula (4), the voltage drop amount ΔV of the drain voltage $V_d$ of the input transistor $PT_{11}$ becomes the same as the voltage drop amount of the pixel signal $V_{VSL}$ input to the source electrode. Therefore, the timing relationship illustrated in the timing chart of FIG. 6 can be obtained.

(Regarding Buffer Noise)

Meanwhile, in the single-slope analog-to-digital converter, a buffer is arranged in front of the capacitance element $C_{11}$ configured to absorb the offset for purposes of increasing a driving force of the reference signal $V_{RAMP}$ of the ramp wave supplied to the comparator of each pixel column and decreasing an output impedance. At this time, noise of the buffer adversely affects the comparator, and thus an output end of the buffer is connected between pixel columns, for example, in a conventional comparator having a differential amplifier configuration, and the noise of the buffer is reduced by averaging.

Figure 8:
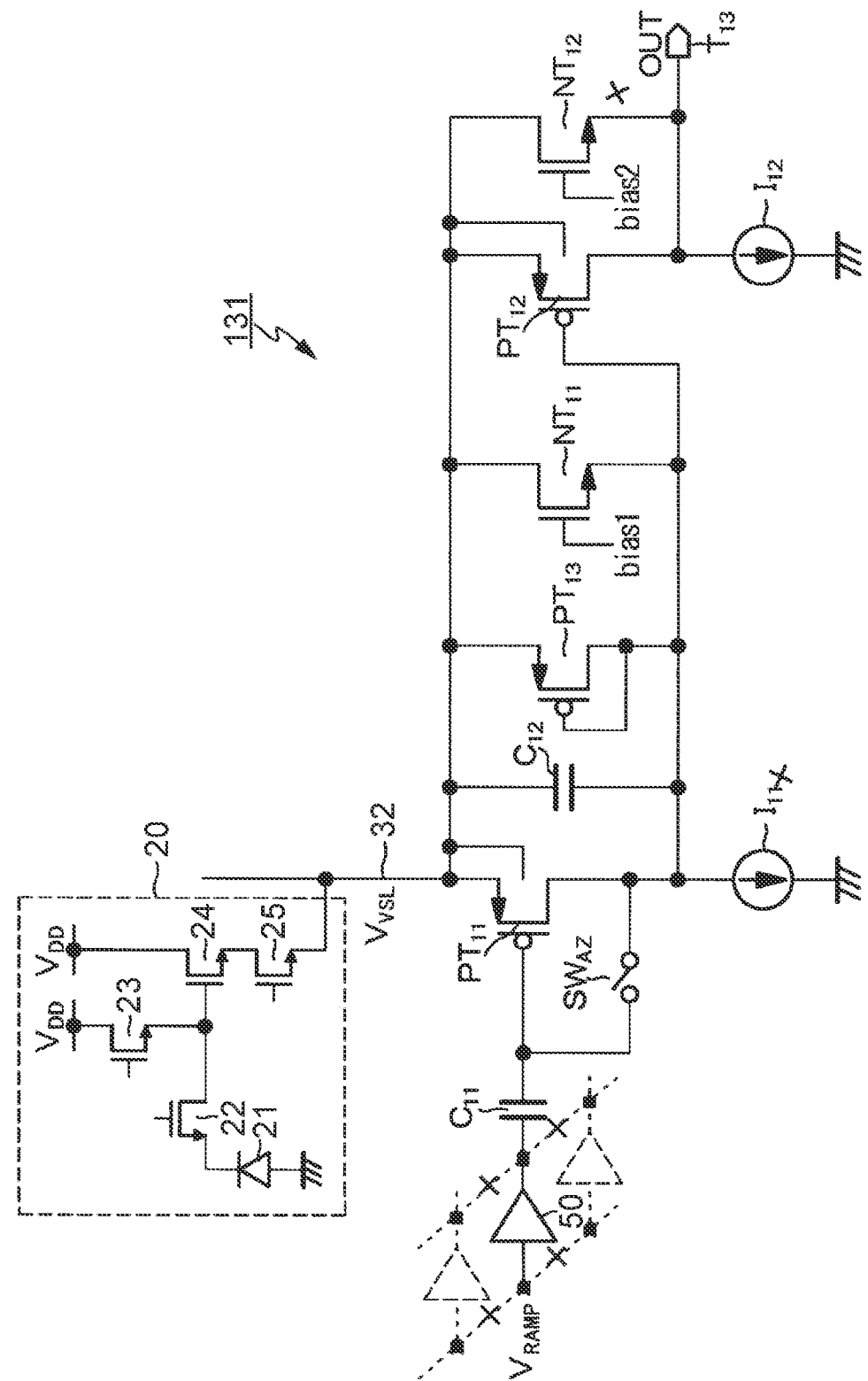
FIG. 8 is a circuit diagram for describing buffer noise in the case of the comparator according to the reference example.

However, in the ultra-low power consumption comparator 131 according to the above-described reference example, kickback is great, and it is difficult to connect an output end of a buffer 50 between pixel columns as indicated by x marks in FIG. 8 in order to avoid interference with other pixel columns, specifically, streaking (streak noise). As a result, it is difficult to average noise of the buffer 50 among the pixel columns, and thus, the noise of the buffer 50 remains without being attenuated so that noise of the entire comparator 131 deteriorates. Here, the "kickback" is a phenomenon in which a potential varies (fluctuates) as a charge is injected or drawn.

Note that, regarding the noise adversely affecting the analog-to-digital conversion section 13, the noise of the buffer 50 disposed in front of the capacitance element Cu has been exemplified to describe the problem thereof here. However, the noise adversely affecting the analog-to-digital conversion section 13 is not limited to the noise of the buffer 50. For example, even in a case where the buffer 50 is not disposed in front of the capacitance element Cu, noise of the reference signal generating section 16 riding on the reference signal $V_{RAMP}$ of the ramp wave may also cause a problem in the image quality of the image data.

Embodiment of Present Disclosure

Figure 9:
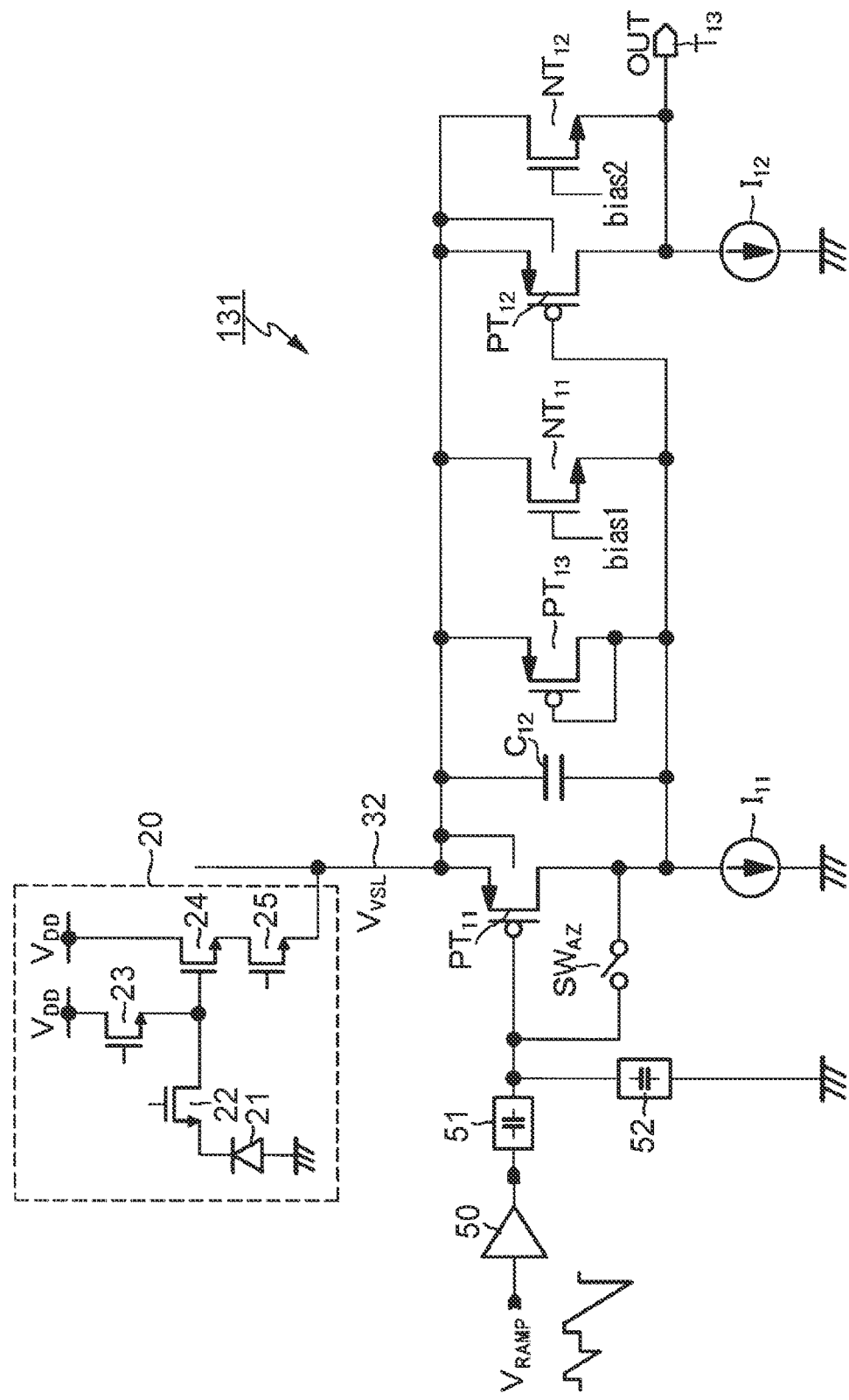
FIG. 9 is a circuit diagram depicting a circuit configuration example of a comparator according to an embodiment of the present disclosure.

A comparator 131 according to an embodiment of the present disclosure is an ultra-low power consumption comparator including an input transistor $PT_{11}$ connected between a load current source (specifically, an input-side load current source $I_{11}$) and a signal line 32. Then, as depicted in FIG. 9, the comparator 131 according to the present embodiment includes: a first capacitor 51 that inputs a predetermined reference signal, specifically, a reference signal $V_{RAMP}$ of a ramp wave, to a gate electrode of the input transistor $PT_{11}$; and a second capacitor 52 connected between the gate electrode of the input transistor $PT_{11}$ and a reference potential node (for example, ground).

In the comparator 131 according to the present embodiment having the above-described configuration, for example, there is a case where the buffer 50 is disposed on a gate input side of the input transistor $PT_{11}$ for purposes of increasing a driving force of the reference signal $V_{RAMP}$ of the ramp wave and decreasing an output impedance. Even in such a case, according to the comparator 131 of the present embodiment having the above-described configuration, noise of the buffer 50 input to the gate electrode of the input transistor $PT_{11}$ can be reduced by capacitance attenuation using capacitive voltage division using the first capacitor 51 and the second capacitor 52 even if an output end of the buffer 50 is not connected between pixel columns. At this time, not only the noise of the buffer 50 but also noise of the reference signal generating section 16 riding on the ramp wave reference signal $V_{RAMP}$ can be reduced. Furthermore, even in a case where the buffer 50 is not disposed, the noise of the reference signal generating section 16 that rides on the reference signal $V_{RAMP}$ of the ramp wave can be reduced by the capacitance attenuation using the capacitive voltage division between the first capacitor 51 and the second capacitor 52.

Hereinafter, specific examples of the comparator 131 according to the present embodiment including the first capacitor 51 that inputs the reference signal $V_{RAMP}$ of the ramp wave to the gate electrode of the input transistor $PT_{11}$ and the second capacitor 52 connected between the gate electrode of the input transistor $PT_{11}$ and the reference potential node will be described.

Example 1

Figure 10:
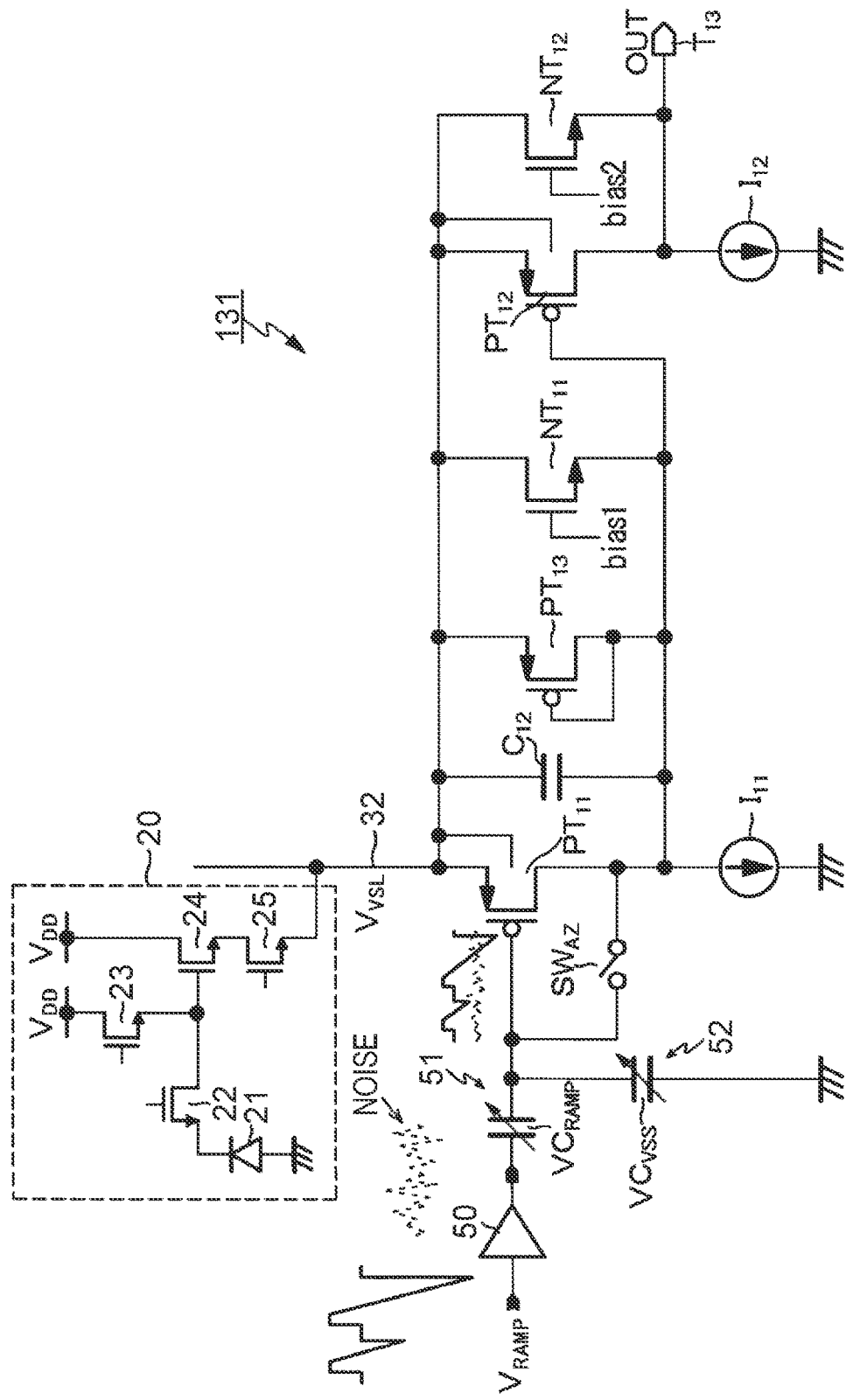
FIG. 10 is a circuit diagram depicting a circuit configuration example of a comparator according to Example 1.

Example 1 is an example in which a variable capacitance element having a variable capacitance value is used as each of the first capacitor 51 and the second capacitor 52. FIG. 10 illustrates a circuit configuration example of the comparator 131 according to Example 1.

As depicted in FIG. 10, in the comparator 131 according to Example 1, a variable capacitance element $VC_{RAMP}$ having a variable capacitance value is used as the first capacitor 51, and a variable capacitance element $VC_{VSS}$ having a variable capacitance value is used as the second capacitor 52. The variable capacitance element $VC_{RAMP}$ is connected between an output end of the buffer 50 and a gate electrode of the input transistor $PT_{11}$, and applies the reference signal $V_{RAMP}$ Of a ramp wave, input via the buffer 50, to the gate electrode of the input transistor $PT_{11}$. The variable capacitance element $VC_{VSS}$ is connected between the gate electrode of the input transistor $PT_{11}$ and a reference potential node (for example, ground).

With the comparator 131 according to Example 1 having the above-described configuration, the first capacitor 51 and the second capacitor 52 include the variable capacitance element $VC_{RAMP}$ and the variable capacitance element $VC_{VSS}$, respectively, and the capacitance values are variable, and thus, it is possible to set any attenuation ratio of capacitance attenuation using capacitive voltage division in noise reduction. For example, the attenuation ratio of the capacitance attenuation performed by the variable capacitance element $VC_{RAMP}$ and the variable capacitance element $VC_{VSS}$ can be set according to an analog gain of an analog-to-digital converter 130 including the comparator 131.

Figure 11A:
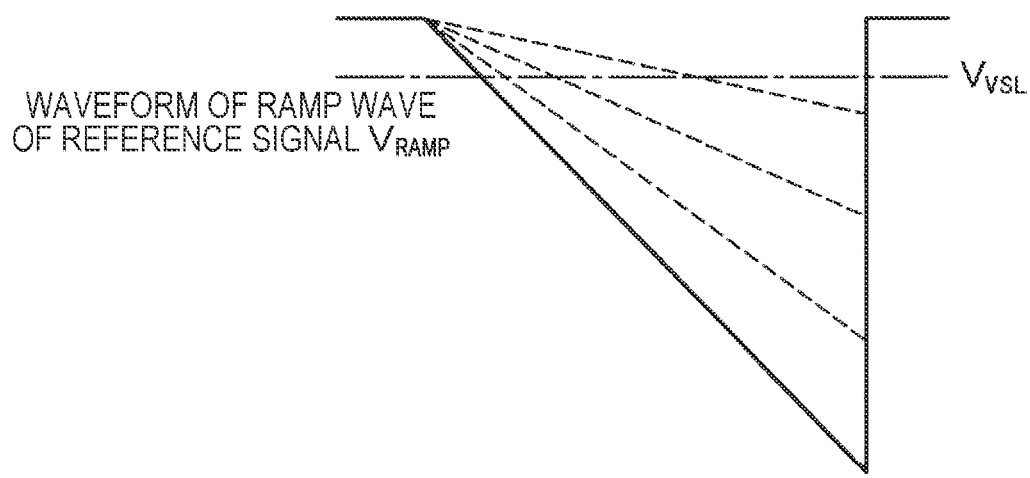
FIG. 11A is a waveform diagram depicting a relationship between a slope of a ramp wave of a reference signal and a cross point with a pixel signal.
Figure 11B:
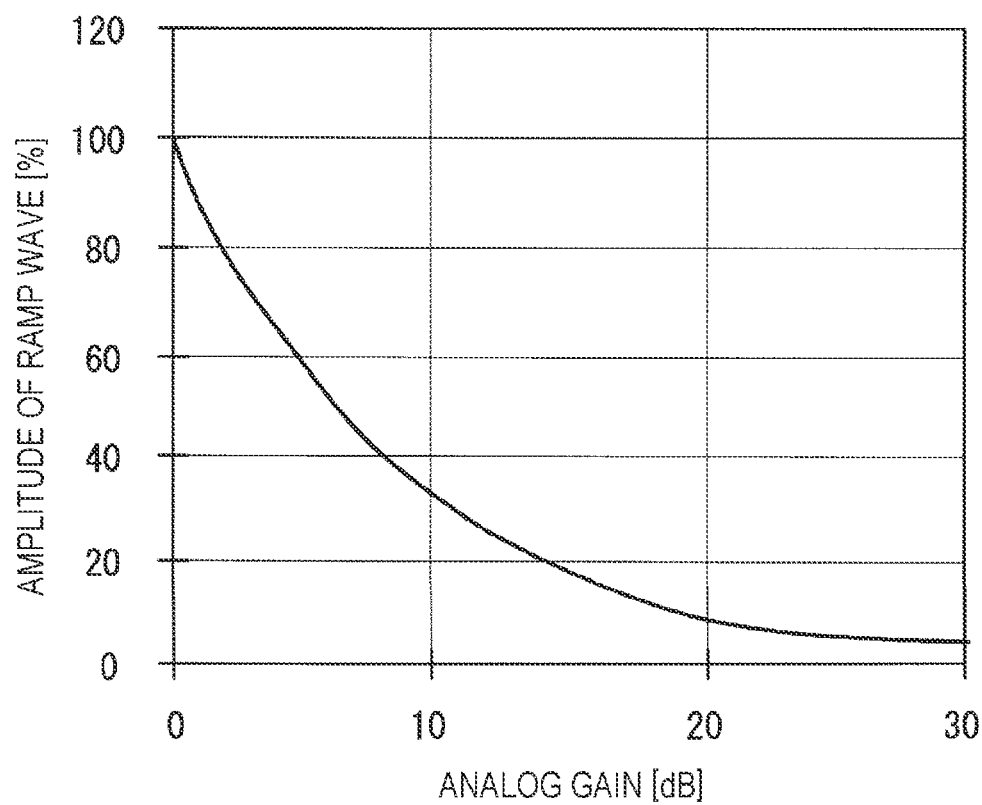
FIG. 11B is a diagram depicting a relationship between an analog gain of an analog-to-digital converter and an amplitude of the ramp wave of the reference signal.

The analog gain of the analog-to-digital converter 130 is set depending on, for example, a slope of the ramp wave of the reference signal $V_{RAMP}$ generated by the reference signal generating section 16 (see FIG. 4). As depicted in FIG. 11A, in a case where the slope of the ramp wave of the reference signal $V_{RAMP}$ is gentle, a time to a cross point with a pixel signal $V_{VSL}$ is long, and a count number of the counter 132 (see FIG. 4) increases. This corresponds to increasing the analog gain of the analog-to-digital converter 130. Thus, as depicted in FIG. 11B, an amplitude of the ramp wave of the reference signal $V_{RAMP}$ and the analog gain of the analog-to-digital converter 130 are in an inversely proportional relationship. The slope of the ramp wave of the reference signal $V_{RAMP}$ can be set in the reference signal generating section 16 on the basis of, for example, a DAC setting signal (see FIG. 35) to be described later.

Note that the noise of the buffer 50 and the like can be reduced by the capacitive voltage division using the first capacitor 51 and the second capacitor 52 with the comparator 131 according to Example 1, but at the same time, the amplitude of the ramp wave (a voltage of a sloped waveform) of the reference signal $V_{RAMP}$ is also attenuated. Therefore, it is necessary to set the amplitude of the ramp wave of the reference signal. $V_{RAMP}$ to be large in advance in the reference signal generating section 16 such that the amplitude after attenuation by the capacitive voltage division becomes a desired amplitude.

Example 2

Figure 12:
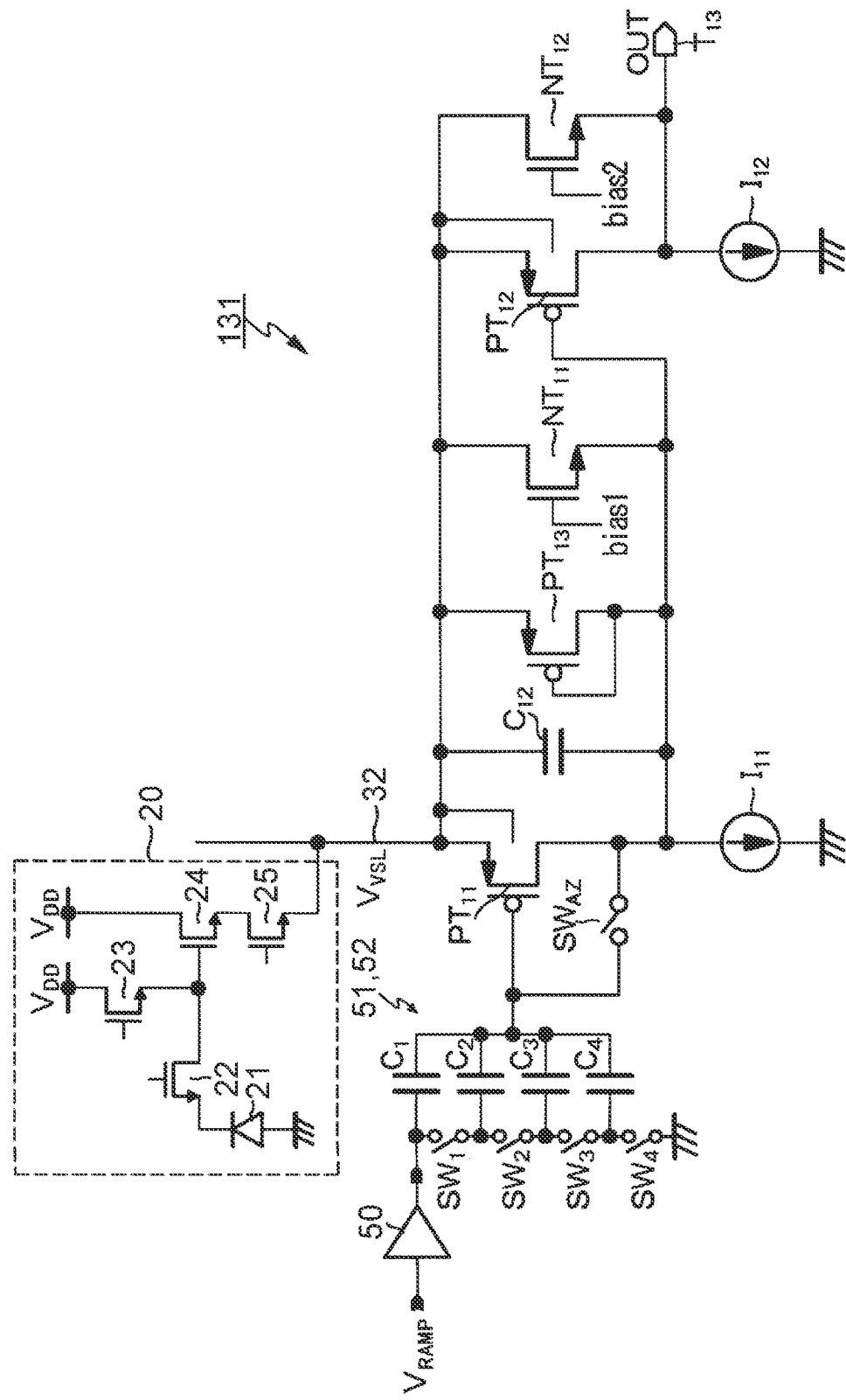
FIG. 12 is a circuit diagram depicting a circuit configuration example of a comparator according to Example 2.

Example 2 is an example in which the first capacitor 51 and the second capacitor 52 include a combination of a plurality of capacitance elements and a plurality of switch elements. FIG. 12 illustrates a circuit configuration example of the comparator 131 according to Example 2.

As depicted in FIG. 12, the comparator 131 according to Example 2 has a configuration in which the first capacitor 51 and the second capacitor 52 include the combination of the plurality of capacitance elements and the plurality of switch elements, for example, a combination of four capacitance elements $C_1$ to $C_4$ and four switch elements $SW_1$ to $SW_4$. Each of the four capacitance elements $C_1$ to $C_4$ has a first end connected to a gate electrode of the input transistor $PT_{11}$. Among the four switch elements $SW_1$ to $SW_4$, three switch elements $SW_1$ to $SW_3$ are connected between second ends of the four capacitance elements $C_1$ to $C_4$.

Specifically, the switch element $SW_1$ is connected between the second end of the capacitance element $C_1$ and the second end of the capacitance element $C_2$. The switch element $SW_2$ is connected between the second end of the capacitance element $C_2$ and the second end of the capacitance element $C_3$. The switch element $SW_3$ is connected between the second end of the capacitance element $C_3$ and the second end of the capacitance element $C_4$. Furthermore, the switch element $SW_4$ is connected between a reference potential node side (for example, ground) and the second end of the capacitance element $C_4$ on the reference potential node side among the four capacitance elements $C_1$ to $C_4$.

In the comparator 131 according to Example 2 having the above-described configuration, capacitance values of the first capacitor 51 and the second capacitor 52 can be changed by setting only one of the four switch elements $SW_1$ to $SW_4$ to an off (open) state and the remaining three to the on (closed) state. Note that the circuit configuration depicted in FIG. 12 is an example, and the present invention is not limited to this circuit configuration. That is, the number of the plurality of capacitance elements and the number of the plurality of switch elements are not limited to four.

Hereinafter, specific examples of a capacitance attenuation ratio in which only one of the four switch elements $SW_1$ to $SW_4$ is set to an off state and the remaining three are set to an on state will be described.

Specific Example 1

Figure 13:
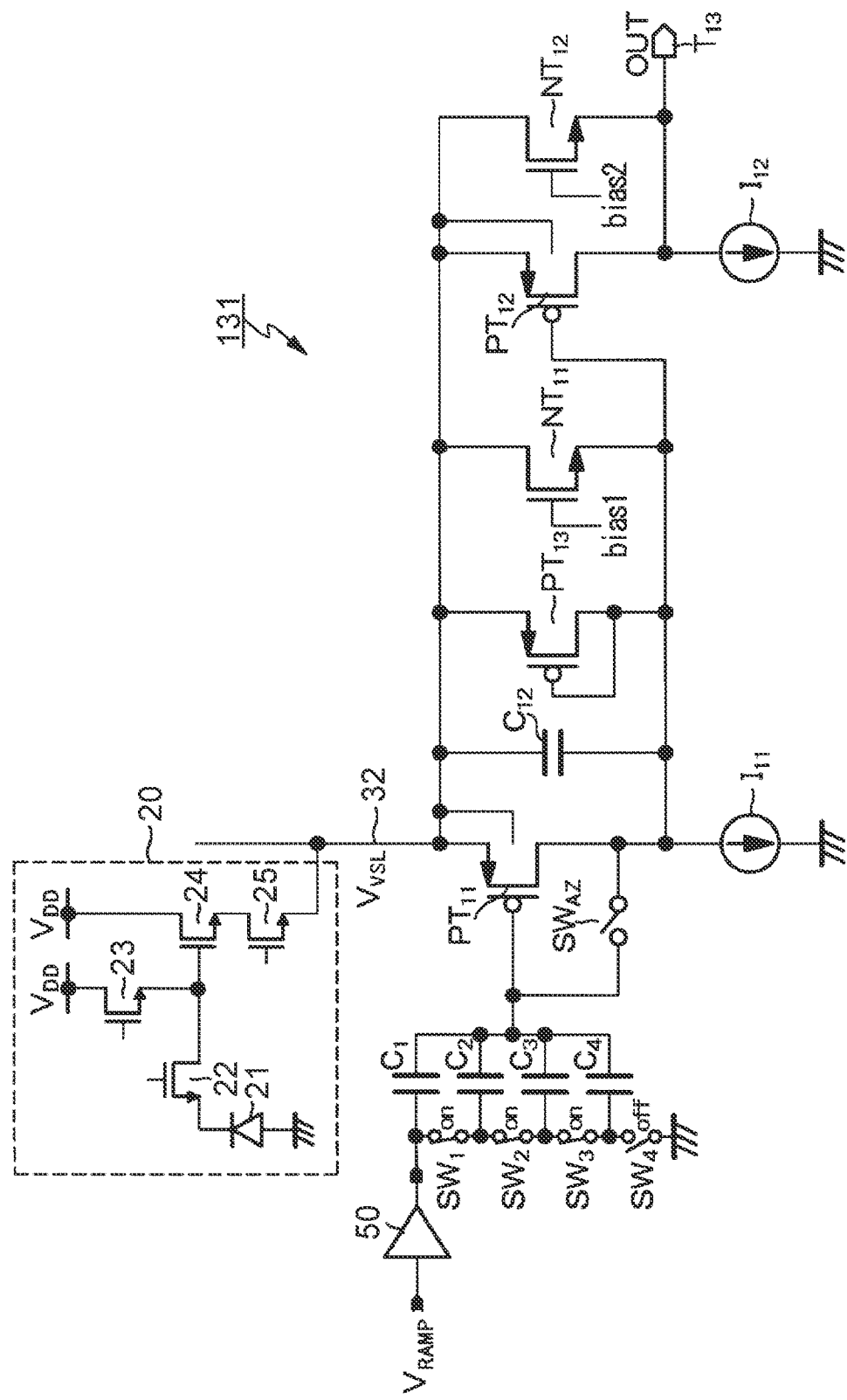
FIG. 13 is a circuit diagram depicting a circuit configuration example according to Specific Example 1 of an attenuation ratio.

Specific Example 1 is an example in a case where the capacitance attenuation ratio is 4/4 (no attenuation). FIG. 13 illustrates a circuit configuration example according to Specific Example 1 of the capacitance attenuation ratio.

As depicted in FIG. 13, in Specific Example 1, only the switch element $SW_4$ connected between the second end of the capacitance element $C_4$ and the reference potential node among the four switch elements $SW_1$ to $SW_4$ is set to an off state, and the remaining three switch elements $SW_1$ to $SW_3$ are set to an on state.

In the case of Specific Example 1, the four capacitance elements $C_1$ to $C_4$ are connected in parallel between the output end of the buffer 50 and the gate electrode of the input transistor $PT_{11}$ to form the first capacitor 51. In this case, the second capacitor 52 does not exist. As a result, in a case where only the switch element $SW_4$ is turned off and the remaining three switch elements $SW_1$ to $SW_3$ are turned on, the capacitive voltage division using the first capacitor 51 and the second capacitor 52 does not occur, so that the capacitance attenuation ratio becomes 4/4 (no attenuation).

Specific Example 2

Figure 14:
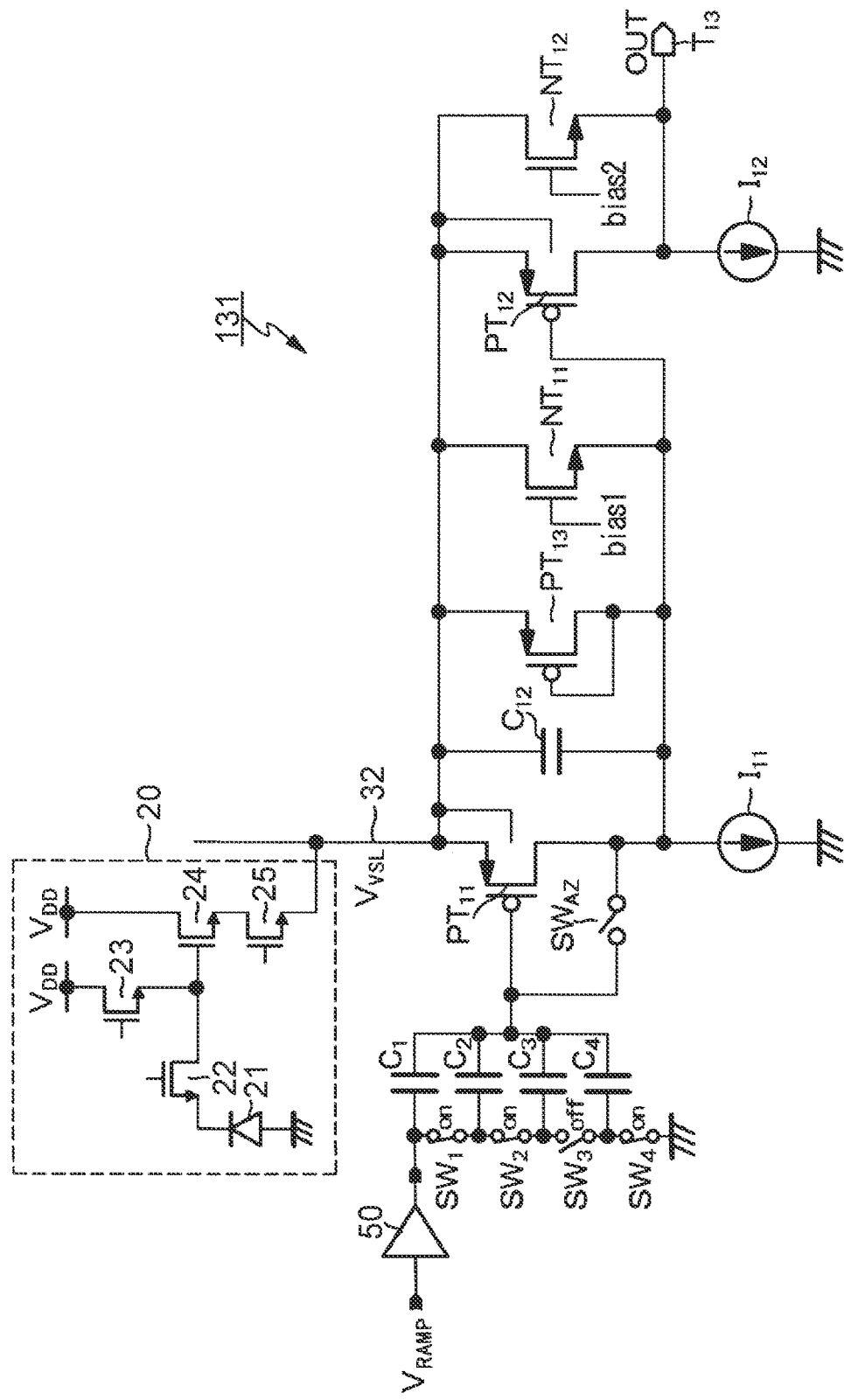
FIG. 14 is a circuit diagram depicting a circuit configuration example according to Specific Example 2 of the attenuation ratio.

Specific Example 2 is an example in a case where the capacitance attenuation ratio is 3/4. FIG. 14 illustrates a circuit configuration example according to Specific Example 2 of the capacitance attenuation ratio.

As depicted in FIG. 14, in Specific Example 2, only switch element $SW_3$ among the four switch elements $SW_1$ to $SW_4$ is set to an off state, and the remaining three switch elements $SW_1$, $SW_2$, and $SW_4$ are set to an on state.

In the case of Specific Example 2, the three capacitance elements $C_1$ to $C_3$ are connected in parallel between the output end of the buffer 50 and the gate electrode of the input transistor $PT_{11}$ to form the first capacitor 51, and the capacitance element $C_4$ on the reference potential node side forms the second capacitor 52. As a result, in a case where only the switch element $SW_3$ is turned off and the remaining three switch elements $SW_1$, $SW_2$, and $SW_4$ are turned on, the capacitance attenuation ratio becomes 3/4.

Specific Example 3

Figure 15:
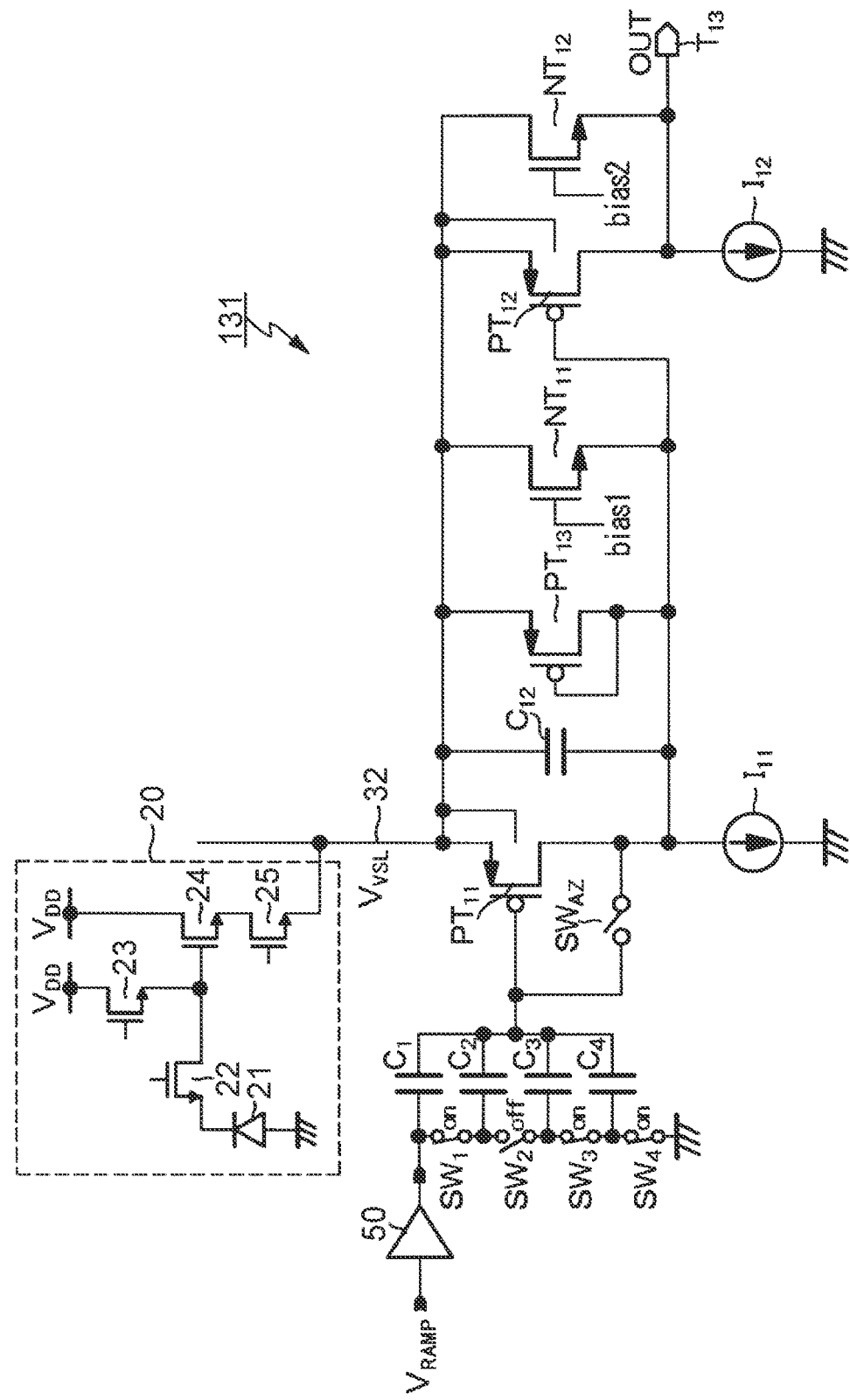
FIG. 15 is a circuit diagram depicting a circuit configuration example according to Specific Example 3 of the attenuation ratio.

Specific Example 3 is an example in a case where the capacitance attenuation ratio is 2/4. FIG. 15 illustrates a circuit configuration example according to Specific Example 3 of the capacitance attenuation ratio.

As depicted in FIG. 15, in Specific Example 3, only switch element $SW_2$ among the four switch elements SW; to $SW_4$ is set to an off state, and the remaining three switch elements $SW_1$, $SW_3$, and $SW_4$ are set to an on state.

In the case of Specific Example 3, the two capacitance elements $C_1$ and $C_2$ are connected in parallel between the output end of the buffer 50 and the gate electrode of the input transistor $PT_{11}$ to form the first capacitor 51, and the two capacitance elements $C_3$ and $C_4$ on the reference potential node side are connected in parallel between the gate electrode of the input transistor $PT_{11}$ and the reference potential node to form the second capacitor 52. As a result, in a case where only the switch element $SW_2$ is turned off and the remaining three switch elements $SW_1$, $SW_3$, and $SW_4$ are turned on, the capacitance attenuation ratio becomes 2/4.

Specific Example 4

Figure 16:
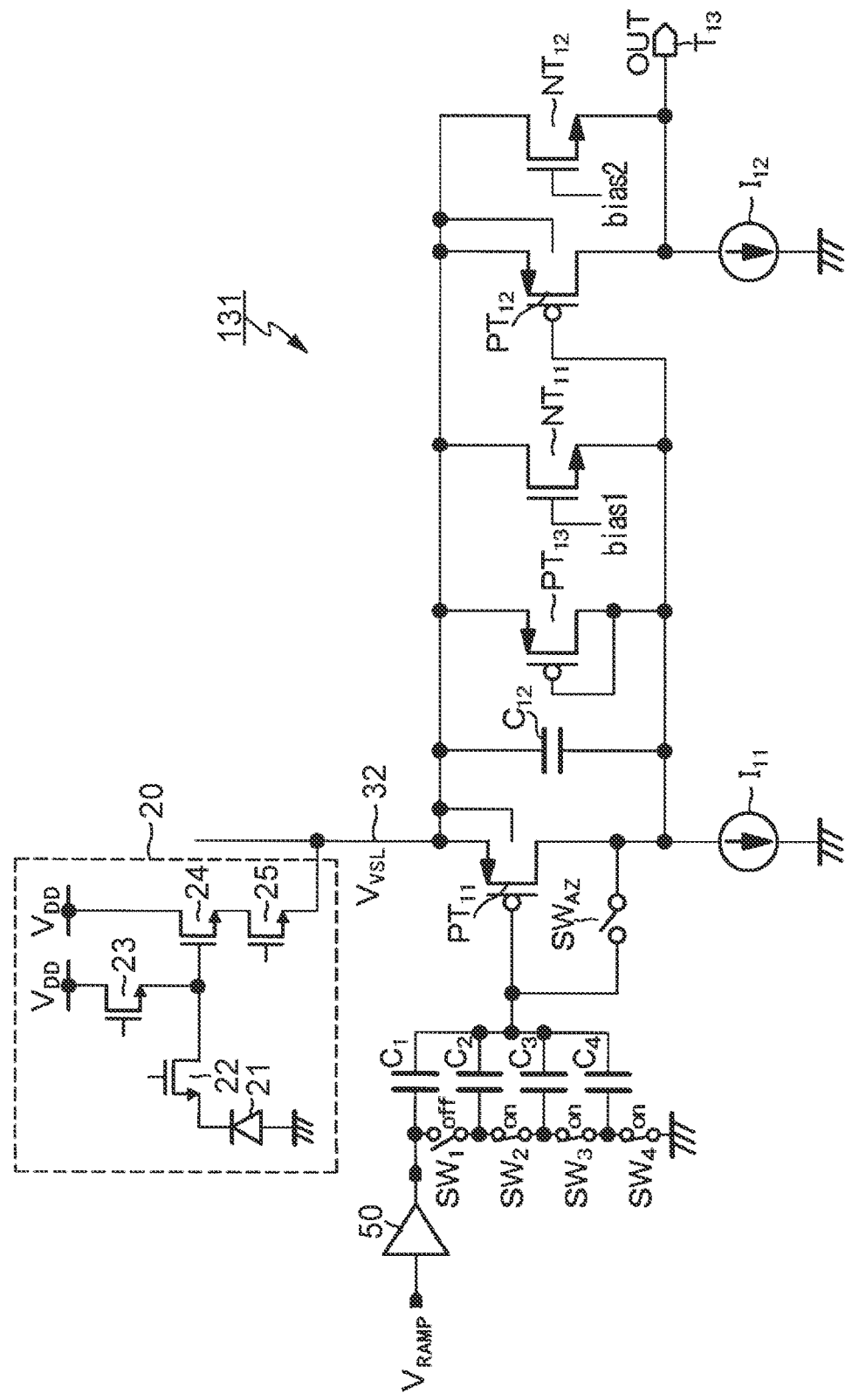
FIG. 16 is a circuit diagram depicting a circuit configuration example according to Specific Example 4 of the attenuation ratio.

Specific Example 4 is an example in a case where the capacitance attenuation ratio is 1/4. FIG. 16 illustrates a circuit configuration example according to Specific Example 4 of the capacitance attenuation ratio.

As depicted in FIG. 16, in Specific Example 4, only the switch element $SW_1$ connected to the output end of the buffer 50 among the four switch elements $SW_1$ to $SW_4$ is set to an off state, and the remaining three switch elements $SW_2$ to $SW_4$ are set to an on state.

In the case of Specific Example 4, only one capacitance element $C_1$ is connected between the output end of the buffer 50 and the gate electrode of the input transistor $PT_{11}$ to form the first capacitor 51, and the remaining three capacitance elements $C_2$ to $C_4$ are connected in parallel between the gate electrode of the input transistor $PT_{11}$ and the reference potential node to form the second capacitor 52. As a result, when only the switch element $SW_1$ is turned off and the remaining three switch elements $C_2$ to $C_4$ are turned on, the capacitance attenuation ratio becomes 1/4.

As described above, in the comparator 131 according to Example 2, the attenuation amount (capacitance attenuation ratio) is set by switching the capacitance elements $C_1$ to $C_4$ to reduce the noise of the buffer 50 and the noise of the reference signal generating section 16 riding on the reference signal $V_{RAMP}$ of the ramp wave.

Example 3

Figure 18:
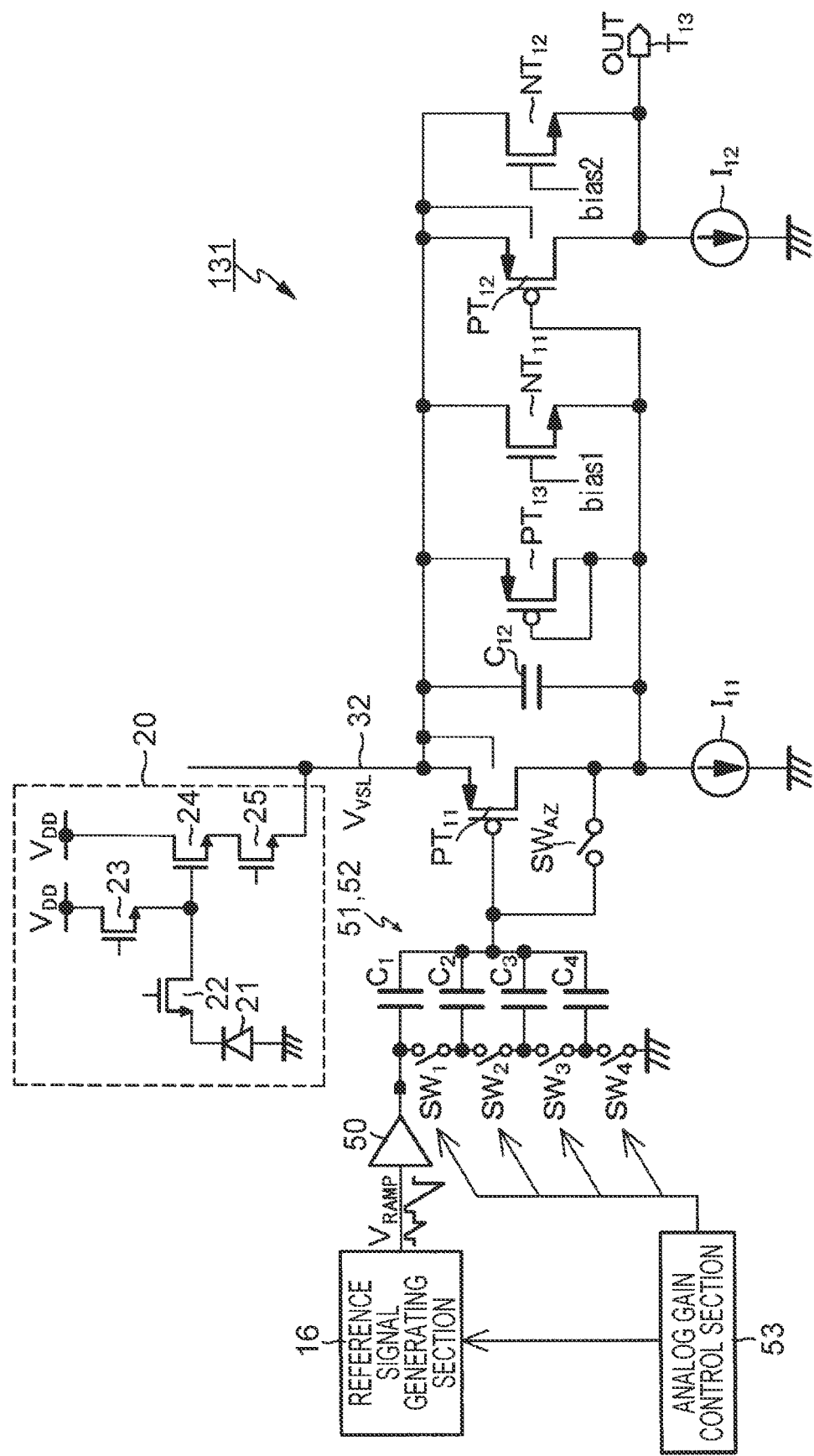
FIG. 18 is a circuit diagram depicting a circuit configuration example of a comparator according to Example 3.

Example 3 is a modified example of Example 2, and is an example in which an analog gain of the analog-to-digital converter 130 is finely controlled. FIG. 18 illustrates a circuit configuration example of the comparator 131 according to Example 3.

In the case of the comparator 131 according to Example 2 described above, the attenuation amount can be just changed in a stepwise manner only by switching the capacitance elements $C_1$ to $C_4$. Therefore, in the comparator 131 according to Example 3, the reference signal generating section 16 adjusts a slope of a ramp wave of the reference signal $V_{RAMP}$ to continuously control the analog gain of the analog-to-digital converter 130. Therefore, the analog gain can be finely controlled.

Specifically, as depicted in FIG. 18, an analog gain control section 53 is provided, and control of the analog gain of the analog-to-digital converter 130 and control of the attenuation amount (capacitance attenuation ratio) by switching of the capacitance elements $C_1$ to $C_4$ are performed under the control of the analog gain control section 53. Since an amplitude of the ramp wave of the reference signal $V_{RAMP}$ and the analog gain of the analog-to-digital converter 130 are in an inversely proportional relationship, the analog gain control section 53 controls the analog gain by adjusting the amplitude of the ramp wave with respect to the reference signal generating section 16 that generates the reference signal $V_{RAMP}$ of the ramp wave.

Figure 17A:
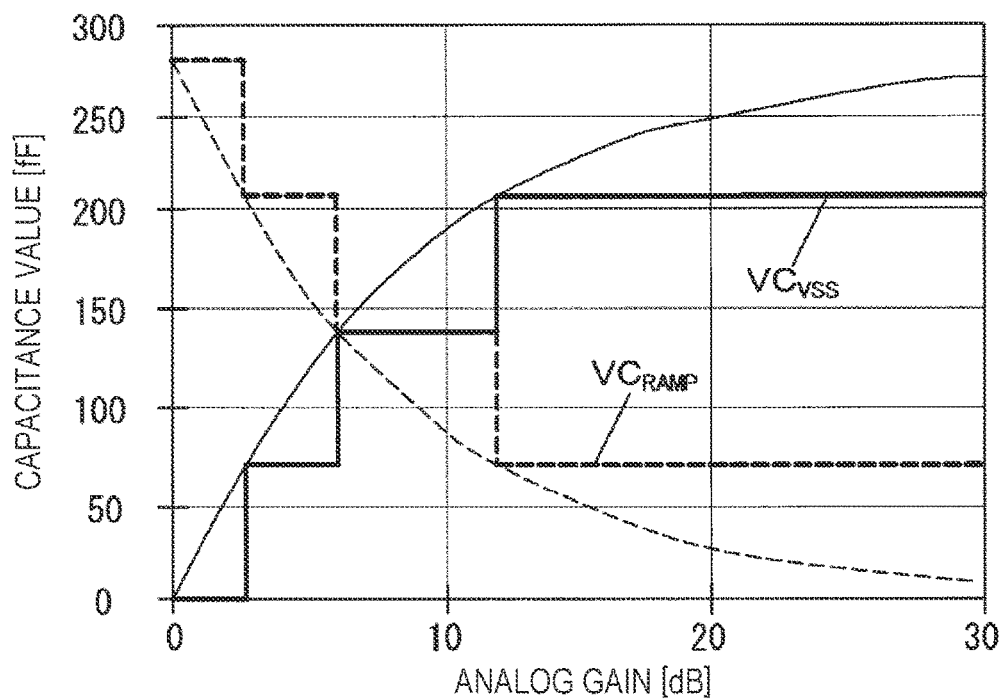
FIG. 17A is a diagram depicting a relationship between an analog gain and a capacitance value of each of a first capacitor and a second capacitor.
Figure 17B:
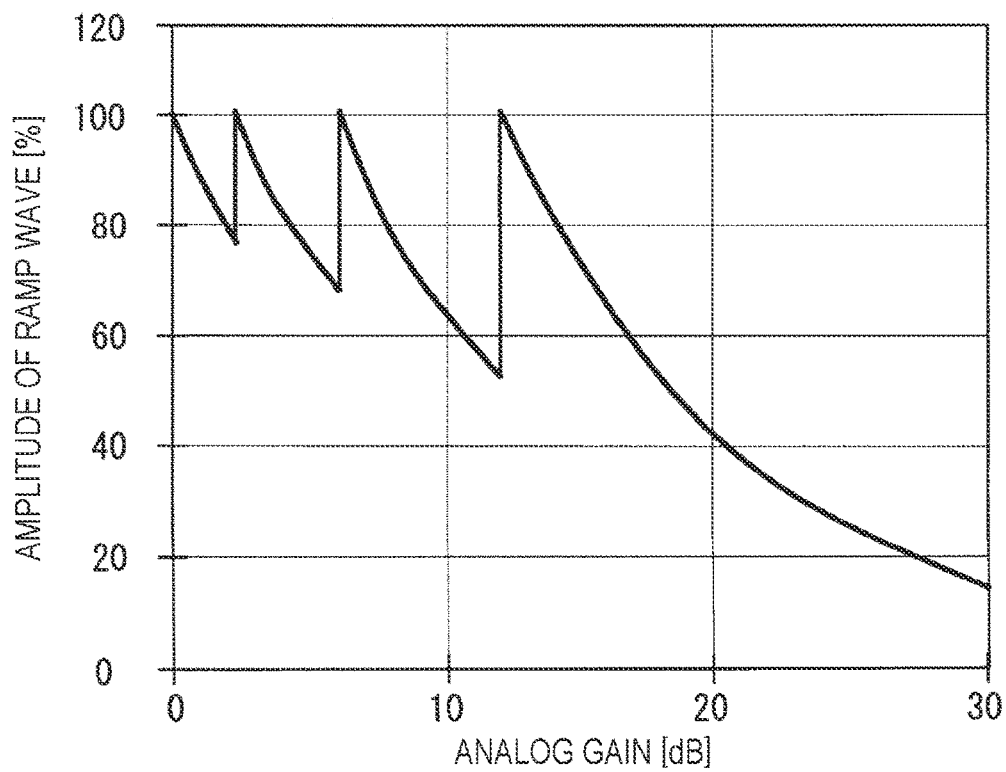
FIG. 17B is a diagram depicting a relationship between the analog gain and the amplitude of the ramp wave of the reference signal.

The analog gain control section 53 can also serve as, for example, a control section 17 (see FIG. 35) that controls the analog gain of the analog-to-digital converter 130 according to illuminance data to be described later. As depicted in FIGS. 17A and 17B, the analog gain control section 53 adjusts the analog gain by adjusting the amplitude of the ramp wave of the reference signal $V_{RAMP}$ in a range in which a capacitance value is not switched. Then, the attenuation amount is switched by one step when the capacitance value is switched by one step, and thus, the amplitude of the ramp wave and the capacitance values of the first capacitor 51 and the second capacitor 52 are controlled such that the amplitude of the ramp wave is returned to the original value. With this control, the amplitude of the ramp wave of the reference signal $V_{RAMP}$ is also discontinuously switched when the capacitance value is switched.

Note that the amplitude of the ramp wave of the reference signal $V_{RAMP}$ is originally large on a low analog gain side, and thus, capacitance attenuation is hardly applied. However, there is no problem since quantization noise is large and a noise demand is not as strict as that when the analog gain is high. The effect of capacitance attenuation can be greatly applied on the high analog gain side where there is a strict demand for noise reduction.

Example 4

Figure 19:
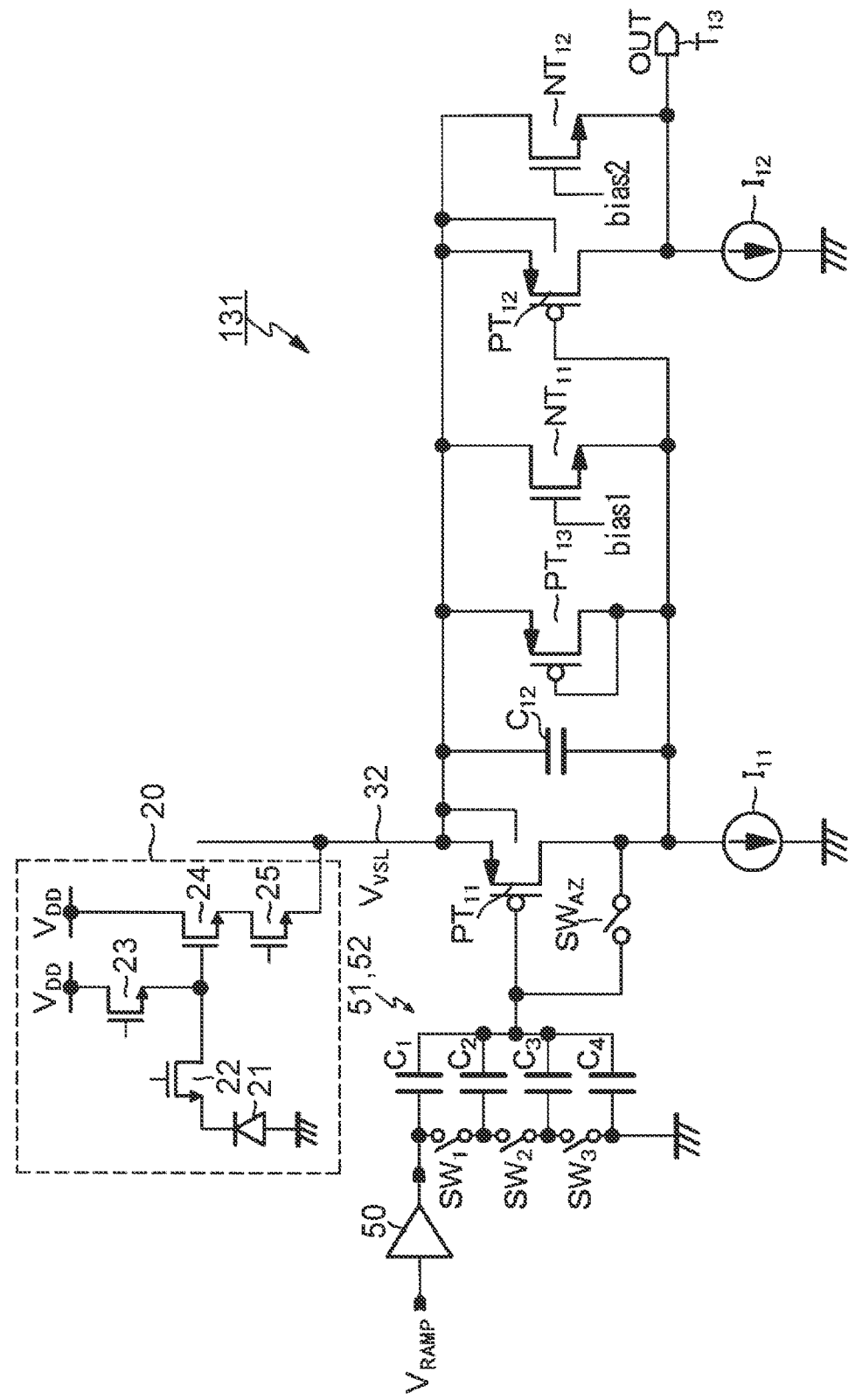
FIG. 19 is a circuit diagram depicting a circuit configuration example of a comparator according to Example 4.

Example 4 is an example in which no switch element is provided on a reference potential node side. FIG. 19 illustrates a circuit configuration example of the comparator 131 according to Example 4.

As depicted in FIG. 19, the comparator 131 according to Example 4 has a configuration in which the first capacitor 51 and the second capacitor 52 include a combination of four capacitance elements $C_1$ to $C_4$ and three switch elements $SW_1$ to $SW_3$. Each of the four capacitance elements $C_1$ to $C_4$ has a first end connected to a gate electrode of the input transistor $PT_{11}$. The three switch elements $SW_1$ to $SW_3$ are connected between second ends of the four capacitance elements $C_1$ to $C_4$.

Specifically, the switch element $SW_1$ is connected between the second end of the capacitance element $C_1$ and the second end of the capacitance element $C_2$. The switch element $SW_2$ is connected between the second end of the capacitance element $C_2$ and the second end of the capacitance element $C_3$. The switch element $SW_3$ is connected between the second end of the capacitance element Ca and the second end of the capacitance element $C_4$. Then, a common connection node between the capacitance element $C_4$ and the switch element $SW_3$ is connected to the reference potential node (for example, ground).

The comparator 131 according to Example 4 having the above-described configuration has the circuit configuration example in which no switch element is provided on the reference potential node side, that is, the circuit configuration example in which the switch element $SW_4$ in the comparator 131 according to Example 2 is omitted. In the case of the circuit configuration example of Example 4, it is difficult to the off (open) state of the switch element $SW_4$ in Example 2, that is, the state in which the capacitance attenuation ratio is 4/4 (no attenuation), but the circuit configuration example may be used when a dynamic range of an analog pixel signal $V_{VSL}$ is relatively small, and the area and control logic for one switch element can be reduced.

Example 5

Figure 20:
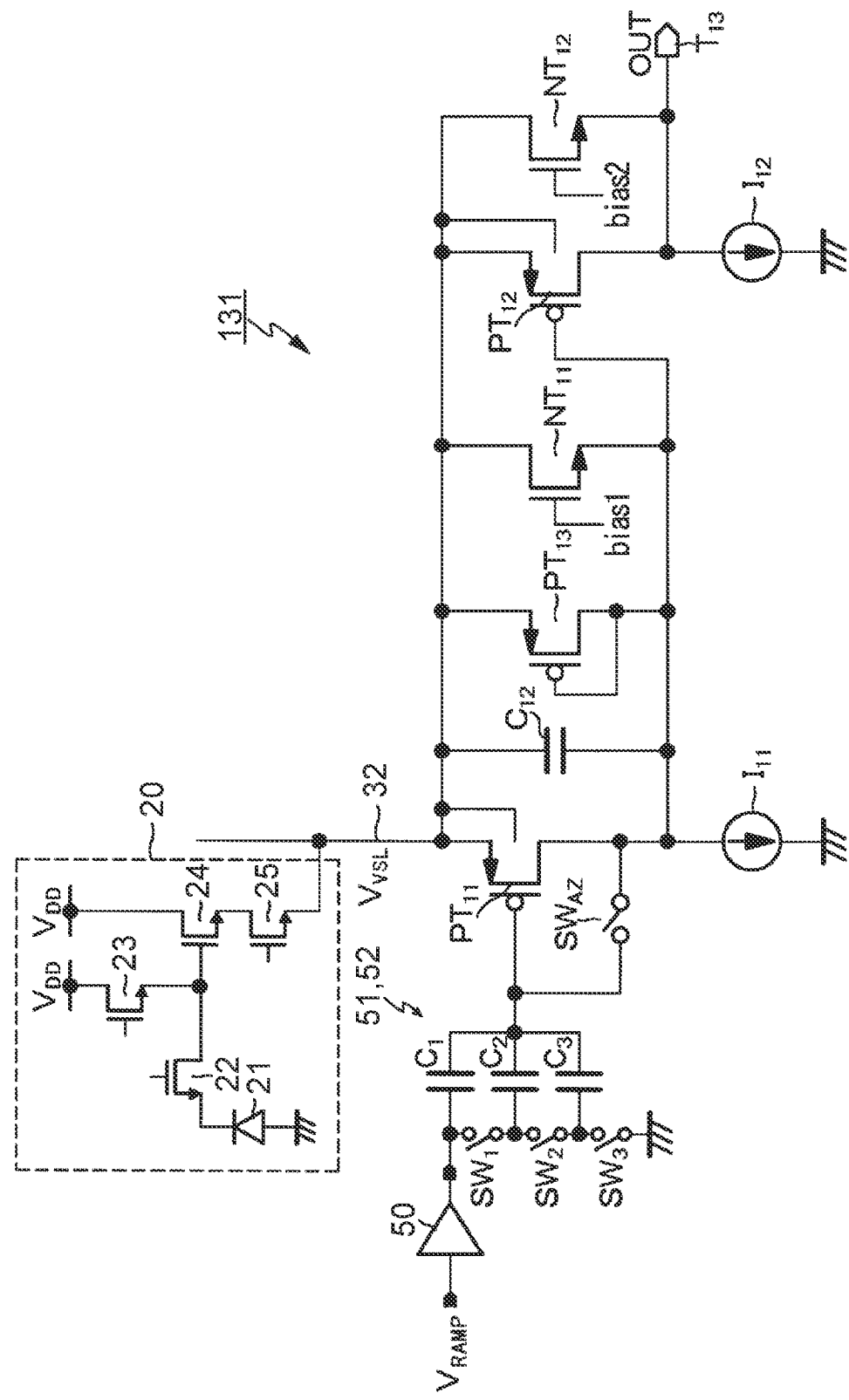
FIG. 20 is a circuit diagram depicting a circuit configuration example of a comparator according to Example 5.

Example 5 is an example of including three capacitance elements and three switch elements. FIG. 20 illustrates a circuit configuration example of the comparator 131 according to Example 5.

As depicted in FIG. 20, the comparator 131 according to Example 5 has a configuration in which the first capacitor 51 and the second capacitor 52 include a combination of three capacitance elements $C_1$ to $C_3$ and three switch elements $SW_1$ to $SW_3$. Each of the three capacitance elements $C_1$ to $C_3$ has a first end connected to a gate electrode of the input transistor $PT_{11}$. The three switch elements $SW_1$ to $SW_3$ are connected between second ends of the three capacitance elements $C_1$ to $C_3$.

Specifically, the switch element $SW_1$ is connected between the second end of the capacitance element $C_1$ and the second end of the capacitance element $C_2$. The switch element $SW_2$ is connected between the second end of the capacitance element $C_2$ and the second end of the capacitance element $C_3$. The switch element $SW_3$ is connected between the second end of the capacitance element $C_3$ and the second end of the capacitance element $C_4$. Furthermore, the switch element $SW_3$ is connected between the reference potential node (for example, ground) and the second end of the capacitance element $C_3$ on the reference potential node side among the three capacitance elements $C_1$ to $C_3$.

In the comparator 131 according to Example 5 having the above-described configuration, when the switch elements SW; and $SW_2$ are turned on (closed) and the switch element $SW_3$ is turned off (open), the capacitance attenuation ratio becomes 3/3 (no attenuation). When the switch elements $SW_1$ and SW; are turned on and the switch element $SW_2$ is turned off, the capacitance attenuation ratio becomes 2/3. When the switch element $SW_1$ is turned off and the switch elements $SW_2$ and $SW_3$ are turned on, the capacitance attenuation ratio becomes 1/3.

Meanwhile, when an input capacitance including the first capacitor 51 and the second capacitor 52 with respect to the reference signal $V_{RAMP}$ is finely divided, a noise step before and after a point of an analog gain for switching a capacitance element becomes small, and noise more smoothly changes with respect to a change in the analog gain. From this viewpoint, it can be said that the comparator 131 according to Example 2 having the four capacitance elements is superior to the comparator 131 according to Example 5 having the three capacitance elements.

On the other hand, when the number of divisions of the input capacitance is made coarse, the number of switch elements decreases, the area decreases, and a unit capacitance increases, so that a gain variation due to mismatch also decreases. Incidentally, if there is a gain variation between pixel columns, this appears as a vertical streak. From this viewpoint, it can be said that the comparator 131 according to Example 5 having the three capacitance elements is superior to the comparator 131 according to Example 2 having the four capacitance elements.

Example 6

Figure 21:
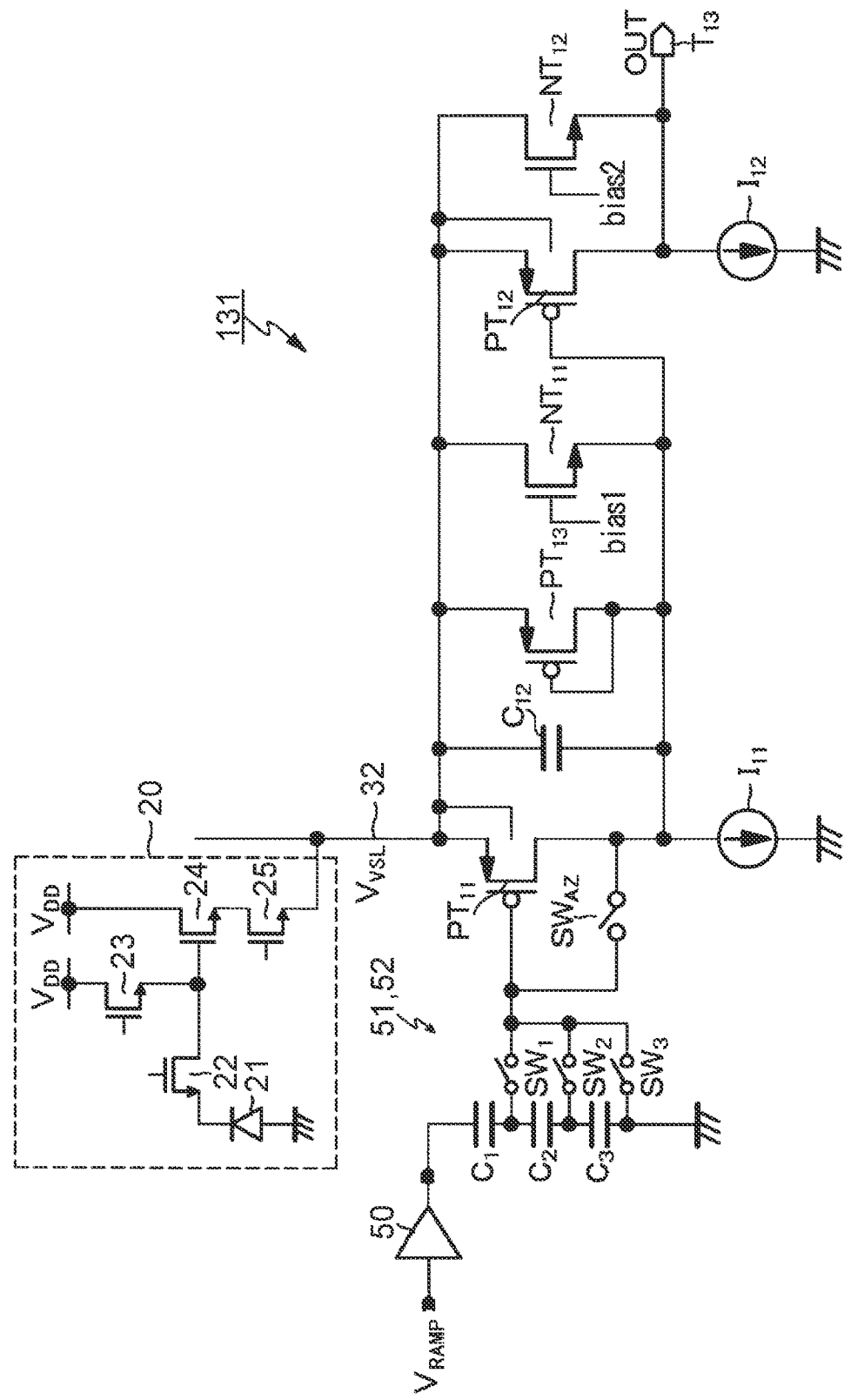
FIG. 21 is a circuit diagram depicting a circuit configuration example of a comparator according to Example 6.

Example 6 is a modified example of Example 5, and is an example in which a connection relationship among capacitance elements and switch elements is different. FIG. 21 illustrates a circuit configuration example of the comparator 131 according to Example 6.

As depicted in FIG. 21, the comparator 131 according to Example 6 has the circuit configuration in which the first capacitor 51 and the second capacitor 52 include a combination of three capacitance elements $C_1$ to $C_3$ and three switch elements $SW_1$ to $SW_3$ and a connection relationship among the capacitance elements C to $C_3$ and the switch elements $SW_1$ to $SW_3$ is different from that in Example 5.

Specifically, the three capacitance elements $C_1$ to Ca are connected in series between an output end of the buffer 50 and a reference potential node (for example, ground). The switch elements $SW_1$ to $SW_3$ have first ends respectively connected to output ends of the capacitance elements $C_1$ to $C_3$, and second ends connected to a gate electrode of the input transistor $PT_{11}$.

In the comparator 131 according to Example 6 having the above-described configuration, an operation of switching a capacitance attenuation ratio is different from that of Example 5. Specifically, when the switch element $SW_1$ is turned on (closed) and the switch elements $SW_2$ and $SW_3$ are turned off (open), the capacitance attenuation ratio becomes 2/3. When the switch element $SW_2$ is turned on and the switch elements $SW_1$ and $SW_3$ are turned off, the capacitance attenuation ratio becomes 1/3.

With the comparator 131 according to Example 6 having the above-described configuration, there is an advantage that a load viewed from the buffer 50 becomes constant, and a difference in response when the capacitance elements $C_1$ to Ca are switched is less likely to be an output error.

Example 7

Figure 22:
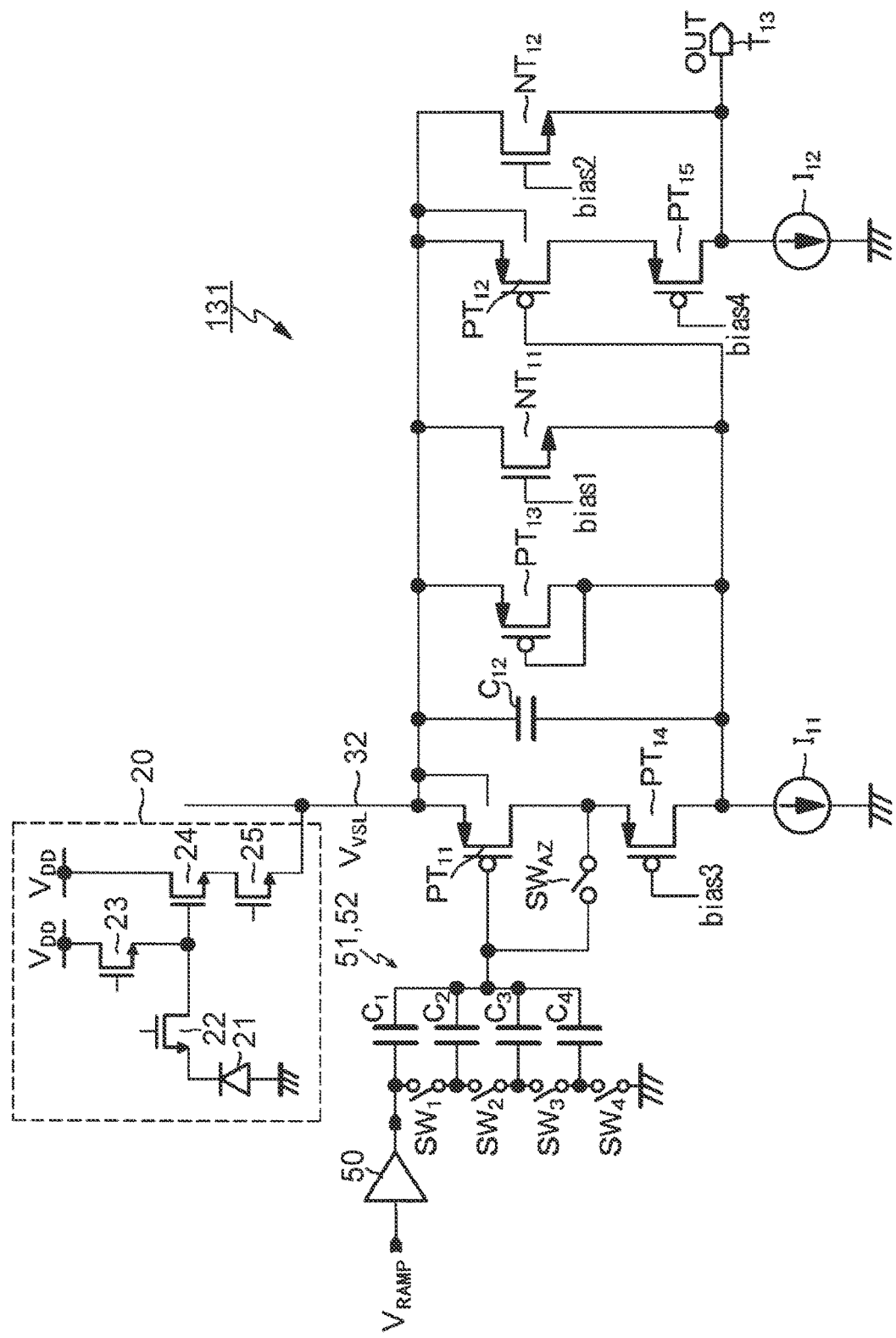
FIG. 22 is a circuit diagram depicting a circuit configuration example of a comparator according to Example 7.

Example 7 is an example in which a circuit configuration of the comparator 131 is different from those of Examples 1 to 6. FIG. 22 illustrates a circuit configuration example of the comparator 131 according to Example 7.

As depicted in FIG. 22, the comparator 131 according to Example 7 has the circuit configuration in which an input-side cascode connection transistor $PT_{14}$ and an output-side cascode connection transistor $PT_{15}$ are further provided. As the input-side cascode connection transistor $PT_{15}$ and the output-side cascode connection transistor $PT_{15}$, for example, P-channel MOS transistors can be used.

The input-side cascode connection transistor $PT_{14}$ is connected between the input transistor $PT_{11}$ and the input-side load current source $I_{11}$. A predetermined bias voltage bias3 is applied to a gate electrode of the input-side cascode connection transistor $PT_{14}$. The output-side cascode connection transistor $PT_{15}$ is connected between an output transistor $PT_{12}$ and an output-side load current source 112. A predetermined bias voltage bias4 is applied to a gate electrode of the output-side cascode connection transistor $PT_{15}$.

With the comparator 131 according to Example 7 having the above-described configuration, the influence of kickback can be reduced by further including the input-side cascode connection transistor $PT_{14}$ and the output-side cascode connection transistor $PT_{15}$, and thus, the interference between pixel columns can be reduced.

Example 8

Figure 23:
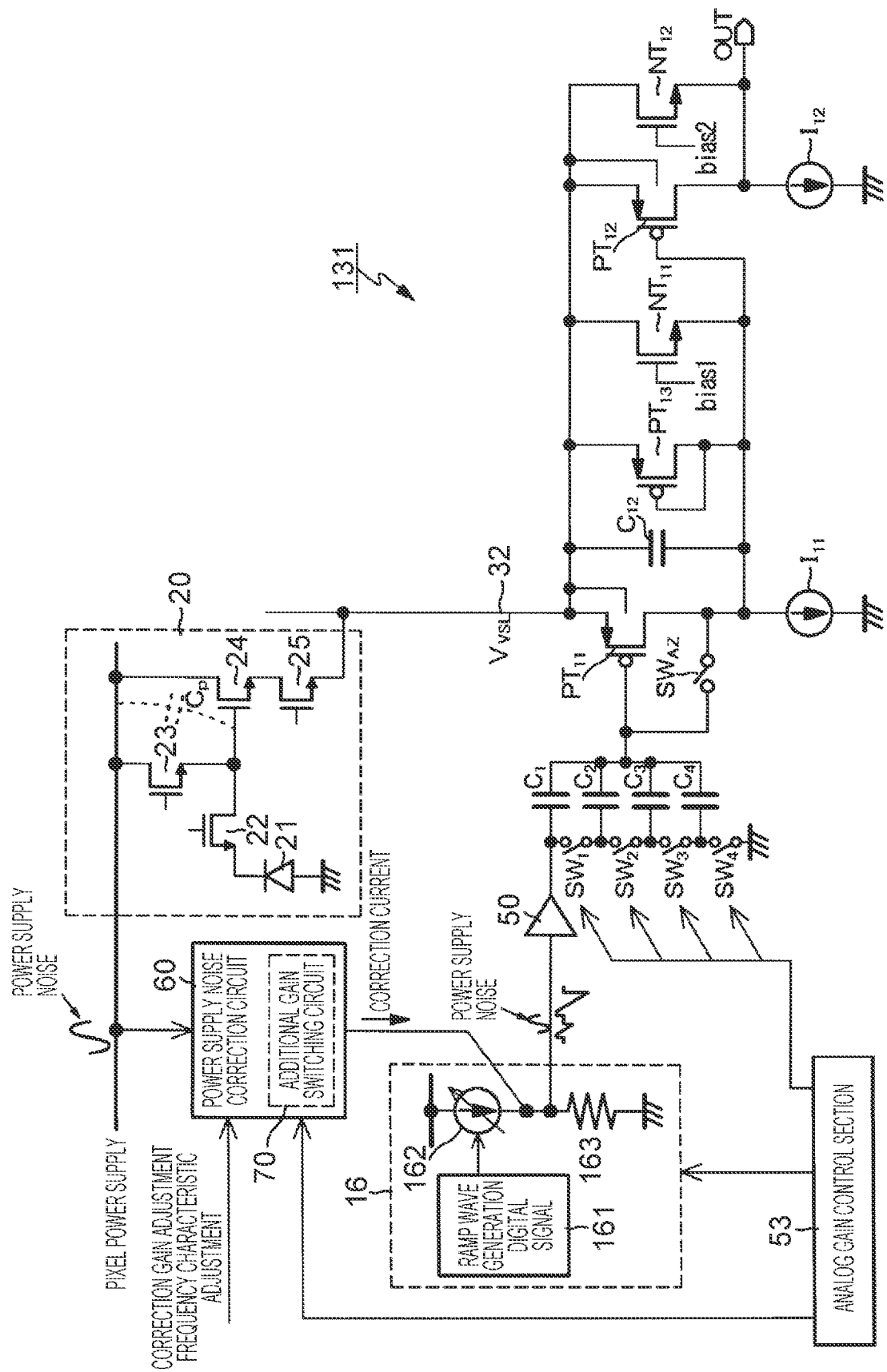
FIG. 23 is a circuit diagram depicting a circuit configuration example of an analog-to-digital converter according to Example 8.

Example 8 is an example of application to a CMOS image sensor having a function of suppressing power supply noise of a pixel power supply. FIG. 23 illustrates a circuit configuration example of the analog-to-digital converter 130 according to Example 8.

In the CMOS image sensor, noise (hereinafter, simply described as "power supply noise" in some cases) of the pixel power supply sometimes rides on the signal line 32, which is an input of the analog-to-digital converter 130, via a parasitic capacitance $C_p$ or the like in the pixel 20. The power supply noise on the signal line 32 is visually recognized as horizontal streak-like noise as an image.

In order to suppress this power supply noise, for example, a power supply noise correction circuit 60 called a PSRR correction circuit is mounted on the CMOS image sensor. Here, a power supply rejection ratio (PSRR) of the PSRR correction circuit is a performance index indicating how much power supply noise can be suppressed.

In a CMOS image sensor using a conventional comparator having a differential amplifier configuration, the power supply noise correction circuit 60 captures power supply noise from a pixel power supply, performs correction gain adjustment and frequency characteristic adjustment according to the power supply noise, and then, conversion into a correction current, and superimposes (adds) the correction current on the reference signal $V_{RAMP}$ of a ramp wave while flowing the correction current into an output resistor (corresponding to an output resistor 163 in FIG. 23) of the reference signal generating section 16 to return to a voltage (correction voltage). Therefore, the power supply noise on the signal line 32 can be canceled by a differential pair of the comparator.

When a power supply noise suppression function in the case of the conventional comparator having the differential amplifier configuration described above is directly applied to the single-slope and ultra-low power consumption analog-to-digital converter 130 including the comparator 131 according to each of Examples 1 to 7, a correction gain adjustment range and the number of correction gain adjustment steps in the power supply noise correction circuit 60 extremely increase in order to cover a change in capacitance attenuation caused by switching of an input capacitance of the comparator 131.

Therefore, in Example 8, when both a slope of the ramp wave of the reference signal $V_{RAMP}$ and the input capacitance of the comparator 131 are switched in analog gain control of the analog-to-digital converter 130, an additional gain provided to the power supply noise correction circuit 60 is switched in conjunction with the switching of the input capacitance. A correction current output from the power supply noise correction circuit 60 is supplied to the reference signal generating section 16.

In the present example, as depicted in FIG. 23, the reference signal generating section 16 has a current-steering digital-to-analog conversion circuit (DAC) configuration including a ramp wave generation digital signal generating section 161, a variable current source 162, and the output resistor 163. Then, the correction current output from the power supply noise correction circuit 60 flows into the output resistor 163 to be converted into a voltage, and is added to the reference signal $V_{RAMP}$ of the ramp wave.

The PSRR gain and a frequency characteristic until the power supply noise reaches the comparator 131 via the pixel 20 and the signal line 32 are adjusted and corrected by an adjustment function for a correction gain and the frequency characteristic originally included in the power supply noise correction circuit 60 that is the PSRR correction circuit. A control register of the correction gain and the frequency characteristic is built in, for example, the logic circuit section 14 of FIG. 4, and adjustment is performed to an optimum value as described later.

If there is a change in the amount of capacitance attenuation caused by the switching of the input capacitance of the comparator 131, it is difficult to cancel the power supply noise riding on the signal line 32 by the comparator 131 as it is. Thus, in the power supply noise correction circuit 60, an additional gain switching circuit 70 performs an operation of compensating for the capacitance attenuation amount in conjunction with the switching of the input capacitance of the comparator 131 under the control of the analog gain control section 53. Specifically, in the additional gain switching circuit 70, the capacitance attenuation amount is compensated by switching a gain of the power supply noise correction circuit 60, more specifically, the additional gain other than the correction gain originally held by the power supply noise correction circuit 60 in conjunction with the switching of the input capacitance of the comparator 131 (that is, in conjunction with switching of the capacitance value of each of the first capacitor 51 and the second capacitor 52).

In this manner, it is possible to compensate for the capacitance attenuation amount by switching the additional gain provided to the power supply noise correction circuit 60 in conjunction with the switching of the input capacitance of the comparator 131, and thus, it is possible to suppress the power supply noise riding on the signal line 32 while absorbing the influence of the switching of the input capacitance of the comparator 131.

Hereinafter, specific operation examples of switching of the input capacitance and the gain control of the comparator 131 will be described.

Operation Example 1

Figure 24:
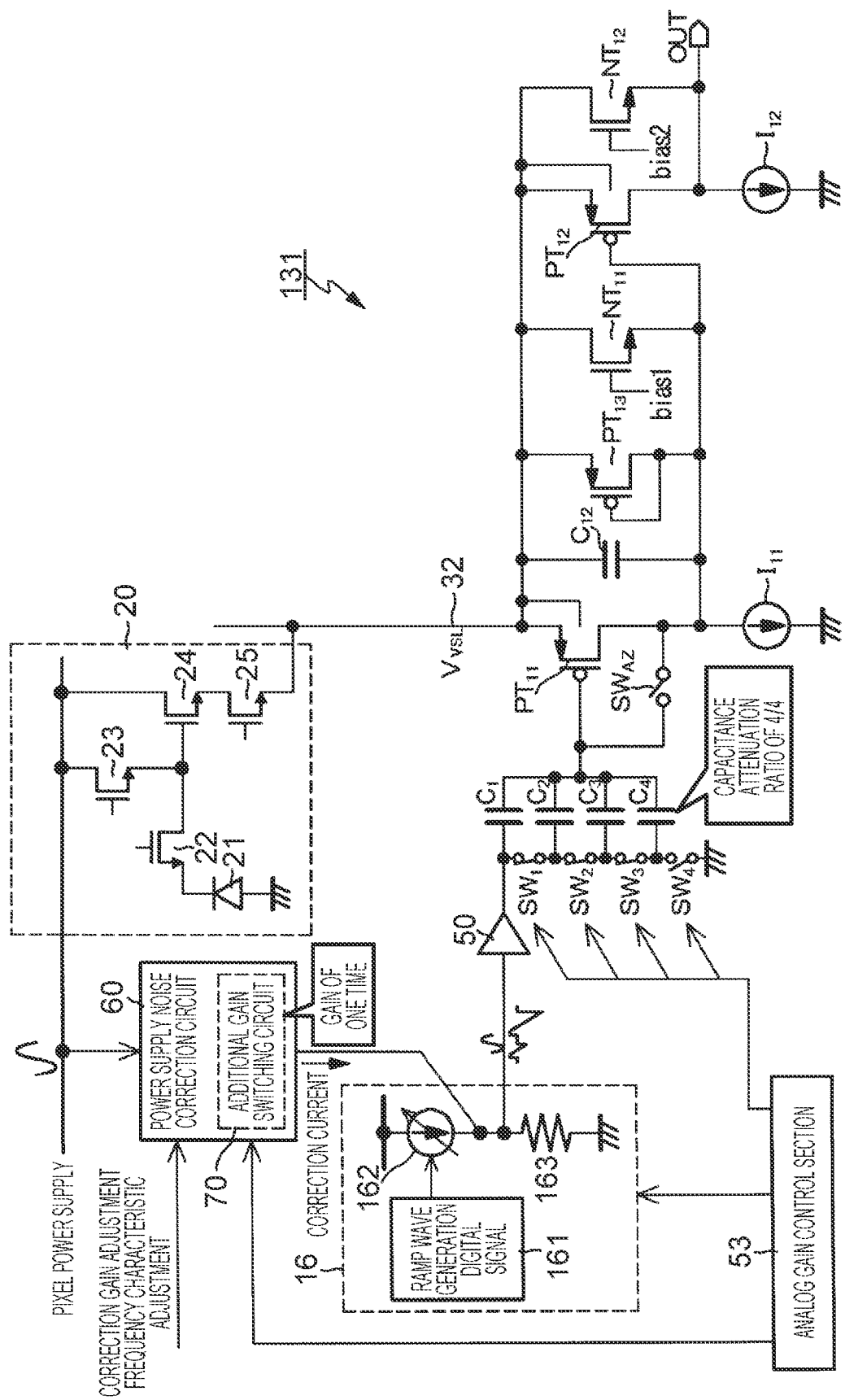
FIG. 24 is an operation explanatory diagram of Operation Example 1 of Example 8.

Operation Example 1 is an operation example in a case where a capacitance attenuation ratio is 4/4 (no attenuation). FIG. 24 illustrates an operation explanatory diagram of Operation Example 1.

The case where the capacitance attenuation ratio is 4/4 corresponds to Specific Example 1 of Example 2, and only the switch element $SW_4$ connected between the second end of the capacitance element Ca and the reference potential node among the four switch elements $SW_1$ to $SW_4$ is set to an off state, and the remaining three switch elements $SW_1$ to $SW_3$ are set to an on state. In this case, there is no attenuation, and thus, a gain of one time is set in the additional gain switching circuit 70 of the power supply noise correction circuit 60 under the control of the analog gain control section 53.

Operation Example 2

Figure 25:
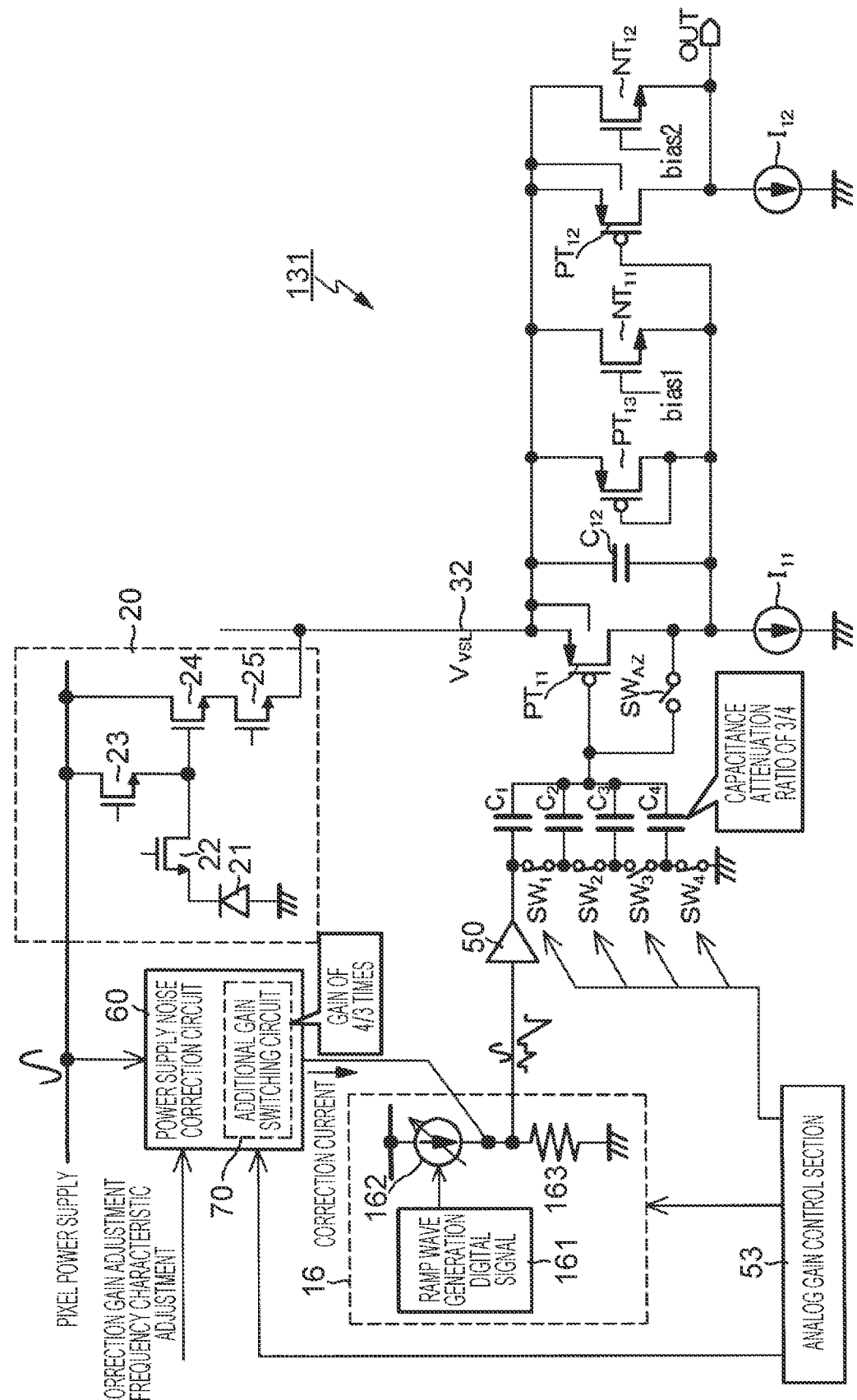
FIG. 25 is an operation explanatory diagram of Operation Example 2 of Example 8.

Operation Example 2 is an operation example in a case where the capacitance attenuation ratio is 3/4. FIG. 25 illustrates an operation explanatory diagram of Operation Example 2.

The case where the capacitance attenuation ratio is 3/4 corresponds to Specific Example 2 of Example 2, and only the switch element $SW_3$ among the four switch elements $SW_1$ to $SW_4$ is set to an off state, and the remaining three switch elements $SW_1$, $SW_2$, and $SW_4$ are set to an on state. In this case, a gain of 4/3 corresponding to the capacitance attenuation ratio of 3/4 is set in the additional gain switching circuit 70 of the power supply noise correction circuit 60 under the control of the analog gain control section 53. Therefore, it is possible to suppress the power supply noise riding on the signal line 32 while absorbing the influence of switching of the input capacitance of the comparator 131.

Operation Example 3

Figure 26:
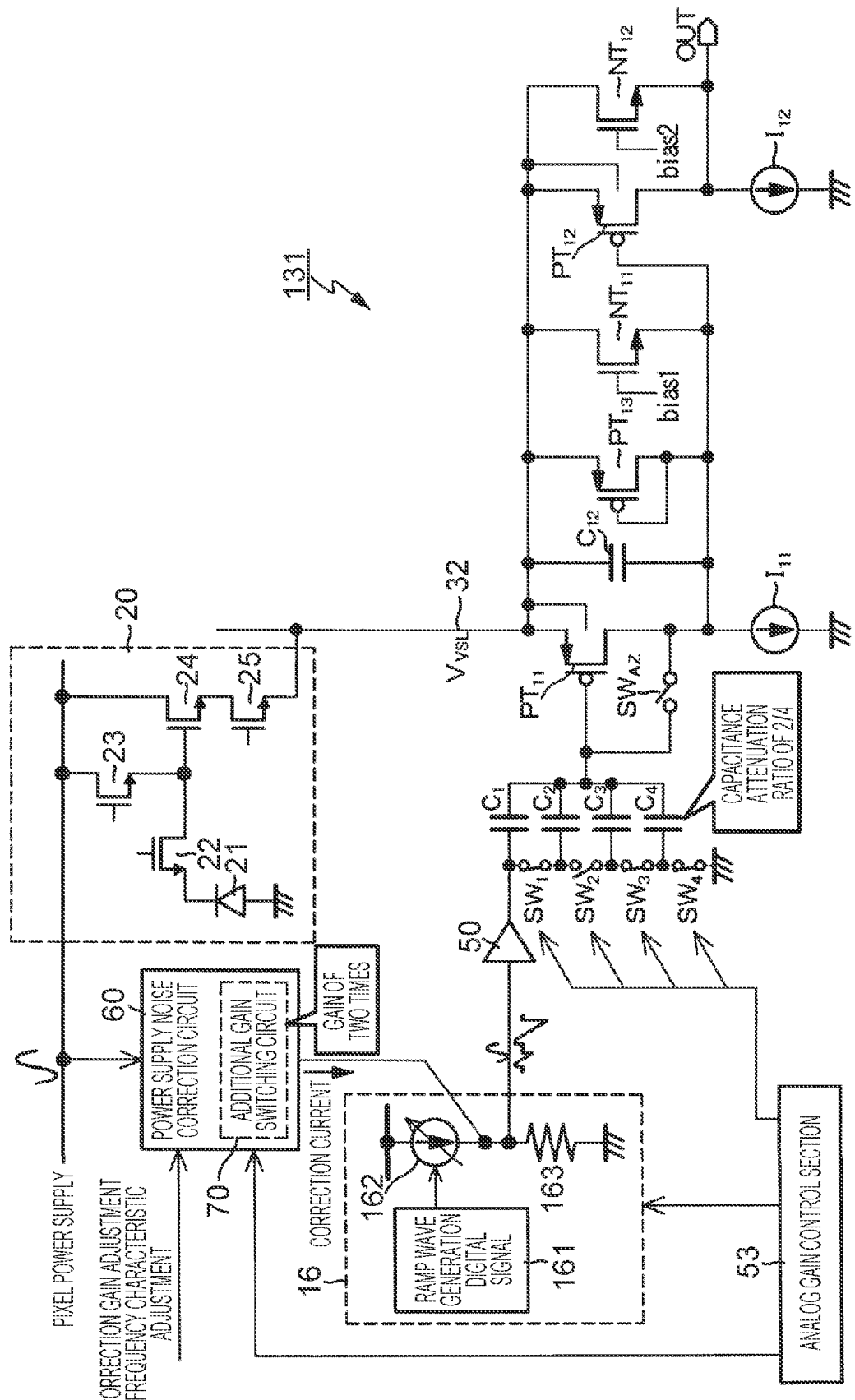
FIG. 26 is an operation explanatory diagram of Operation Example 3 of Example 8.

Operation Example 3 is an operation example in a case where the capacitance attenuation ratio is 2/4. FIG. 26 illustrates an operation explanatory diagram of Operation Example 3.

The case where the capacitance attenuation ratio is 2/4 corresponds to Specific Example 3 of Example 2, and only the switch element $SW_2$ among the four switch elements $SW_1$ to $SW_4$ is set to an off state, and the remaining three switch elements $SW_1$, $SW_3$, and $SW_4$ are set to an on state. In this case, the additional gain switching circuit 70 of the power supply noise correction circuit 60 sets a gain of two times corresponding to the capacitance attenuation ratio of 2/4 under the control of the analog gain control section 53. Therefore, it is possible to suppress the power supply noise riding on the signal line 32 while absorbing the influence of switching of the input capacitance of the comparator 131.

Operation Example 4

Figure 27:
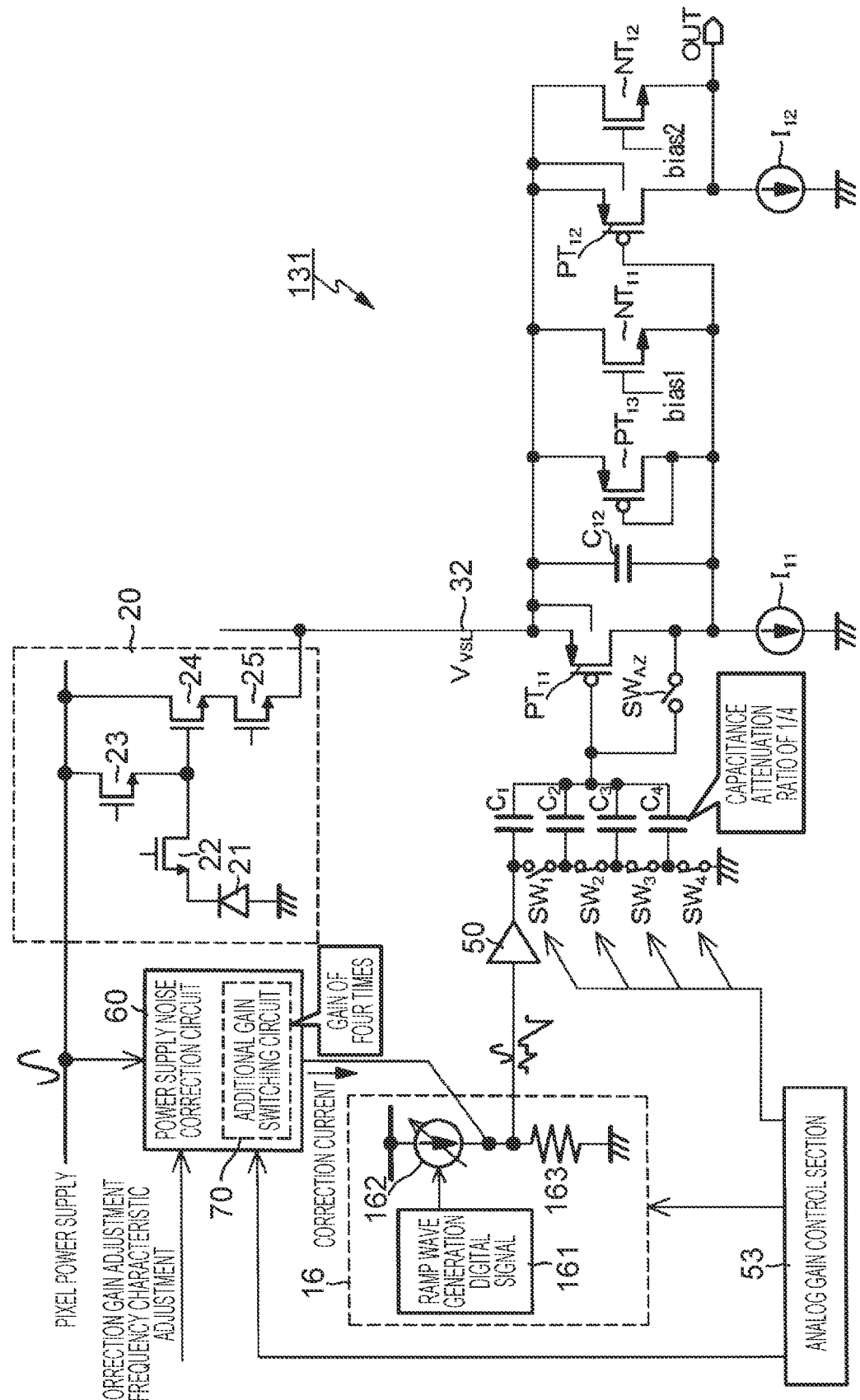
FIG. 27 is an operation explanatory diagram of Operation Example 4 of Example 8.

Operation Example 4 is an operation example in a case where the capacitance attenuation ratio is 1/4. FIG. 27 illustrates an operation explanatory diagram of Operation Example 4.

The case where the capacitance attenuation ratio is 1/4 corresponds to Specific Example 4 of Example 2, and only the switch element $SW_1$ connected to the output end of the buffer 50 among the four switch elements $SW_1$ to $SW_4$ is set to an off state, and the remaining three switch elements $SW_2$ to $SW_4$ are set to an on state. In this case, the additional gain switching circuit 70 of the power supply noise correction circuit 60 sets a gain of four times corresponding to the capacitance attenuation ratio of 1/4 under the control of the analog gain control section 53. Therefore, it is possible to suppress the power supply noise riding on the signal line 32 while absorbing the influence of switching of the input capacitance of the comparator 131.

Figure 28:
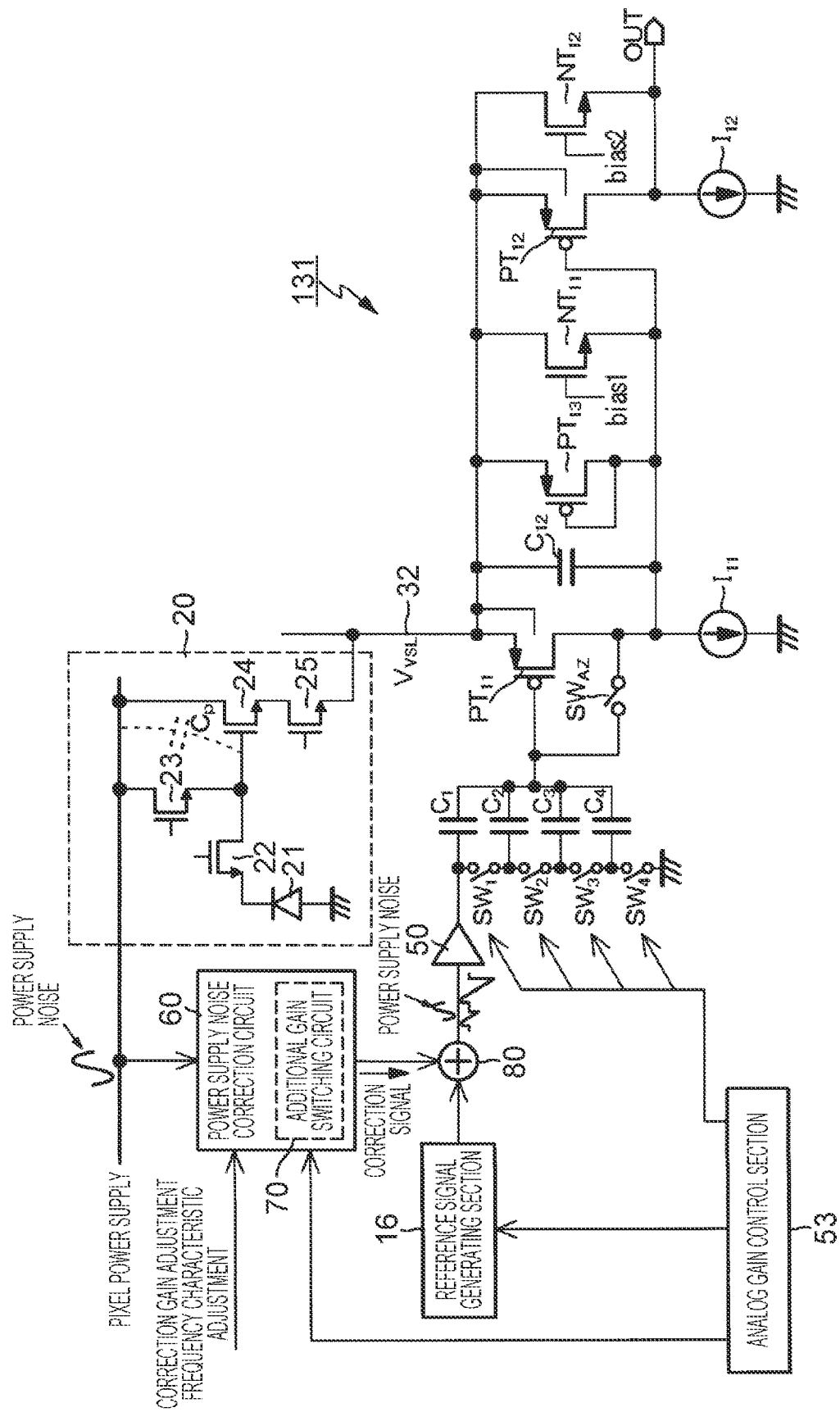
FIG. 28 is a circuit diagram depicting another circuit configuration of a reference signal generating section.

Note that the reference signal generating section 16 is not limited to the current-steering digital-to-analog conversion circuit (DAC) configuration including the variable current source 162 and the output resistor 163. For example, as depicted in FIG. 28, it is also possible to adopt a circuit configuration in which an adder 80 is provided and a correction current output from the power supply noise correction circuit 60 is added to the reference signal $V_{RAMP}$ of a ramp wave generated by the reference signal generating section 16.

Example 9

Figure 29:
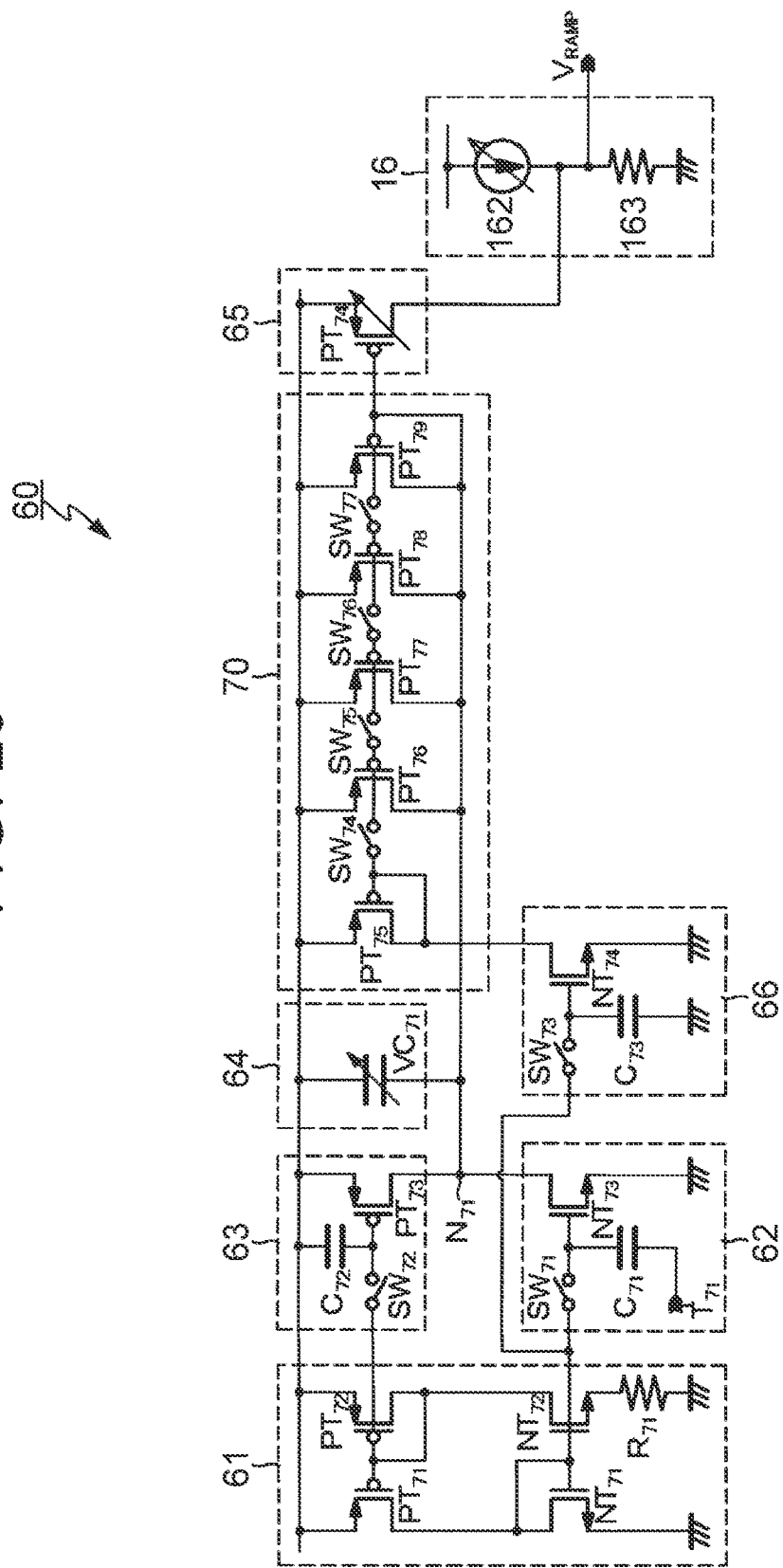
FIG. 29 is a circuit diagram depicting a circuit configuration example of a power supply noise correction circuit according to Example 9.

Example 9 is a circuit configuration example of the power supply noise correction circuit 60. FIG. 29 illustrates an exemplary circuit configuration of the power supply noise correction circuit 60 according to Example 9.

As depicted in FIG. 29, the power supply noise correction circuit 60 includes the additional gain switching circuit 70 in addition to a conductance-fixed bias section 61, an input sensing section 62, a first bias section 63, a frequency characteristic adjustment section 64, a correction gain adjustment section 65, and a second bias section 66.

The conductance-fixed bias section 61 includes two P-channel MOS transistors $PT_7$ and $PT_{72}$ having gate electrodes connected in common, two N-channel MOS transistors $NT_{71}$ and $NT_{72}$ having gate electrodes connected in common, and a resistance element Rn. Both the P-channel MOS transistor $PT_{72}$ and the N-channel MOS transistor $NT_{71}$ have a diode-connected configuration in which a gate electrode and a drain electrode are short-circuited.

The P-channel MOS transistor $PT_7$ and the N-channel MOS transistor $NT_{71}$ are connected in series between a high-potential-side power supply and a low-potential-side power supply (for example, ground). The P-channel MOS transistor $PT_{72}$, the N-channel MOS transistor $NT_{72}$, and the resistance element $R_{71}$ are connected in series between the high-potential-side power supply and the low-potential-side power supply.

The input sensing section 62 includes a switch element $SW_{71}$, a capacitance element $C_{71}$, and an N-channel MOS transistor $NT_{73}$. The switch element $SW_7$ has a first end connected to a gate electrode of each of the N-channel MOS transistors NT and $NT_{72}$ of the conductance-fixed bias section 61 and a second end connected to a gate electrode of the N-channel MOS transistor $NT_{73}$. The capacitance element $C_{71}$ is connected between a power supply terminal $T_{71}$ connected to the pixel power supply and the gate electrode of the N-channel MOS transistor $NT_{73}$.

The first bias section 63 includes a switch element $SW_{72}$, a capacitance element $C_{72}$, and a P-channel MOS transistor $PT_{73}$. The switch element $SW_{72}$ has a first end connected to the gate electrode of each of the P-channel MOS transistors $PT_{71}$ and $PT_{72}$ of the conductance-fixed bias section 61 and the second end connected to a gate electrode of the P-channel MOS transistor $PT_{73}$. The capacitance element $C_{72}$ is connected between the high-potential-side power supply and the gate electrode of the P-channel MOS transistor $PT_{73}$.

The P-channel MOS transistor $PT_{73}$ of the first bias section 63 and the N-channel MOS transistor $NT_{73}$ of the input sensing section 62 are connected in series between the high-potential-side power supply and the low-potential-side power supply. Here, a drain common connection node of the P-channel MOS transistor $PT_{73}$ and the N-channel MOS transistor $NT_{73}$ is defined as a node $N_{71}$.

The frequency characteristic adjustment section 64 includes a variable capacitance element $VC_{71}$ that has a variable capacitance value and is connected between the high-potential-side power supply and the node Nm, that is, connected in parallel to the P-channel MOS transistor $PT_{73}$ of the first bias section 63. The frequency characteristic adjustment section 64 is configured to be capable of adjusting a frequency characteristic by adjusting the capacitance value of the variable capacitance element $VC_{71}$.

The correction gain adjustment section 65 includes a P-channel MOS transistor $PT_{74}$ whose size is adjustable. Here, the size of the P-channel MOS transistor $PT_{74}$ whose size is adjustable can be adjusted, for example, by changing the number of MOS transistors connected in parallel. Then, the correction gain adjustment section 65 can adjust a correction gain by adjusting the size of the P-channel MOS transistor $PT_{74}$.

The second bias section 66 includes a switch element $SW_{73}$, a capacitance element $C_{73}$, and an N-channel MOS transistor $NT_{74}$. The switch element $SW_{73}$ has a first end connected to a gate electrode of each of the N-channel MOS transistors $NT_7$ and $NT_{72}$ of the conductance-fixed bias section 61 and a second end connected to a gate electrode of the N-channel MOS transistor $NT_{74}$. The capacitance element $C_{73}$ is connected between the gate electrode of the N-channel MOS transistor $NT_{74}$ and the low-potential-side power supply.

The additional gain switching circuit 70 includes five P-channel MOS transistors $PT_{75}$ to $PT_{79}$ and four switch elements $SW_{74}$ to $SW_{77}$. The P-channel MOS transistor $PT_{75}$ has a diode-connected configuration in which a gate electrode and a drain electrode are connected, and is directly connected to the N-channel MOS transistor $NT_{74}$ of the second bias section 66 between the high-potential-side power supply and the low-potential-side power supply.

The switch element $SW_{74}$ is connected between the gate electrodes of the P-channel MOS transistor $PT_{75}$ and the P-channel MOS transistor $PT_{76}$. The switch element $SW_{75}$ is connected between the gate electrodes of the P-channel MOS transistor $PT_{76}$ and the P-channel MOS transistor $PT_{77}$. The switch element $SW_{76}$ is connected between the gate electrodes of the P-channel MOS transistor $PT_{77}$ and the P-channel MOS transistor $PT_{78}$. The switch element $SW_{77}$ is connected between the gate electrodes of the P-channel MOS transistor $PT_{78}$ and the P-channel MOS transistor $PT_{79}$.

As described above, the P-channel MOS transistor $PT_{75}$ and the P-channel MOS transistors $PT_{76}$ to $PT_{79}$ form a current mirror circuit. The P-channel MOS transistor $PT_{75}$ is a transistor of an injection current source, and the P-channel MOS transistor $PT_{79}$ is a transistor of an output stage mirror source.

The four switch elements $SW_{74}$ to $SW_{77}$ are additional gain switching switches, and are controlled to be on (closed)/off (open) by a switch control signal from the analog gain control section 53 (see FIG. 23), and the number of parallel transistors of the injection current source and the number of parallel transistors of the output stage mirror source are changed according to an analog gain.

In the power supply noise correction circuit 60 having the above-described circuit configuration, the power supply noise of the pixel power supply input from the power supply terminal Tri via the capacitance element Cn is converted into a current signal in the input sensing section 62, and the current signal with a frequency characteristic adjusted by the frequency characteristic adjustment section 64 flows into the additional gain switching circuit 70. This current is also added with a constant bias current for operating the circuit. Then, in the additional gain switching circuit 70, a current, obtained by subtracting a current flowing to the injection current source from the current flowing through the frequency characteristic adjustment section 64, flows to the output stage mirror source.

Note that the circuit configuration of the power supply noise correction circuit 60 and the circuit configuration of the additional gain switching circuit 70 illustrated herein are merely examples, and the present invention is not limited to these circuit configurations. For example, the number of transistors and switching elements of the additional gain switching circuit 70 is not limited to that in FIG. 29, and thus, the number of switching stages and the magnitude of the additional gain are not limited thereto.

Hereinafter, specific gain control examples by the additional gain switching circuit 70 of the power supply noise correction circuit 60 will be described.

Gain Control Example 1

Figure 30:
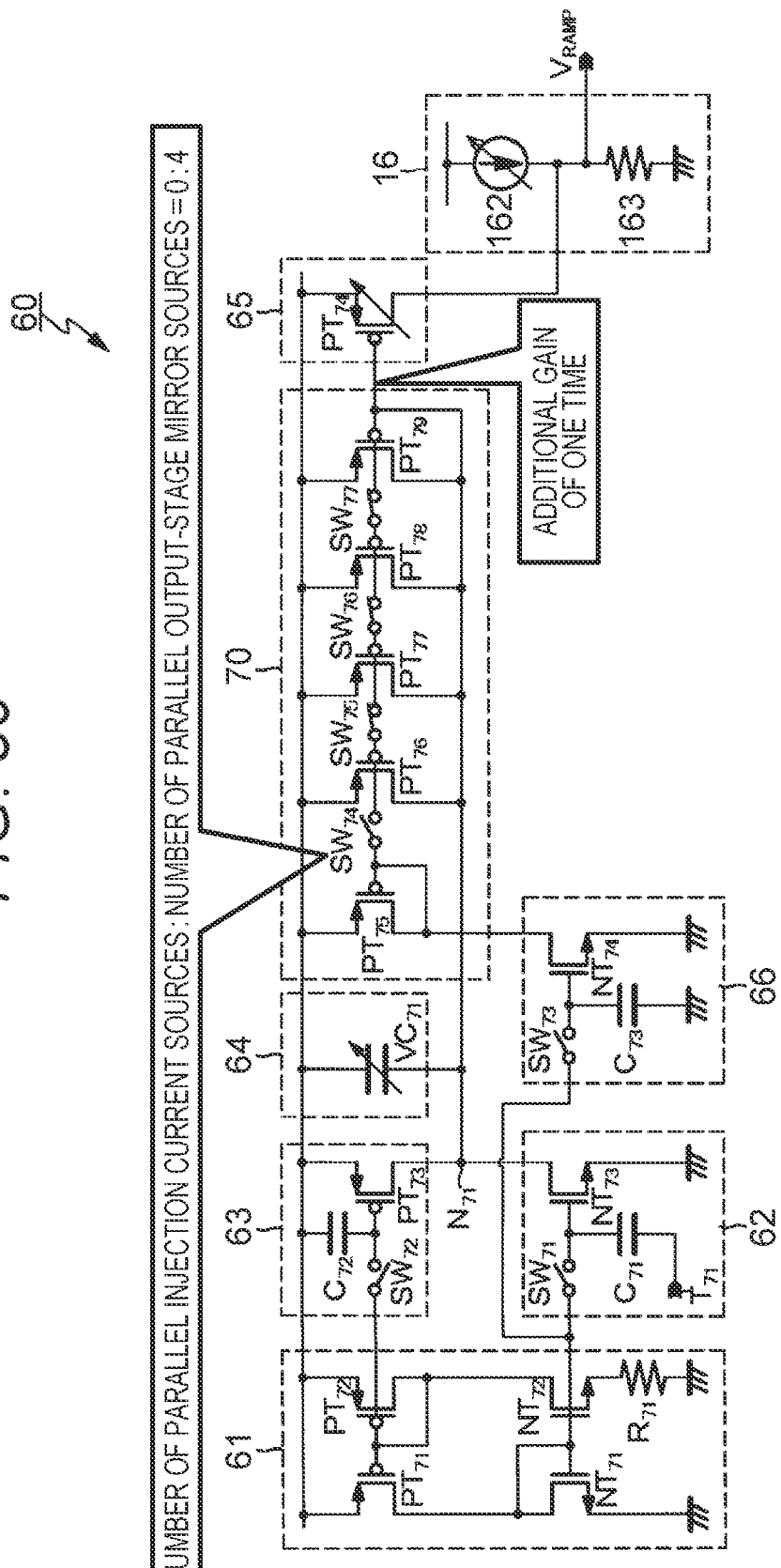
FIG. 30 is an operation explanatory diagram of Gain Control Example 1 of Example 9.

Gain Control Example 1 is a control example when the additional gain is one time. FIG. 30 illustrates an operation explanatory diagram of Gain Control Example 1.

When the additional gain is one time, it is assumed that the number of parallel transistors of the injection current source is zero, and the number of parallel transistors of the output stage mirror source is four. Specifically, it is assumed that, among the four switch elements $SW_{74}$ to $SW_{77}$, the switch element $SW_{74}$ is in an off state, and the remaining three switch elements $SW_{75}$, $SW_{76}$, and $SW_{77}$ are in an on state.

Gain Control Example 2

Figure 31:
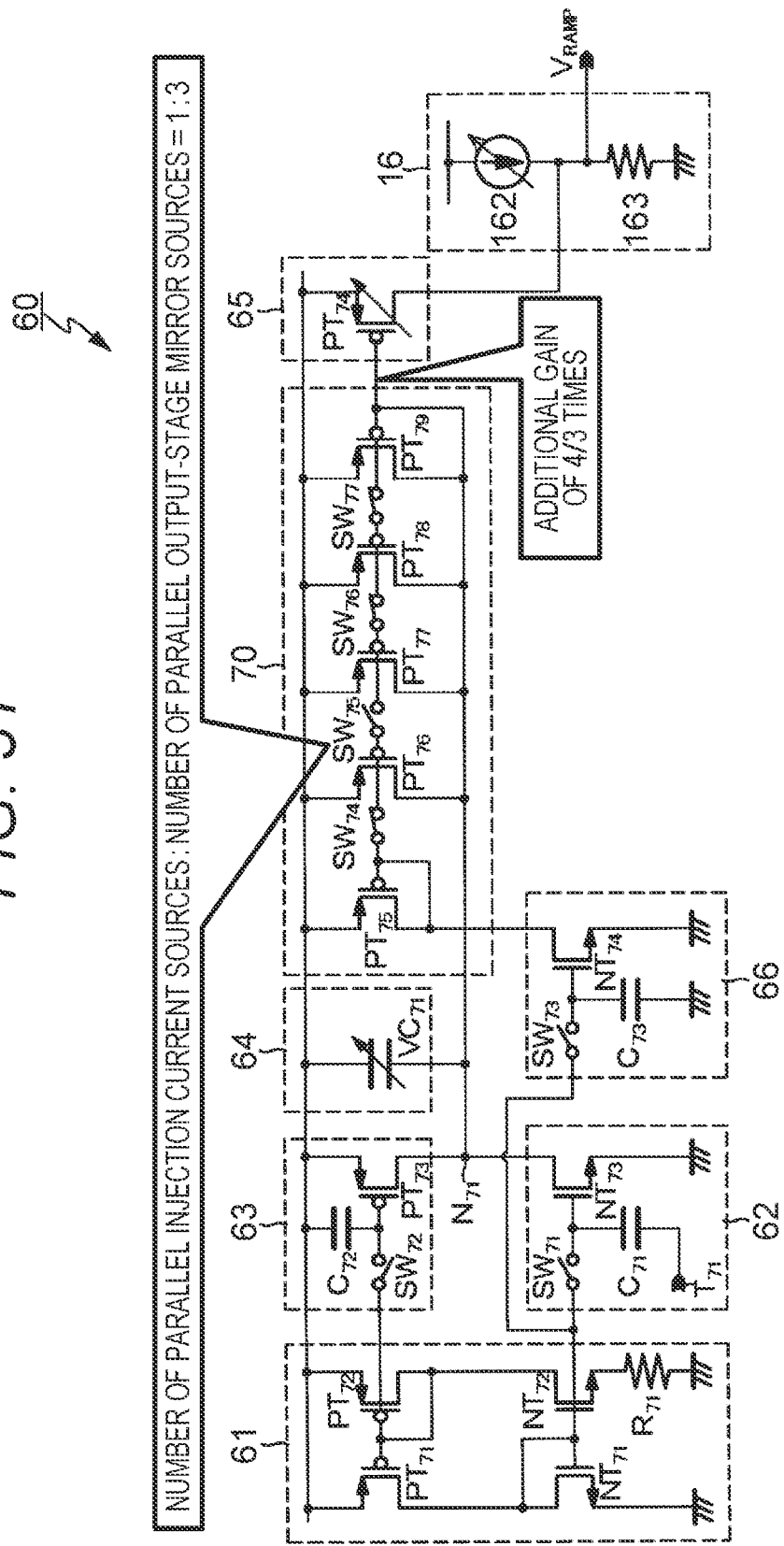
FIG. 31 is an operation explanatory diagram of Gain Control Example 2 of Example 9.

Gain Control Example 2 is a control example when the additional gain is 4/3 times. FIG. 31 illustrates an operation explanatory diagram of Gain Control Example 2.

When the additional gain is 4/3 times, it is assumed that the number of parallel transistors of the injection current source is one, and the number of parallel transistors of the output stage mirror source is three. Specifically, it is assumed that, among the four switch elements $SW_{74}$ to $SW_{77}$, the switch element $SW_{75}$ is in an off state, and the remaining three switch elements $SW_{74}$, $SW_{76}$, and $SW_{77}$ are in an on state.

Gain Control Example 3

Figure 32:
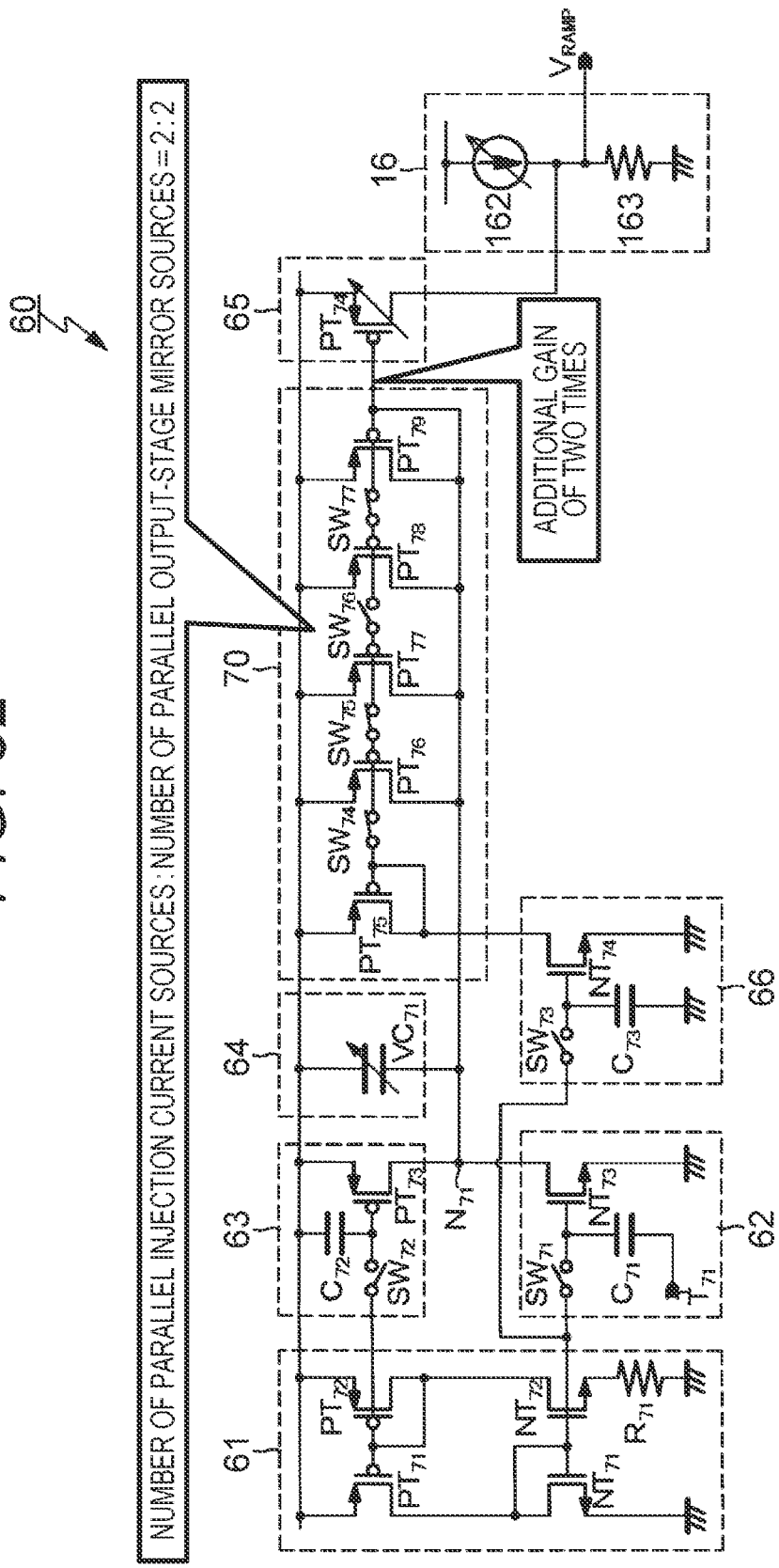
FIG. 32 is an operation explanatory diagram of Gain Control Example 3 of Example 9.

Gain Control Example 3 is a control example when the additional gain is two times. FIG. 32 illustrates an operation explanatory diagram of Gain Control Example 3.

When the additional gain is two time, it is assumed that the number of parallel transistors of the injection current source is two, and the number of parallel transistors of the output stage mirror source is two. Specifically, it is assumed that, among the four switch elements $SW_{74}$ to $SW_{77}$, the switch element $SW_{76}$ is in an off state, and the remaining three switch elements $SW_{74}$, $SW_{75}$, and $SW_{77}$ are in an on state.

Gain Control Example 4

Figure 33:
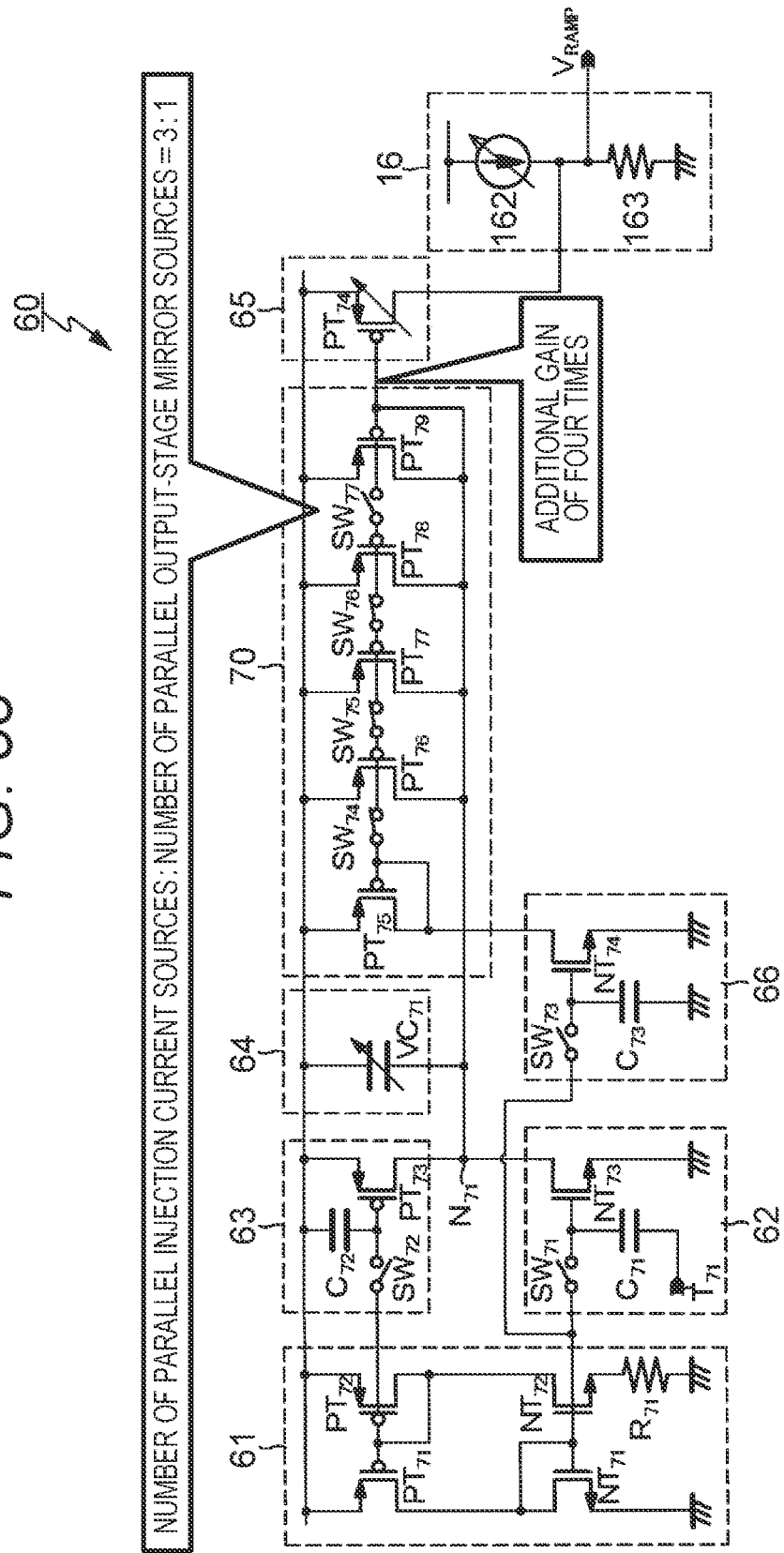
FIG. 33 is an operation explanatory diagram of Gain Control Example 4 of Example 9.

Gain Control Example 4 is a control example when the additional gain is four times. FIG. 33 illustrates an operation explanatory diagram of Gain Control Example 4.

When the additional gain is four time, it is assumed that the number of parallel transistors of the injection current source is three, and the number of parallel transistors of the output stage mirror source is one. Specifically, it is assumed that, among the four switch elements $SW_{74}$ to $SW_{77}$, the switch element $SW_{77}$ is in an off state, and the remaining three switch elements $SW_{74}$, $SW_{75}$, and $SW_{76}$ are in an on state.

As described above, for example, assuming that the number of parallel transistors of the injection current source is three and the number of parallel transistors of the output stage mirror source is one, the additional gain of four times is achieved. The reason thereof is as follows.

First, a bias current flowing to the output stage mirror source becomes 1/4 by changing the number of parallel transistors of the injection current source and the number of parallel transistors of the output stage mirror source. On the other hand, all noise components of the pixel power supply converted into the current signal flow to the output stage mirror source, and thus, the amount thereof remains unchanged. At this time, a transconductance $g_m$ of the output stage mirror source is 1/4 similarly to the parallel number.

In the output stage mirror source, the flowing current is converted into a gate voltage at a ratio of $1/g_m$. Therefore, the gate voltage of the output stage mirror source remains unchanged as a bias component, but a power supply noise component riding thereon becomes four times the original. This is converted into a current again by an output stage current source and output.

Example 10

Figure 34:
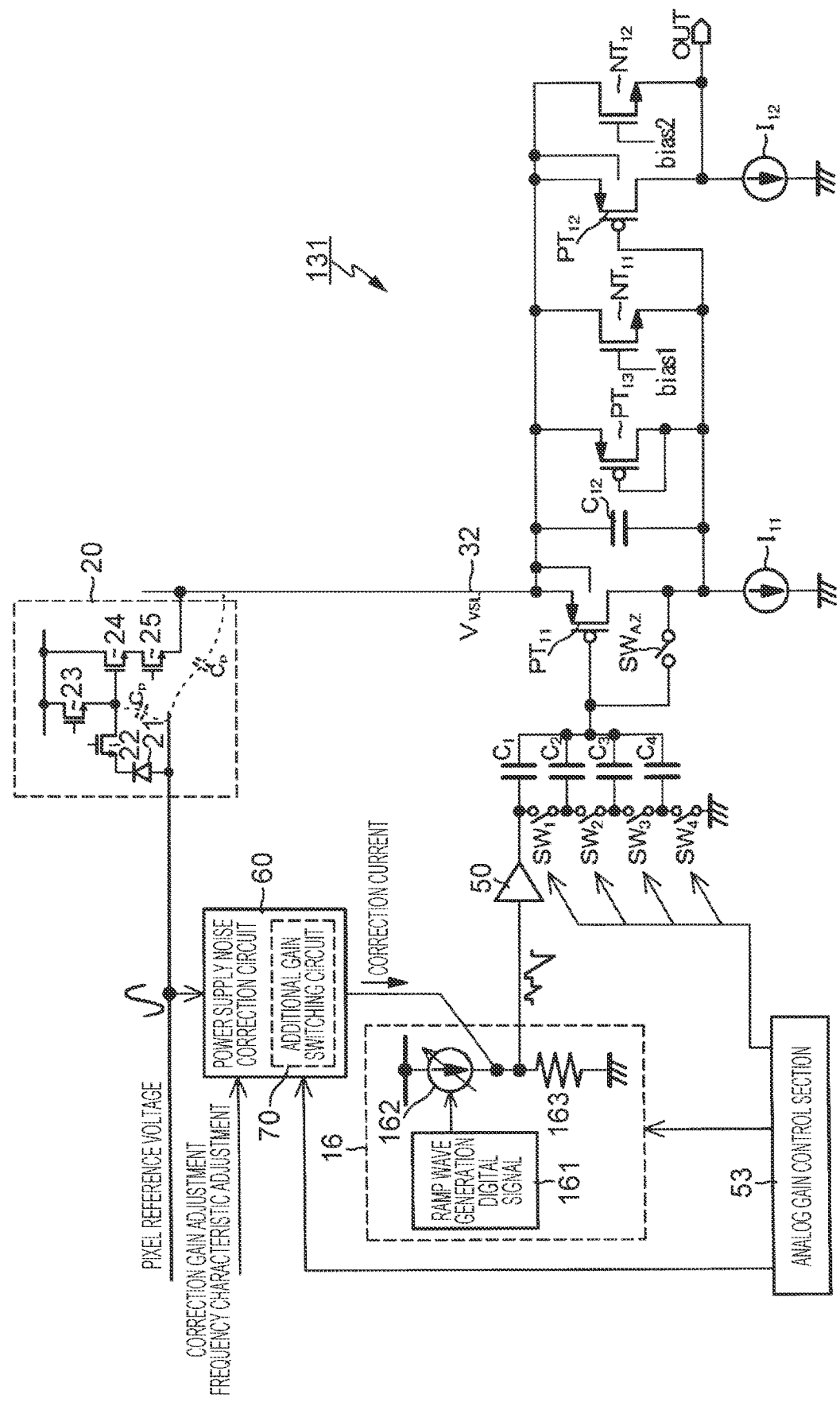
FIG. 34 is a circuit diagram depicting a circuit configuration example of an analog-to-digital converter according to Example 10.

Example 10 is a modified example of Example 8, and is an example of application to a MOS image sensor using a reference voltage in the pixel 20. FIG. 34 illustrates a circuit configuration example of the analog-to-digital converter 130 according to Example 10.

Example 8 is the example in which the noise of the pixel power supply is suppressed. In addition to the noise of the pixel power supply, in a case where a reference voltage is used in the pixel 20, noise riding on the reference voltage may ride on the signal line 32 via the parasitic capacitance $C_p$ or the like in the pixel 20 depicted in FIG. 34. Even in this case, the noise on the signal line 32 is visually recognized as horizontal streak-like noise as an image similarly to the case of the power supply noise. The reference voltage is applied to, for example, an anode electrode of a photodiode 21.

Therefore, in the analog-to-digital converter 130 according to Example 10, the reference voltage of the pixel 20 is monitored by the power supply noise correction circuit 60 in order to suppress the noise caused by the reference voltage in the pixel 20. Here, a noise correction circuit that suppresses noise on the reference voltage is referred to as the power supply noise correction circuit 60 for convenience. Configurations, operations, and the like of the power supply noise correction circuit 60 and the additional gain switching circuit 70 incorporated therein are the same as and overlap those in the cases of Example 8 and Example 9, and thus, the description thereof will be omitted here.

Also in the case of the analog-to-digital converter 130 according to Example 10, an additional gain provided to the power supply noise correction circuit 60 is switched in conjunction with switching of an input capacitance of the comparator 131 according to the same principle as the analog-to-digital converter 130 according to Example 8. Therefore, it is possible to compensate for a capacitance attenuation amount accompanying the switching of the input capacitance of the comparator 131, and thus, it is possible to suppress noise riding on the reference voltage of the pixel 20 while absorbing the influence of the switching of the input capacitance of the comparator 131.

Example 11

Figure 35:
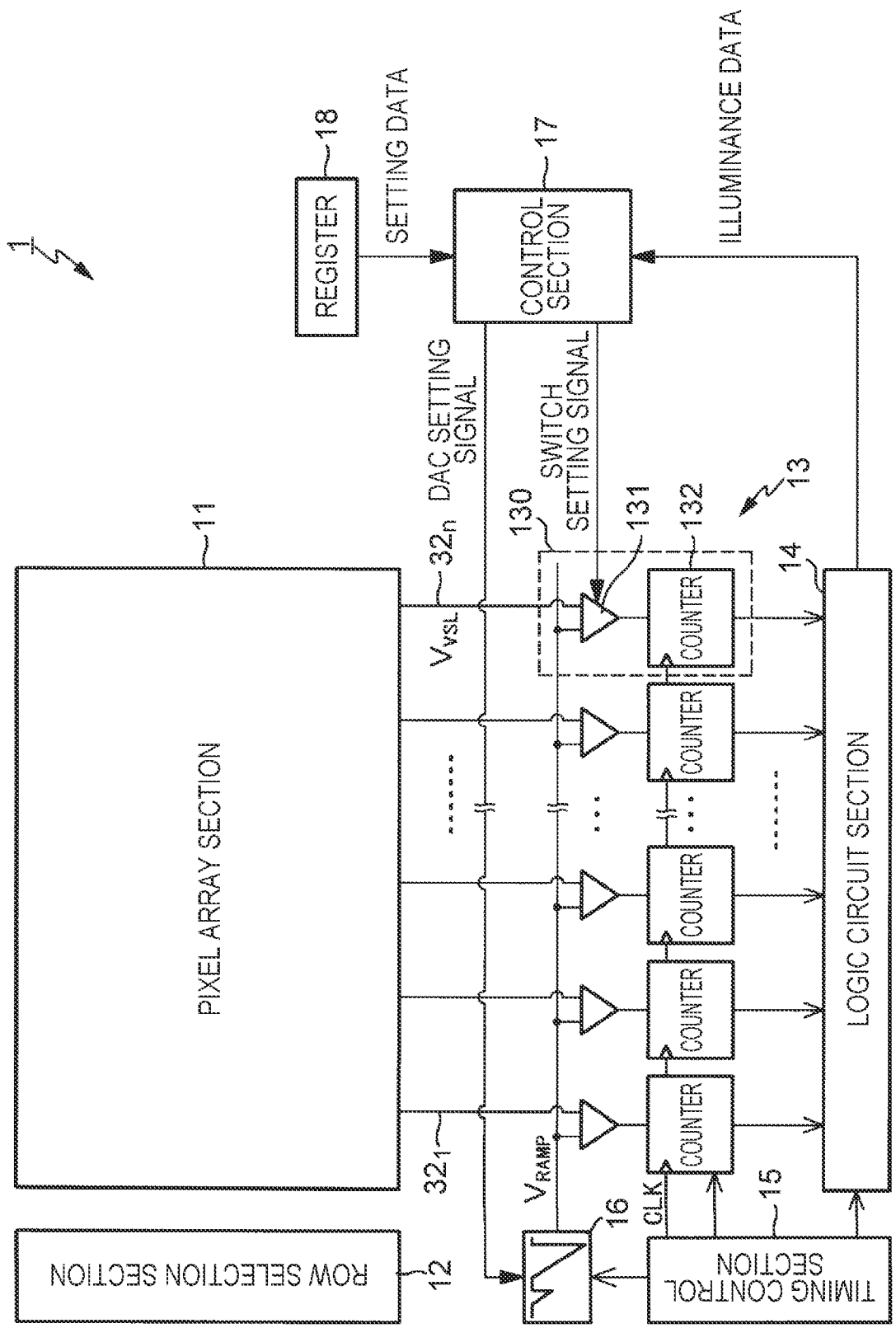
FIG. 35 is a block diagram schematically depicting an outline of a system configuration of a CMOS image sensor according to Example 11.

Example 11 is an example of setting a reference signal setting signal (hereinafter, described as a "DAC setting signal") and a switch setting signal when a slope of a ramp wave of the reference signal $V_{RAMP}$ and an input capacitance of the comparator 131 are switched in analog gain control of the analog-to-digital converter 130. FIG. 35 is a block diagram schematically depicting an outline of a system configuration of a CMOS image sensor according to Example 11 having a function of setting the DAC setting signal and the switch setting signal at the time of analog gain control.

In the CMOS image sensor 1 according to Example 11, the logic circuit section 14 acquires illuminance using all or some pixel signals of the pixel array section 11 and generates illuminance data. A calculation unit for the illuminance data generation may be configured to obtain a statistical value of a predetermined pixel signal, for example, an average value, a median value, and a mode value, or may be configured to perform an arbitrary linear/nonlinear calculation before and after obtaining the statistical value.

Note that, as variations of illuminance acquisition, a pixel dedicated to illuminance measurement may be provided, or a pixel configured to be switchable between use for imaging and use for illuminance measurement may be provided.

As depicted in FIG. 35, the CMOS image sensor 1 according to Example 11 includes the control section 17 that sets the DAC setting signal and the switch setting signal at the time of analog gain control. The logic circuit section 14 generates the illuminance data on the basis of data after analog-to-digital conversion by the analog-to-digital converter 130, and supplies the illuminance data to the control section 17.

The control section 17 outputs the switch setting signal to control on/off of a switch element for switching the input capacitance of the comparator 131 and the DAC setting signal to control the slope of the ramp wave of the reference signal $V_{RAMP}$ on the basis of at least one of setting data written in the register 18 or illuminance data input from the logic circuit section 14.

The switch element for switching the input capacitance corresponds to, for example, the switch elements $SW_1$ to $SW_4$ in FIG. 12. The illuminance data and the setting data can be associated with the switch setting signal by calculation hardware, calculation software, and a lookup table.

Note that the logic circuit section 14 and the control section 17 may be provided in the same pixel chip as the pixel array section 11, or a part of the logic circuit section 14 and the control section 17 may be provided outside the pixel chip.

Next, an example of a processing procedure of setting the DAC setting signal and the switch setting signal at the time of analog gain control in the CMOS image sensor 1 according to Example 11 will be described with reference to a flowchart of FIG. 36.

Figure 36:
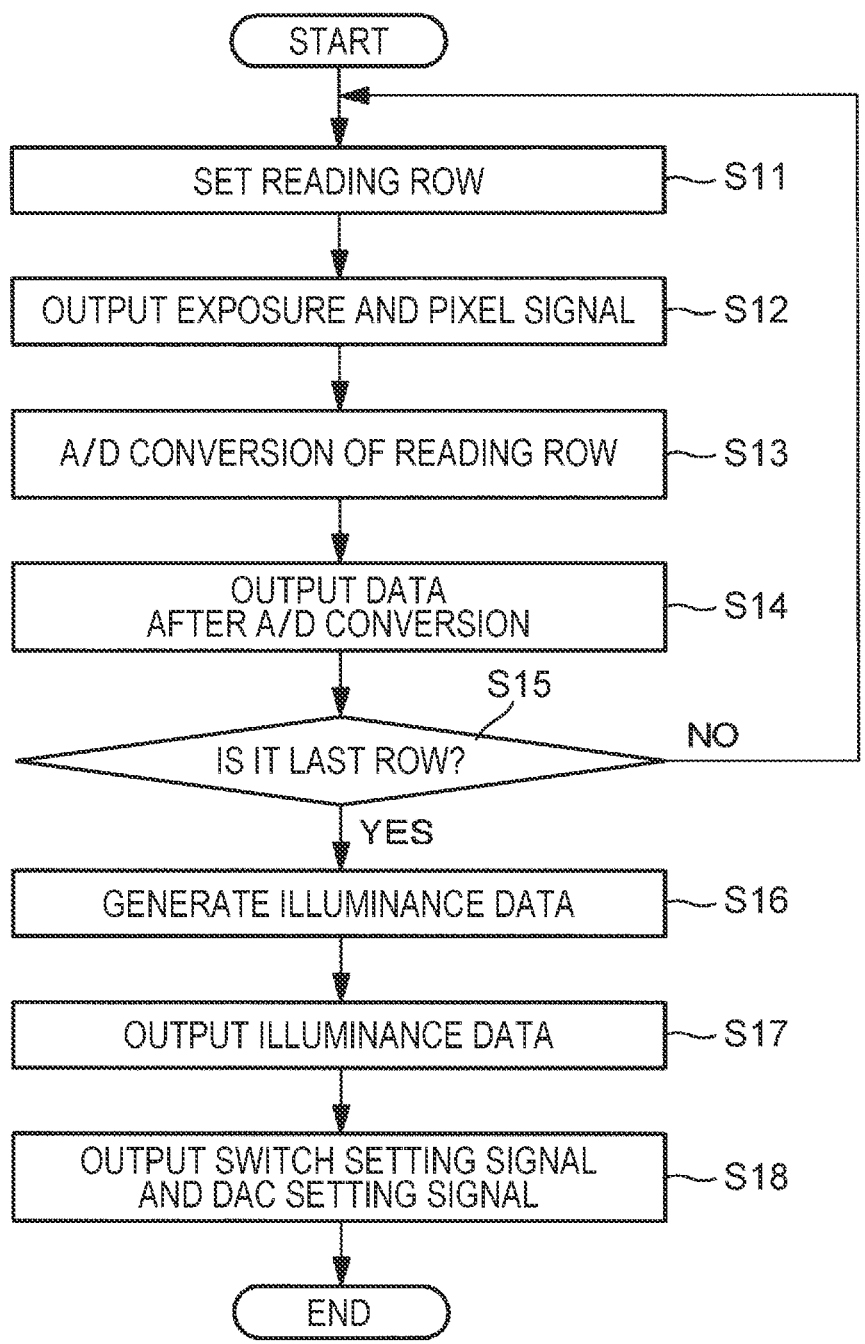
FIG. 36 is a flowchart depicting an example of a processing procedure of setting a DAC setting signal and a switch setting signal.

The flowchart of FIG. 36 illustrates a reading sequence of one imaging frame in the case of a rolling shutter.

First, a reading row is set under driving by the row selection section 12 (step S11), and then exposure and pixel signal output are performed for the set reading row (step S12). Next, the analog-to-digital conversion section 13 performs A/D conversion (analog-to-digital conversion) of the reading row (step S13), and then outputs data after the A/D conversion (step S14).

Next, if the reading row is not the last row (NO in step S15), the processing returns to step S11. If the reading row is the last row (YES in step S15), illuminance data is generated in the logic circuit section 14 (step S16), and then, the generated illuminance data is output to the control section 17 (step S17).

Next, the control section 17 outputs the switch setting signal to control on/off of a switch element for switching the input capacitance of the comparator 131 and the DAC setting signal to control the slope of the ramp wave of the reference signal $V_{RAMP}$ on the basis of the setting data written in the register 18 and the illuminance data input from the logic circuit section 14 (step S18).

The DAC setting signal and the switch setting signal at the time of analog gain control are set by the above-described one processing, and thereafter, a normal imaging operation is performed. As a result, imaging can be performed with an optimum analog gain for each imaging frame.

As a variation of illuminance data generation, exposure for imaging may also serve as exposure for illuminance acquisition such that illuminance data is generated in accordance with generation of image data. Furthermore, an exposure sequence for imaging and an exposure sequence for illuminance acquisition are not necessarily alternate. For example, the exposure sequence for illuminance acquisition may be performed once in several frames.

Modified Examples

Although the technology according to the present disclosure has been described above on the basis of the preferred embodiment, the technology according to the present disclosure is not limited to the embodiment. The configuration and structure of the imaging device described in the embodiment described above are exemplary and can be changed as appropriate.

For example, the circuit configuration of the comparator 131 in each of the above-described Examples is an example, and the present invention is not limited to these circuit configurations. Specifically, the comparator 131 according to Example 1, the comparator 131 according to Example 2, or the comparator 131 according to Example 7 may adopt a circuit configuration in which at least one of the capacitance element $C_{12}$, the input-side clamp transistor $PT_{13}$, the input-side clamp transistor $NT_{11}$, or the output-side clamp transistor $NT_{12}$ is omitted.

Figure 37:
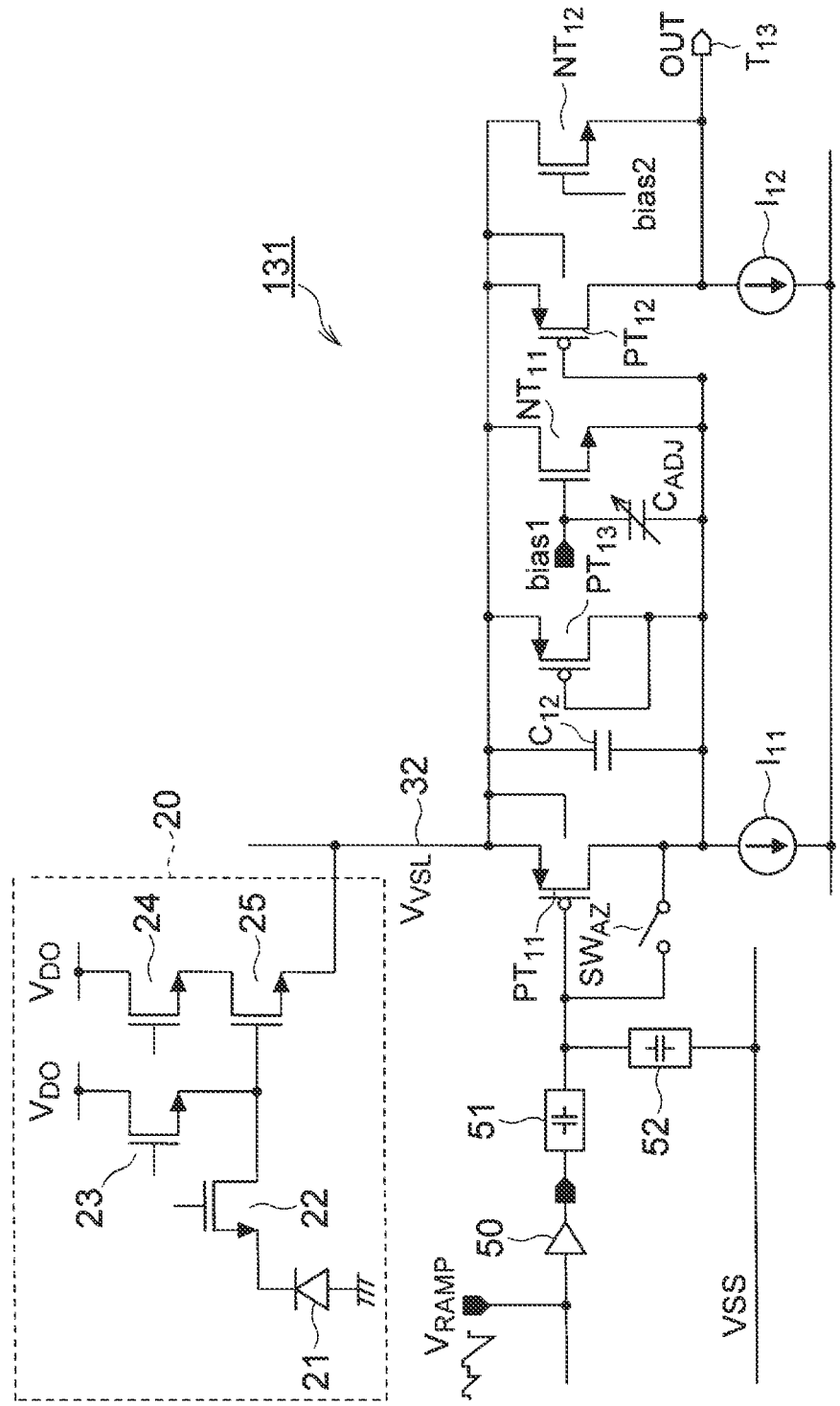
FIG. 37 is a circuit diagram depicting a first modified example of the comparator.

Furthermore, a new element may be added to the comparator 131 according to the accuracy required for a product. FIG. 37 is a circuit diagram depicting a first modified example of the comparator. The example of FIG. 37 illustrates an example in which a capacitance $C_{ADJ}$ is added to the comparator 131 according to the embodiment of the present disclosure depicted in FIG. 9. Note that internal configurations of the first capacitor 51 and the second capacitor 52 may be appropriately designed as described above, and may include the configuration examples depicted in FIGS. 10 to 34.

The capacitance $C_{ADJ}$ is connected between a gate electrode and a source electrode of the input-side clamp transistor $NT_{11}$. That is, a first end of the capacitance $C_{ADJ}$ is connected to the gate electrode of the input-side clamp transistor $NT_{11}$, and a second end of the capacitance $C_{ADJ}$ is connected to a drain electrode of an input transistor. A defect based on a voltage input to the gate electrode of the input-side clamp transistor $NT_{11}$, such as noise, may be suppressed by connecting the capacitance $C_{ADJ}$ as depicted in FIG. 37.

Furthermore, the capacitance Caps may be variable, and the voltage input to the gate electrode of the input-side clamp transistor $NT_{11}$ may be adjusted to more efficiently suppress the defect based on the voltage by adjusting the capacitance of the capacitance $C_{ADJ}$. Furthermore, the capacitance $C_{ADJ}$ may be adjusted according to an analog gain of the analog-to-digital converter 130 set on the basis of a control signal generated by the analog gain control section 53. Note that there is no problem even if the capacitance of the capacitance $C_{ADJ}$ is set to zero since the configuration is the same as that in the example of FIG. 9.

Furthermore, like the input-side load current source $I_{11}$ and the input-side load current source $I_{12}$ in FIG. 37, a signal line (VSS wiring) configured to connect a terminal of each element to the low-potential-side power supply may be shared among a plurality of elements. For example, the second capacitor 52 of each of the comparators 131 may be connected to the same VSS wiring.

Figure 38:
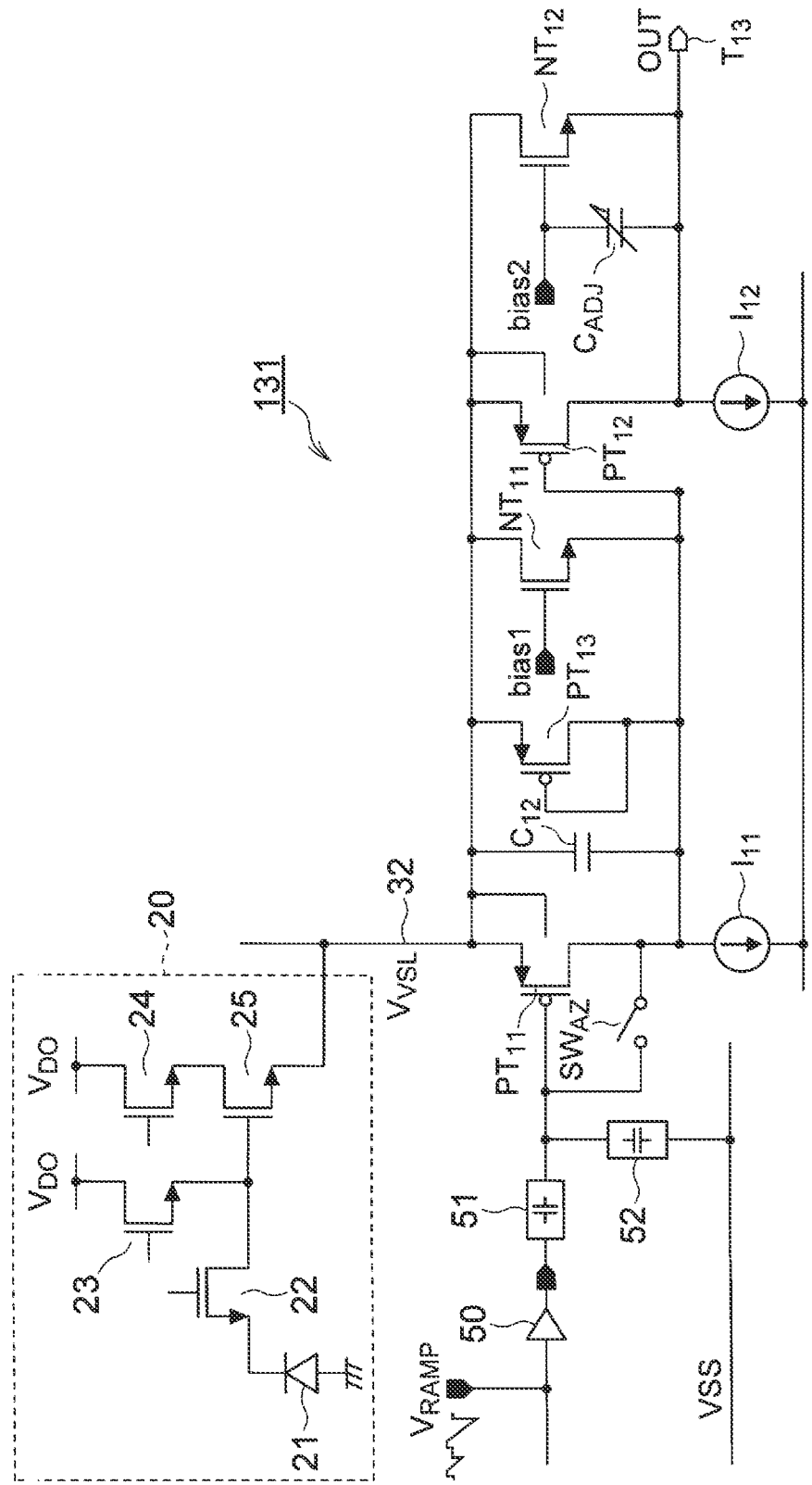
FIG. 38 is a circuit diagram depicting a second modified example of the comparator.

FIG. 38 is a circuit diagram depicting a second modified example of the comparator. The example of FIG. 38 is different from the example of FIG. 37 in terms of arrangement, and the capacitance $C_{ADJ}$ is connected between a gate electrode and a source electrode of the output-side clamp transistor $NT_{12}$. The rest is similar to the example of FIG. 37. Even in the example of FIG. 38, a voltage input to the gate electrode of the output-side clamp transistor $NT_{12}$ can be adjusted by adjusting a capacitance of the capacitance $C_{ADJ}$. Accordingly, the defect based on the voltage may be suppressed.

Furthermore, the comparator 131 may include not only both the input-side clamp transistor $NT_{11}$ and the output-side clamp transistor $NT_{12}$ but also three or more clamp transistors. In such a case, the capacitance $C_{ADJ}$ may be provided for one or more of the three or more clamp transistors.

Figure 39:
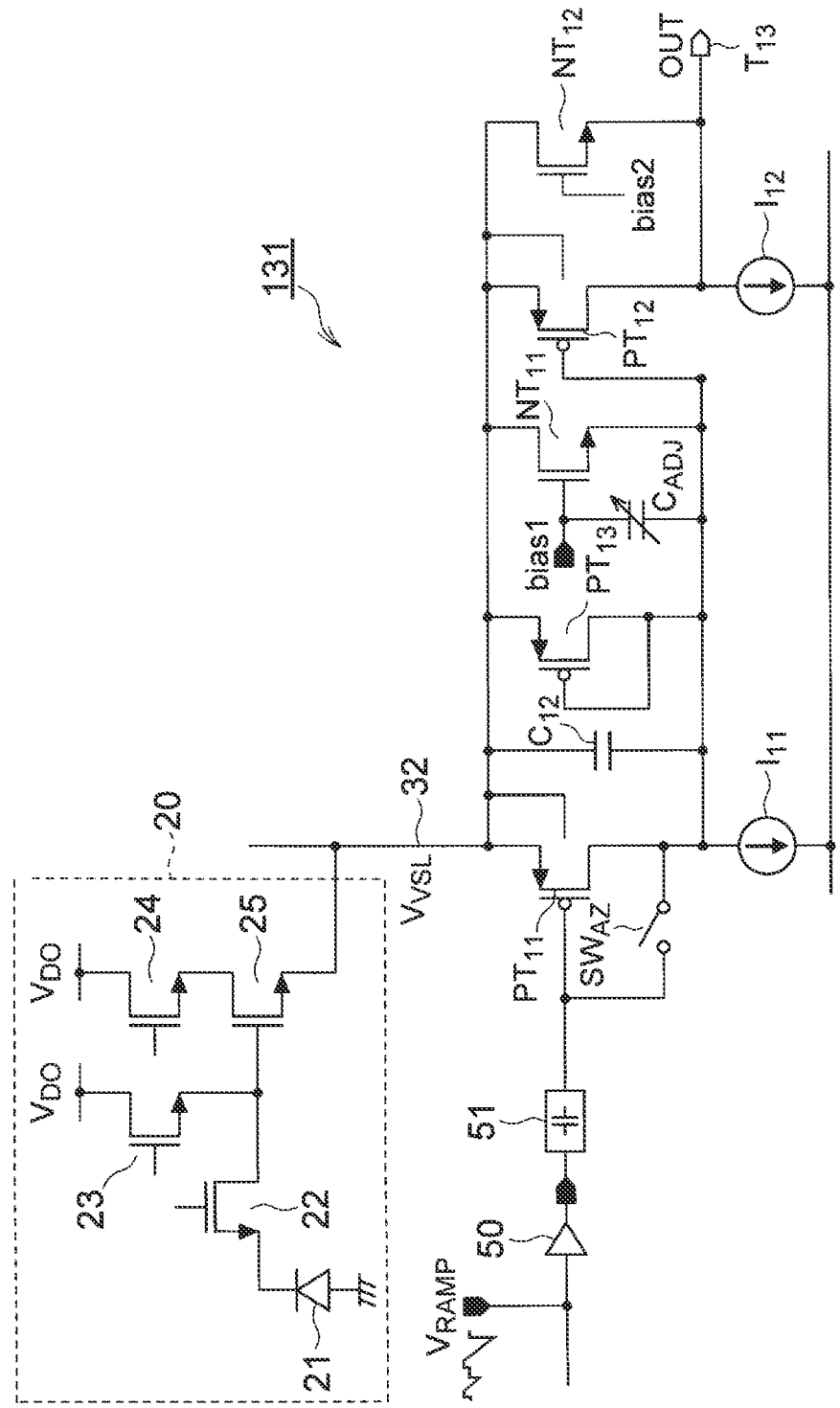
FIG. 39 is a circuit diagram depicting a configuration example in which a capacitance Cao is added to a conventional configuration example.

Note that the present embodiment reduces noise of the buffer 50 input to a gate electrode of the input transistor $PT_{11}$ by capacitance attenuation using capacitive voltage division between the first capacitor 51 and the second capacitor 52, but a configuration in which the capacitance $C_{ADJ}$ is added to the conventional configuration example as depicted in FIG. 5 or the like is also effective in terms of adjusting the voltage input to the gate electrode of the clamp transistor. FIG. 39 illustrates a configuration example in which the capacitance CADs is added to the conventional configuration example.

Examples of Application

Figure 40:
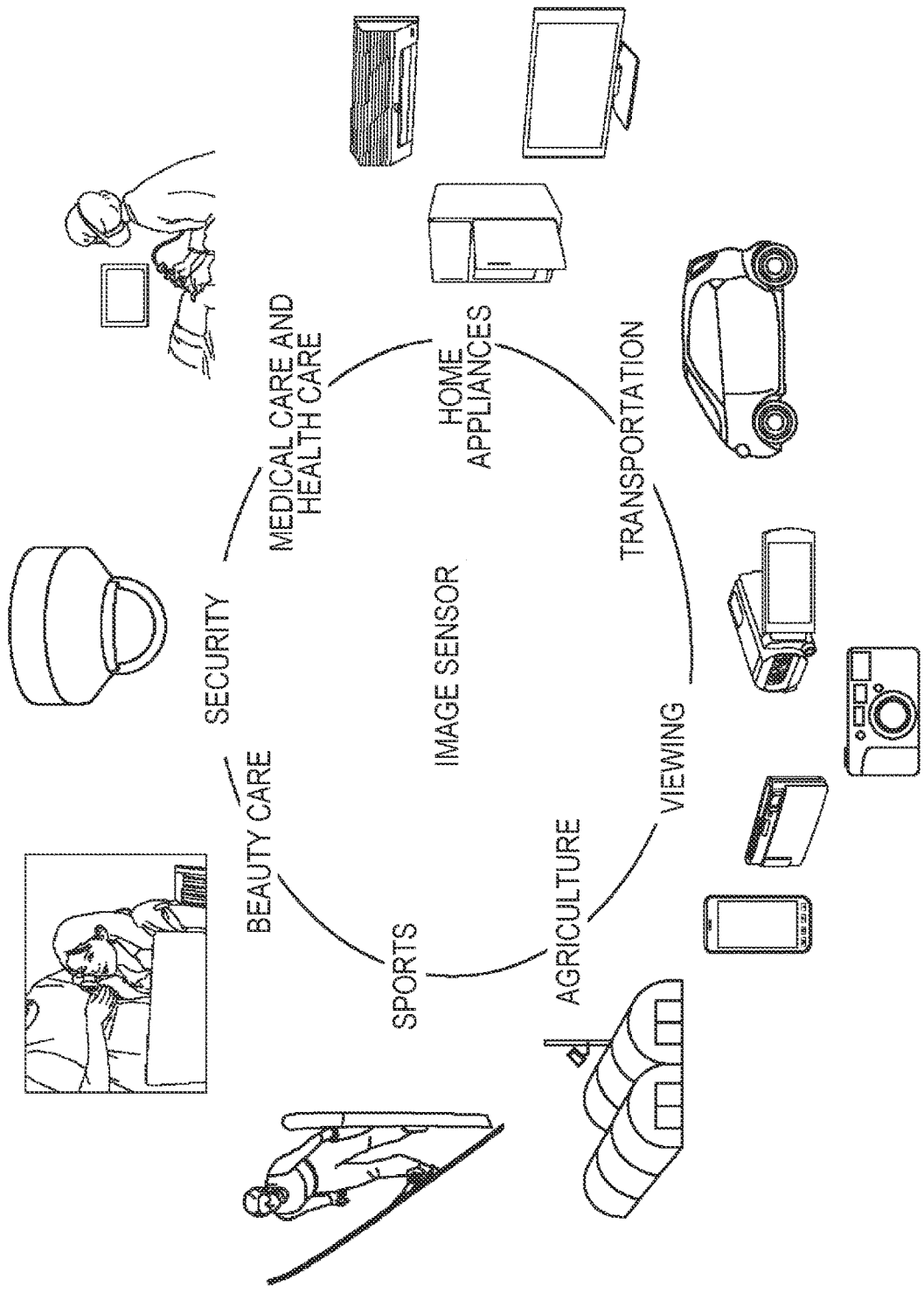
FIG. 40 is a diagram depicting an application example of the technology according to the present disclosure.

The imaging device according to the present embodiment described above can be used for various devices that sense light such as visible light, infrared light, ultraviolet light, and X-rays, for example, as depicted in FIG. 40. Specific examples of the various devices are listed hereinafter.

A device that captures an image for use in viewing, such as a digital camera or a portable device equipped with a camera function A device used in transportation, such as a vehicle-mounted sensor that captures images of a front, a rear, surroundings, an interior, and the like of a vehicle, a monitoring camera that monitors traveling vehicles and roads, or a range-finding sensor that measures a distance between vehicles and the like, for safety driving such as automatic stop, recognition of a state of a driver state, and the like A device used for home appliances such as a TV, a refrigerator, and an air conditioner, to capture an image of a gesture of a user and operate such an appliance in accordance with the gesture.

A device used for medical care and health care, such as an endoscope or a device that performs angiography by receiving infrared light A device used for security, such as a monitoring camera for a crime prevention application or a camera for a person authentication application A device used for beauty care, such as a skin measuring instrument that captures an image of a skin or a microscope that captures an image of a scalp A device used for sports, such as an action camera or a wearable camera for sports applications and the like A device used for agriculture, such as a camera for monitoring states of fields and crops Application Examples of Technology According to Present Disclosure The technology according to the present disclosure can be applied to various products. Hereinafter, more specific application examples will be described.

Electronic Apparatus of Present Disclosure

Here, cases where the present invention is applied to an imaging system such as a digital still camera or a video camera, a mobile terminal device having an imaging function such as a mobile phone, and an electronic apparatus such as a copier using an imaging device as an image reader will be described.

(Example of Imaging System)

Figure 41:
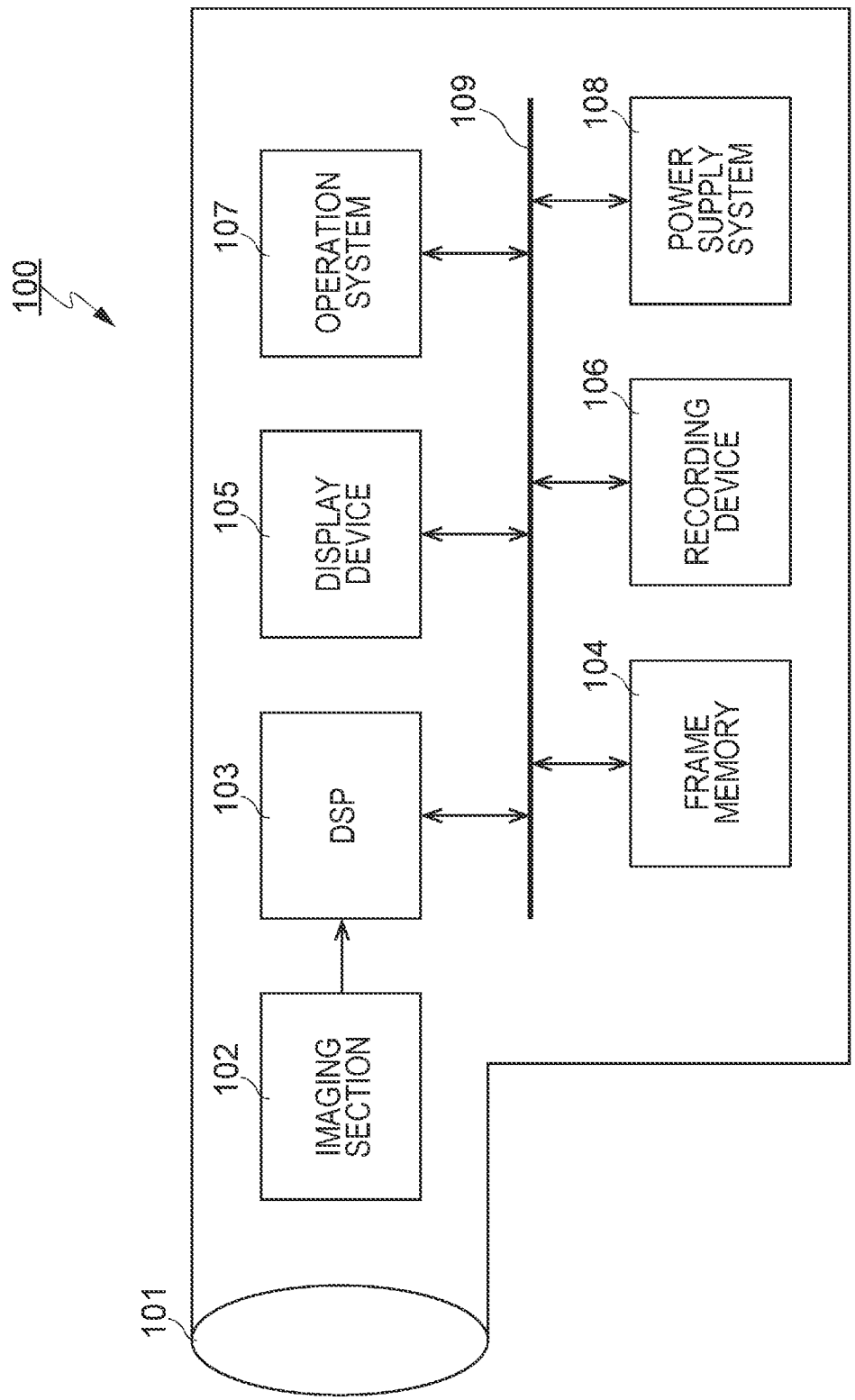
FIG. 41 is a block diagram schematically depicting a configuration example of an imaging system which is an example of an electronic apparatus of the present disclosure.

FIG. 41 is a block diagram depicting a configuration example of an imaging system which is an example of the electronic apparatus of the present disclosure.

As depicted in FIG. 41, an imaging system 100 according to the present example includes an imaging optical system 101 including a lens group and the like, an imaging section 102, a digital signal processor (DSP) circuit 103, a frame memory 104, a display device 105, a recording device 106, an operation system 107, a power supply system 108, and the like. Then, the DSP circuit 103, the frame memory 104, the display device 105, the recording device 106, the operation system 107, and the power supply system 108 are configured to be connected to one another via a bus line 109.

The imaging optical system 101 captures incident light (image light) from a subject and forms an image on an imaging surface of the imaging section 102. The imaging section 102 converts the amount of the incident light whose image has been formed on the imaging surface by the optical system 101 into an electric signal in units of pixels and outputs the electric signal as a pixel signal. The DSP circuit 103 performs general camera signal processing, for example, white balance processing, demosaic processing, gamma correction processing, and the like.

The frame memory 104 is appropriately used for storage of data in the process of the signal processing in the DSP circuit 103. The display device 105 includes a panel display device such as a liquid crystal display device or an organic electro luminescence (EL) display device, and displays a moving image or a still image imaged by the imaging section 102. The recording device 106 records the moving image or the still image imaged by the imaging section 102 on a recording medium such as a portable semiconductor memory, an optical disk, or a hard disk drive (HDD).

The operation system 107 issues operation commands for various functions of the imaging device 100 under operations of a user. The power supply system 108 appropriately supplies various power sources serving as operation power sources of the DSP circuit 103, the frame memory 104, the display device 105, the recording device 106, and the operation system 107 to these supply targets.

In the imaging system 100 having the above-described configuration, the imaging device according to the above-described embodiment can be used as the imaging section 102. According to the imaging device, power consumption of an analog-to-digital converter can be reduced, and thus, power consumption of the imaging device can be reduced. Moreover, even in a case where a buffer is provided in front of a capacitance element for absorbing an offset in order to increase a driving force of a reference signal of a ramp wave and reduce an output impedance in a single-slope analog-to-digital converter, noise of the buffer can be reduced without connecting an output end of the buffer between pixel columns, and thus, an imaged image with high image quality can be obtained.

[Example of Application to Mobile Body]

The technology according to the present disclosure (present technology) can be applied to various products. For example, the technology according to the present disclosure may be achieved as an imaging device mounted on any type of mobile body such as an automobile, an electric vehicle, a hybrid electric vehicle, a motorcycle, a bicycle, a personal mobility, an airplane, a drone, a ship, a robot, a construction machine, and an agricultural machine (tractor).

Figure 42:
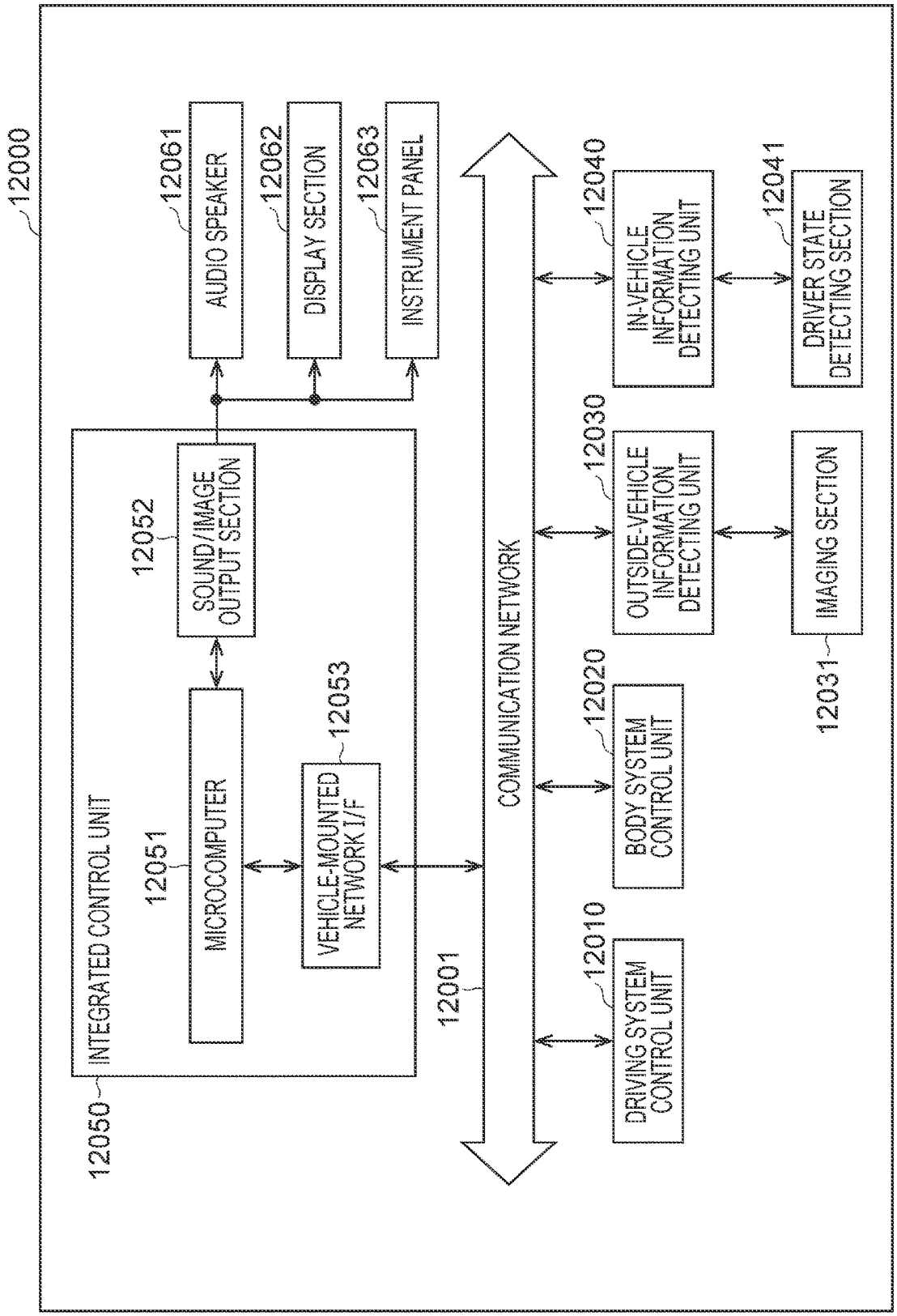
FIG. 42 is a block diagram depicting a schematic configuration example of a vehicle control system as an example of a mobile body control system to which the technology according to the present disclosure can be applied.

FIG. 42 is a block diagram depicting a schematic configuration example of a vehicle control system as an example of a mobile body control system to which the technology according to the present disclosure can be applied.

The vehicle control system 12000 includes a plurality of electronic control units connected to each other via a communication network 12001. In the example depicted in FIG. 42, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to the vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. Furthermore, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images an image of the driver, and the in-vehicle information detecting unit 12040 may calculate a degree of fatigue of the driver or a degree of concentration of the driver or may determine whether the driver is dozing on the basis of detection information input from the driver state detecting section 12041, The microcomputer 12051 can calculate a control target value for the driving force generating device, the steering mechanism, or the braking device on the basis of the information about the inside and outside of the vehicle which is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

Furthermore, the microcomputer 12051 can perform cooperative control intended for automated driving, which makes the vehicle to travel autonomously without depending on the operation of the driver, or the like, by controlling the driving force generating device, the steering mechanism, the braking device, or the like on the basis of the information about the surroundings of the vehicle obtained by the outside-vehicle information detecting unit 12030 or the in-vehicle information detecting unit 12040.

Furthermore, the microcomputer 12051 can output a control command to the body system control unit 12020 on the basis of the information regarding the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 42, an audio speaker 12061, a display section 12062, and an instrument panel 12063 are illustrated as the output device. The display section 12062 may, for example, include at least one of an on-board display or a head-up display.

Figure 43:
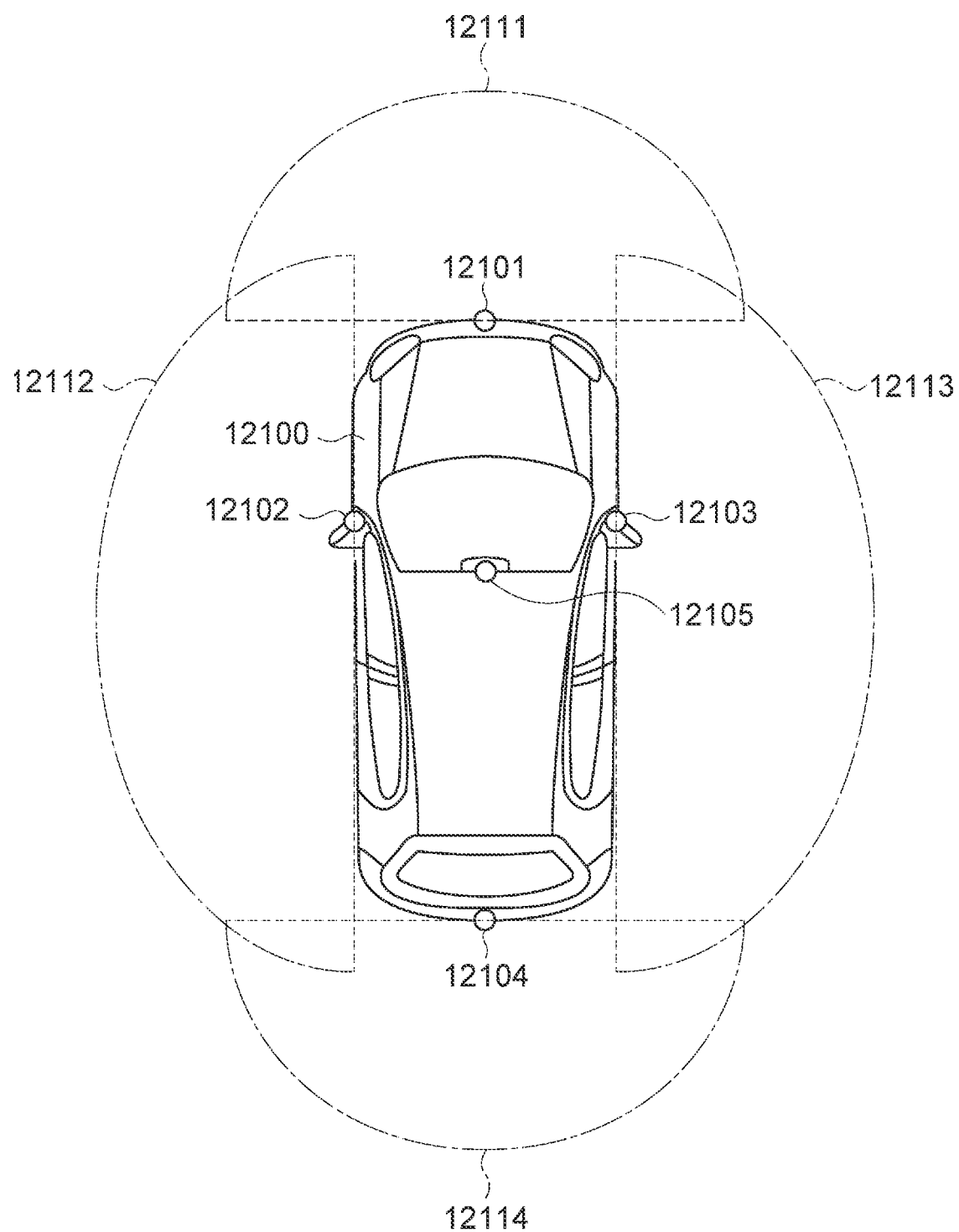
FIG. 43 is a diagram depicting an example of an installation position of an imaging section in the mobile body control system.

FIG. 43 is a diagram depicting an example of an installation position of the imaging section 12031.

In FIG. 43, a vehicle 12100 includes imaging sections 12101, 12102, 12103, 12104, and 12105 as the imaging sections 12031.

The imaging sections 12101, 12102, 12103, 12104, and 12105 are, for example, disposed at positions on a front nose, sideview mirrors, a rear bumper, and a back door of the vehicle 12100 and a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly images of the sides of the vehicle 12100. The imaging section 12104 provided to the rear bumper or the back door obtains mainly an image of the rear of the vehicle 12100. The image of the front acquired by the imaging sections 12101 and 12105 is mainly used to detect a preceding vehicle, a pedestrian, an obstacle, a traffic light, a traffic sign, a lane, and the like.

Note that FIG. 43 illustrates exemplary capturing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above can be obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Moreover, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. Furthermore, the sound/image output section 12052 may also control the display section 12062 so that an icon or the like representing the pedestrian is displayed at a desired position.

An example of the vehicle control system to which the technology according to the present disclosure can be applied has been described as above. The technology according to the present disclosure can be applied to, for example, the imaging section 12031 and the like among the above-described configurations. Then, it is possible to achieve low power consumption of an analog-to-digital converter, and eventually, low power consumption of the imaging device by applying the technology according to the present disclosure to the imaging section 12031 and the like, and thus, it is possible to contribute to low power consumption of the vehicle control system. Moreover, even in a case where a buffer is provided in front of a capacitance element for absorbing an offset in order to increase a driving force of a reference signal of a ramp wave and reduce an output impedance in a single-slope analog-to-digital converter, noise of the buffer can be reduced without connecting an output end of the buffer between pixel columns, and thus, an imaged image with high image quality can be obtained.

Configuration that Can Be Adopted by Present Disclosure

Note that the present technology can also have the following configurations.

<<A. Imaging Device>>

[A-01] An imaging device including:
a load current source;
a comparator including an input transistor connected between a signal line that transmits a signal read from a pixel and the load current source;
a first capacitor that inputs a predetermined reference signal to a gate electrode of the input transistor; and
a second capacitor connected between the gate electrode of the input transistor and a reference potential node.

[A-02] The imaging device according to [A-01] described above, in which
the first capacitor and the second capacitor attenuate the predetermined reference signal input to the gate electrode of the input transistor by capacitive voltage division.

[A-03] The imaging device according to [A-02] described above, in which
each of the first capacitor and the second capacitor includes a variable capacitance element having a variable capacitance value.

[A-04] The imaging device according to [A-03] described above, in which
the capacitance value of each of the first capacitor and the second capacitor is variable depending on an analog gain of an analog-to-digital converter including the comparator.

[A-05] The imaging device according to [A-02] described above, in which
the first capacitor and the second capacitor include a plurality of capacitance elements each having a first end connected to the gate electrode of the input transistor and a plurality of switch elements each of which is connected between second ends of the plurality of capacitance elements.

[A-06] The imaging device according to [A-05] described above, in which
the switch element is also provided between a reference potential node and the second end of the capacitance element on the reference potential node side among the plurality of capacitance elements.

[A-07] The imaging device according to any one of [A-01] to [A-06] described above, in which
the predetermined reference signal is a voltage of a sloped waveform that linearly changes with a predetermined slope.

[A-08] The imaging device according to [A-07] described above, in which
the comparator compares a voltage of the signal line with the voltage of the sloped waveform.

[A-09] The imaging device according to [A-08] described above, in which
an amplitude of the voltage of the sloped waveform is attenuated by capacitive voltage division using the first capacitor and the second capacitor.

[A-10] The imaging device according to [A-09] described above, further including
a reference signal generating section that generates the voltage of the sloped waveform, in which
the reference signal generating section sets the amplitude of the voltage of the sloped waveform to be large in advance such that an amplitude after being attenuated by the capacitive voltage division becomes a desired amplitude.

[A-11] The imaging device according to any one of [A-07] to [A-10] described above, further including
an analog gain control section that controls an analog gain of an analog-to-digital converter by adjusting an amplitude of the voltage of the sloped waveform.

[A-12] The imaging device according to [A-11] described above, in which
the analog gain control section controls the amplitude of the voltage of the sloped waveform and the capacitance values of the first capacitor and the second capacitor.

[A-13] The imaging device according to any one of [A-01] to [A-12] described above, in which
the load current source includes an input-side load current source and an output-side load current source,
the input transistor is connected between the signal line and the input-side load current source, and
the comparator includes an output transistor that is connected between the signal line and the output-side load current source and uses an output of the input transistor as a gate input.

[A-14] The imaging device according to [A-13] described above, in which
the comparator includes: an input-side cascode connection transistor connected between the input transistor and the input-side load current source; and an output-side cascode connection transistor connected between the output transistor and the output-side load current source.

[A-15] The imaging device according to any one of [A-01] to [A-14] described above, further including
a noise correction circuit that superimposes a correction voltage corresponding to noise of a pixel power supply on a reference signal generated by a reference signal generating section, in which
the noise correction circuit switches a gain for generating the correction voltage according to switching of the capacitance value of each of the first capacitor and the second capacitor.

[A-16] The imaging device according to [A-15] described above, in which
the noise correction circuit superimposes a noise correction voltage riding on a reference voltage used in the pixel on the reference signal generated by the reference signal generating section.

[A-17] The imaging device according to any one of [A-04] to [A-16] described above, further including
a control section that sets a reference signal setting signal for generating the reference signal by the reference signal generating section and a switch setting signal for switching of the plurality of switch elements when the analog gain of the analog-to-digital converter is controlled.

[A-18] The imaging device according to [A-17] described above, further including a logic circuit section that generates illuminance data on the basis of data after analog-to-digital conversion by the analog-to-digital converter.

[A-19] The imaging device according to [A-18] described above, in which
the control section sets the reference signal setting signal and the switch setting signal on the basis of the illuminance data generated by the logic circuit section.

[A-20] The imaging device according to any one of [A-01] to [A-19] described above, in which
the comparison section further includes:
an output transistor having a source electrode connected to a source electrode of the input transistor and a gate electrode connected to a drain electrode of the input transistor;
a clamp transistor having a drain electrode connected to the source electrode of the input transistor and a source electrode connected to the drain electrode of the input transistor; and
a third capacitor having a first end connected to a gate electrode of the clamp transistor and a second end connected to the drain electrode of the input transistor.

[A-21] The imaging device according to any one of [A-01] to [A-20] described above, in which
the comparison section further includes:
an output transistor having a source electrode connected to a source electrode of the input transistor and a gate electrode connected to a drain electrode of the input transistor;
a clamp transistor having a drain electrode connected to the source electrode of the input transistor and a source electrode connected to the drain electrode of the output transistor; and
a third capacitor having a first end connected to a gate electrode of the clamp transistor and a second end connected to the drain electrode of the output transistor.

[A-22] The imaging device according to [A-20] or [A-21] described above, in which
a capacitance value of the third capacitor varies depending on an analog gain of an analog-to-digital converter including the comparator.

<<B. Electronic Apparatus>>

[B-01] An electronic apparatus including an imaging device that includes:
a load current source;
a comparator including an input transistor connected between a signal line that transmits a signal read from a pixel and the load current source;
a first capacitor that inputs a predetermined reference signal to a gate electrode of the input transistor; and
a second capacitor connected between the gate electrode of the input transistor and a reference potential node.

[B-02] The electronic apparatus according to [B-01], in which
the first capacitor and the second capacitor attenuate the predetermined reference signal input to the gate electrode of the input transistor by capacitive voltage division.

[B-03] The electronic apparatus according to [B-02] described above, in which
each of the first capacitor and the second capacitor includes a variable capacitance element having a variable capacitance value.

[B-04] The electronic apparatus according to [B-03] described above, in which
the capacitance value of each of the first capacitor and the second capacitor is variable depending on an analog gain of an analog-to-digital converter including the comparator.

[B-05] The electronic apparatus according to [B-02] described above, in which
the first capacitor and the second capacitor include a plurality of capacitance elements each having a first end connected to the gate electrode of the input transistor and a plurality of switch elements each of which is connected between second ends of the plurality of capacitance elements.

[B-06] The electronic apparatus according to [B-05] described above, in which
the switch element is also provided between a reference potential node and the second end of the capacitance element on the reference potential node side among the plurality of capacitance elements.

[B-07] The electronic apparatus according to any one of [B-01] to [B-06] described above, in which
the predetermined reference signal is a voltage of a sloped waveform that linearly changes with a predetermined slope.

[B-08] The electronic apparatus according to [B-07] described above, in which
the comparator compares a voltage of the signal line with the voltage of the sloped waveform.

[B-09] The electronic apparatus according to [B-08] described above, in which
an amplitude of the voltage of the sloped waveform is attenuated by capacitive voltage division using the first capacitor and the second capacitor.

[B-10] The electronic apparatus according to [B-09] described above, further including
a reference signal generating section that generates the voltage of the sloped waveform, in which
the reference signal generating section sets the amplitude of the voltage of the sloped waveform to be large in advance such that an amplitude after being attenuated by the capacitive voltage division becomes a desired amplitude.

[B-11] The electronic apparatus according to any one of [B-07] to [B-10] described above, further including
an analog gain control section that controls an analog gain of an analog-to-digital converter by adjusting an amplitude of the voltage of the sloped waveform.

[B-12] The electronic apparatus according to [B-11] described above, in which
the analog gain control section controls the amplitude of the voltage of the sloped waveform and the capacitance values of the first capacitor and the second capacitor.

[B-13] The electronic apparatus according to any one of [B-01] to [B-12] described above, in which
the load current source includes an input-side load current source and an output-side load current source,
the input transistor is connected between the signal line and the input-side load current source, and
the comparator includes an output transistor that is connected between the signal line and the output-side load current source and uses an output of the input transistor as a gate input.

[B-14] The electronic apparatus according to [B-13] described above, in which
the comparator includes: an input-side cascode connection transistor connected between the input transistor and the input-side load current source; and an output-side cascode connection transistor connected between the output transistor and the output-side load current source.

[B-15] The electronic apparatus according to any one of [B-01] to [B-14] described above, further including
a noise correction circuit that superimposes a correction voltage corresponding to noise of a pixel power supply on a reference signal generated by a reference signal generating section, in which
the noise correction circuit switches a gain for generating the correction voltage according to switching of the capacitance value of each of the first capacitor and the second capacitor.

[B-16] The electronic apparatus according to [B-15] described above, in which
the noise correction circuit superimposes a noise correction voltage riding on a reference voltage used in the pixel on the reference signal generated by the reference signal generating section.

[B-17] The electronic apparatus according to any one of [B-04] to [B-16] described above, further including
a control section that sets a reference signal setting signal for generating a reference signal by a reference signal generating section and a switch setting signal for switching of a plurality of switch elements when the analog gain of the analog-to-digital converter is controlled.

[B-18] The electronic apparatus according to [B-17] described above, further including
a logic circuit section that generates illuminance data on the basis of data after analog-to-digital conversion by the analog-to-digital converter.

[B-19] The electronic apparatus according to [B-18] described above, in which
the control section sets the reference signal setting signal and the switch setting signal on the basis of the illuminance data generated by the logic circuit section.

[B-20] The imaging device according to any one of [B-01] to [B-19] described above, in which
the comparison section further includes:
an output transistor having a source electrode connected to a source electrode of the input transistor and a gate electrode connected to a drain electrode of the input transistor;
a clamp transistor having a drain electrode connected to the source electrode of the input transistor and a source electrode connected to the drain electrode of the input transistor; and
a third capacitor having a first end connected to a gate electrode of the clamp transistor and a second end connected to the drain electrode of the input transistor.

[B-21] The imaging device according to any one of [B-01] to [B-20] described above, in which
the comparison section further includes:
an output transistor having a source electrode connected to a source electrode of the input transistor and a gate electrode connected to a drain electrode of the input transistor;
a clamp transistor having a drain electrode connected to the source electrode of the input transistor and a source electrode connected to the drain electrode of the output transistor; and
a third capacitor having a first end connected to a gate electrode of the clamp transistor and a second end connected to the drain electrode of the output transistor.

[B-22] The imaging device according to [B-20] or [B-21] described above, in which
a capacitance value of the third capacitor varies depending on an analog gain of an analog-to-digital converter including the comparator.

REFERENCE SIGNS LIST

1 CMOS image sensor
11 Pixel array section
12 Row selection section
13 Analog-to-digital conversion section
14 Logic circuit section (signal processing section)
15 Timing control section
16 Reference signal generating section
20 Pixel
21 Photodiode
22 Transfer transistor
23 Reset transistor
24 Amplification transistor
25 Selection transistor
31 ($31_1$ to $31_m$) Pixel control line
32 ($32_1$ to $32_n$) Signal line
50 Buffer
51 First capacitor
52 Second capacitor
53 Analog gain control section
60 Power supply noise correction circuit
70 Additional gain switching circuit
130 Analog-to-digital converter
131 Comparator
132 Counter
$C_{11}$, $C_{12}$, $C_{13}$, $C_{ADJ}$ Capacitance element
$I_{11}$ Input-side load current source
$I_{12}$ Output-side load current source
$PT_{11}$ Input transistor
$PT_{12}$ Output transistor
Vss Low potential

The invention claimed is:
1. An imaging device comprising:
a load current source;
a comparator including an input transistor connected between a signal line that transmits a signal read from a pixel and the load current source;
a first capacitor that inputs a predetermined reference signal to a gate electrode of the input transistor; and
a second capacitor connected between the gate electrode of the input transistor and a reference potential node.
2. The imaging device according to claim 1, wherein
the first capacitor and the second capacitor attenuate the predetermined reference signal input to the gate electrode of the input transistor by capacitive voltage division.
3. The imaging device according to claim 2, wherein
each of the first capacitor and the second capacitor includes a variable capacitance element having a variable capacitance value.
4. The imaging device according to claim 3, wherein
the capacitance value of each of the first capacitor and the second capacitor is variable depending on an analog gain of an analog-to-digital converter including the comparator.
5. The imaging device according to claim 2, wherein
the first capacitor and the second capacitor include a plurality of capacitance elements each having a first end connected to the gate electrode of the input tran- sistor and a plurality of switch elements each of which is connected between second ends of the plurality of capacitance elements.

6. The imaging device according to claim 5, wherein the switch element is also provided between a reference potential node and the second end of the capacitance element on a side of the reference potential node among the plurality of capacitance elements.

7. The imaging device according to claim 1, wherein the predetermined reference signal is a voltage of a sloped waveform that linearly changes with a predetermined slope.

8. The imaging device according to claim 7, wherein the comparator compares a voltage of the signal line with the voltage of the sloped waveform.

9. The imaging device according to claim 8, wherein an amplitude of the voltage of the sloped waveform is attenuated by capacitive voltage division using the first capacitor and the second capacitor.

10. The imaging device according to claim 9, further comprising
a reference signal generating section that generates the voltage of the sloped waveform, wherein
the reference signal generating section sets the amplitude of the voltage of the sloped waveform to be large in advance such that an amplitude after being attenuated by the capacitive voltage division becomes a desired amplitude.

11. The imaging device according to claim 7, further comprising
an analog gain control section that controls an analog gain of an analog-to-digital converter by adjusting an amplitude of the voltage of the sloped waveform.

12. The imaging device according to claim 11, wherein the analog gain control section controls the amplitude of the voltage of the sloped waveform and the capacitance values of the first capacitor and the second capacitor.

13. The imaging device according to claim 1, wherein the load current source includes an input-side load current source and an output-side load current source,
the input transistor is connected between the signal line and the input-side load current source, and
the comparator includes an output transistor that is connected between the signal line and the output-side load current source and uses an output of the input transistor as a gate input.

14. The imaging device according to claim 13, wherein the comparator includes: an input-side cascode connection transistor connected between the input transistor and the input-side load current source; and an output-side cascode connection transistor connected between the output transistor and the output-side load current source.

15. The imaging device according to claim 1, wherein the comparison section further includes:
an output transistor having a source electrode connected to a source electrode of the input transistor and a gate electrode connected to a drain electrode of the input transistor;
a clamp transistor having a drain electrode connected to the source electrode of the input transistor and a source electrode connected to the drain electrode of the input transistor; and a third capacitor having a first end connected to a gate electrode of the clamp transistor and a second end connected to the drain electrode of the input transistor.

16. The imaging device according to claim 1, wherein the comparison section further includes:
an output transistor having a source electrode connected to a source electrode of the input transistor and a gate electrode connected to a drain electrode of the input transistor;
a clamp transistor having a drain electrode connected to the source electrode of the input transistor and a source electrode connected to the drain electrode of the output transistor; and
a third capacitor having a first end connected to a gate electrode of the clamp transistor and a second end connected to the drain electrode of the output transistor.

17. The imaging device according to claim 15, wherein a capacitance value of the third capacitor varies depending on an analog gain of an analog-to-digital converter including the comparator.

18. The imaging device according to claim 1, further comprising
a noise correction circuit that superimposes a correction voltage corresponding to noise of a pixel power supply on a reference signal generated by a reference signal generating section, wherein
the noise correction circuit switches a gain for generating the correction voltage according to switching of the capacitance value of each of the first capacitor and the second capacitor.

19. The imaging device according to claim 18, wherein the noise correction circuit superimposes a noise correction voltage riding on a reference voltage used in the pixel on the reference signal generated by the reference signal generating section.

20. The imaging device according to claim 4, further comprising
a control section that sets a reference signal setting signal for generating a reference signal by a reference signal generating section and a switch setting signal for switching of a plurality of switch elements when the analog gain of the analog-to-digital converter is controlled.

21. The imaging device according to claim 20, further comprising
a logic circuit section that generates illuminance data on a basis of data after analog-to-digital conversion by the analog-to-digital converter.

22. The imaging device according to claim 21, wherein the control section sets the reference signal setting signal and the switch setting signal on a basis of the illuminance data generated by the logic circuit section.

23. An electronic apparatus comprising an imaging device that includes:
a load current source;
a comparator including an input transistor connected between a signal line that transmits a signal read from a pixel and the load current source;
a first capacitor that inputs a predetermined reference signal to a gate electrode of the input transistor; and
a second capacitor connected between the gate electrode of the input transistor and a reference potential node.

* * * * *